(12) United States Patent
Koch et al.

(10) Patent No.: US 11,398,614 B2
(45) Date of Patent: Jul. 26, 2022

(54) ACTIVE MATRIX ENHANCED ORGANIC LIGHT EMITTING DIODE DISPLAYS FOR LARGE SCREEN GRAPHIC DISPLAY APPLICATION

(71) Applicant: RED BANK TECHNOLOGIES LLC, Red Bank, NJ (US)

(72) Inventors: Gene C. Koch, Toms River, NJ (US); John N. Magno, St. James, NY (US)

(73) Assignee: Red Bank Technologies LLC, Red Bank, NJ (US)

( * ) Notice: Subject to any disclaimer, the term of this patent is extended or adjusted under 35 U.S.C. 154(b) by 0 days.

(21) Appl. No.: 15/740,466

(22) PCT Filed: Jun. 28, 2016

(86) PCT No.: PCT/US2016/039802
§ 371 (c)(1),
(2) Date: Dec. 28, 2017

(87) PCT Pub. No.: WO2017/004031
PCT Pub. Date: Jan. 5, 2017

(65) Prior Publication Data
US 2018/0190929 A1    Jul. 5, 2018

Related U.S. Application Data

(60) Provisional application No. 62/187,415, filed on Jul. 1, 2015.

(51) Int. Cl.
*H01L 51/50*    (2006.01)
*H01L 51/52*    (2006.01)
*H01L 27/32*    (2006.01)

(52) U.S. Cl.
CPC ........ *H01L 51/5064* (2013.01); *H01L 27/322* (2013.01); *H01L 27/3206* (2013.01);
(Continued)

(58) Field of Classification Search
CPC ........... H01L 51/50–56; H01L 27/3209; H01L 27/3206; H01L 27/322; H01L 27/3213; H01L 27/3244
(Continued)

(56) References Cited

U.S. PATENT DOCUMENTS 10,680,185 B2 * 6/2020 Magno ............... H01L 51/0076
2001/0004188 A1   6/2001 Jacobsen et al.
(Continued)

OTHER PUBLICATIONS

Preliminary Search Report as relates to corresponding international application No. PCT/US16/39802 dated Jan. 2, 2018.

*Primary Examiner* — Thao X Le
*Assistant Examiner* — Gardner W. S. Swan
(74) *Attorney, Agent, or Firm* — Reed Smith LLP

(57) ABSTRACT

An active matrix light emitting display comprising an anode layer comprising a plurality of individual selectively energizable anodes, a cathode layer comprising a plurality of individual selectively energizable cathodes, an emitter layer for emitting light when energized disposed between the anode layer and the cathode layer, and a photoluminescent layer comprising a plurality of various color photoluminescent pixels, wherein a selected anode and a selected cathode are energizable to photoexcite a selected color pixel. A light emitting device comprising, a light emitting photonic crystal having organic electroluminescent emitter material disposed within the photonic crystal, and a photoluminescent material disposed upon a surface of the light emitting photonic crystal, such that light emitted by the light emitting photonic crystal causes photoexcitation within the photoluminescent material.

17 Claims, 23 Drawing Sheets

(52) U.S. Cl.
CPC ...... *H01L 27/3209* (2013.01); *H01L 27/3244* (2013.01); *H01L 51/5072* (2013.01); *H01L 51/5092* (2013.01); *H01L 51/5206* (2013.01); *H01L 51/5221* (2013.01); *H01L 51/5265* (2013.01); *H01L 2251/558* (2013.01)

(58) Field of Classification Search
USPC .......................................................... 257/40
See application file for complete search history.

(56) References Cited

U.S. PATENT DOCUMENTS

| | | |
|---|---|---|
| 2003/0214691 A1 | 11/2003 | Magno et al. |
| 2004/0206965 A1* | 10/2004 | Evans .................... H01S 5/187 257/85 |
| 2005/0225233 A1* | 10/2005 | Boroson .............. H01L 27/322 313/504 |
| 2007/0159086 A1 | 7/2007 | Yu et al. |
| 2014/0077688 A1 | 3/2014 | Weaver et al. |
| 2015/0008419 A1* | 1/2015 | Li ....................... H01L 51/5016 257/40 |
| 2015/0280170 A1* | 10/2015 | Harikrishna Mohan .................... H01L 27/3258 257/40 |
| 2018/0164502 A1* | 6/2018 | Qin ..................... G02B 6/1225 |

\* cited by examiner

ACTIVE MATRIX ENHANCED ORGANIC LIGHT EMITTING DIODE DISPLAYS FOR LARGE SCREEN GRAPHIC DISPLAY APPLICATION

CROSS REFERENCE TO RELATED APPLICATION

This application is a 371 National Stage of International Application No. PCT/US2016/39802, filed Jun. 28, 2016, the entire contents of which are incorporated herein by reference, which claims the benefit under 35 U.S.C. § 119(e) of the earlier filing date of U.S. Provisional Patent Application No. 62/187,415 filed on Jul. 1, 2015, the disclosure of which is incorporated by reference.

BACKGROUND

This application discloses an invention which is related, generally and in various embodiments, to an improved organic light emitting diode ("OLED") based display based on enhanced light emitting devices.

In U.S. Pat. No. 7,335,921 (the '921 patent) filed on May 8, 2003 and US Patent Application Publication No. 20040069995 (the '995 publication) also filed on May 8, 2003 light emitting diode devices (LEDs) and particularly organic light emitting diode devices (OLEDs) are described in which one or more feedback structures are integrated with the light emitting diode structures so as to provide enhanced levels of light emission and energy efficiency through the phenomenon of stimulated emission. OLEDs which include such feedback structures are referred to as feedback enhanced organic light emitting diodes (FE-OLEDs). Generally speaking, a feedback structure refers to any structure that serves to feed light emitted from the emitter layer of an OLED back into the emitter layer thereby stimulating further emission. Feedback structures are disclosed in detail in the '995 publication, which is incorporated here by reference in its entirety. Also, the '921 patent is incorporated here by reference in its entirety. One drawback of the FE-OLEDs described in the '921 patent and the '995 publication is the cost of their production.

OLED technology has found extensive application in smaller graphic displays such as those for cell phones and electronic tablets. However, adoption of the technology for large displays such as those for televisions has been slower and more limited. A significant reason for this has been that low manufacturing yields result when the technology is scaled up to large size displays.

Two technical approaches have dominated in the development of OLED manufacturing, vacuum deposition of small molecule OLED materials and solvent casting of OLED materials. In both cases the patterning of the organic materials used to make the light emissive structures in large displays has proved to be a nearly insurmountable problem. In the case of the small molecule vacuum deposited materials, the fragility of the deposited material layers has made traditional photolithographic patterning of device structures impossible up to this time. As a result, the materials are patterned by passing the vapor stream emanating from a vacuum evaporation source through a shadow mask consisting of patterned orifices in a thin metal sheet. The material vapor condenses on the device substrate in the pattern of the orifices in the shadow mask thereby producing the desired device structures. As the size of the display to be produced increases the shadow mask must also increase in size. Since the metal sheet from which the shadow mask is produced must be very thin, slumping of the mask becomes a problem when the lateral dimensions of the area to be patterned exceed a certain size (generally under 8" diagonal). When the masks slump they contact the surface of the substrate upon which the evaporated material is to be deposited. This destroys the patterned structures.

The approach used to circumvent the mask slumping problem is to use a small shadow mask that is translated across the face of the device substrate with a material deposition made in each location. This process, however, presents real problems with registration of the repeated depositions, deposition uniformity, and with production of particulates of deposited material flaking off the mask surface. Further compounding the problems is the issue that for a color graphic display red, green and blue emitter materials and charge transporting materials for each color must be sequentially deposited. The result is that while televisions using conventional RGB (red, green, and blue) OLED displays have been produced and sold commercially, the low production yields have resulted in such high sales prices that the product introductions were not successful.

As mentioned above, the second approach to producing OLEDs, that of solvent casting solvent soluble OLED materials onto the device substrate, also has material patterning problems when applied to large displays. The issue here is that since the materials are solvent soluble, deposition of one organic OLED material will tend to re-dissolve and wash away previously deposited materials. For example, deposition of a red emitter material may damage structures composed of a previously deposited green emitter material. The solution to this problem has been to use ink-jet printing and other printing techniques to place down materials in patterned areas on the device substrate without contacting previously deposited structures. The problem with these sorts of solutions is that it is very difficult to create uniform layer thicknesses in device structures over a large area substrate. As a result, manufacturing yields for large screen TV displays are unacceptably low and while prototype large screen TVs utilizing solvent cast OLED materials have been shown, there has been no successful volume production of these products.

Recently another approach to large screen OLED televisions has been successful commercially. In this approach the organic light emitting and charge transporting layers are used un-patterned and the resultant OLEDs produce white light. The patterning of the pixels and sub-pixels of the TV display result from patterning of the cathodes and anodes that inject the electrons and holes that recombine in the emitter material to produce the white light. Sub-pixels are defined by the overlap areas of the cathodes and anodes. The white light emitted is converted into the proper colors for each sub-pixel upon passage through an array of color filters that is registered to the pixel structure created by the overlapping cathode and anode.

A compromise solution that has been adopted in commercially available OLED TV displays is to not only utilize red, green, and blue sub-pixels in each color pixel, but also a white sub-pixel. The white sub-pixel utilizes unfiltered white OLED light and allows display luminance to be increased without overdriving and rapidly destroying the colored sub-pixels. This sort of a TV display represents a series of compromises. In order to achieve a simplified and manufacturable structure the colored sub-pixels must be driven harder than in a conventional RGB display. By including the white sub-pixel the required drive current can be reduced to an elevated but acceptable level. But, this is accomplished at the cost of desaturation of the color output of the display when the white sub-pixels are turned on to produce a brighter image. The currently available OLED TVs that use the color filter/RGBW quad pixel configuration come with the user warning that if set images are displayed for an extended time period on the displays, the image will be "burnt-in" to the display permanently. This burn-in phenomenon is likely actually the beginning of the display failure mode for those sub-pixels displaying the burnt-in image in that they are being aged selectively over non-addressed sub-pixels. This suggests that the operating lifetime characteristics for these TV displays are marginal.

FIG. 1 illustrates a prior art system 100. The prior art system 100 includes a cathode 102 (in this case also configured as strips, one of which is shown from the side), a white light emitting stack of OLED materials 104, a series of anodes 106a, 106b, 106c, 106d (in this case configured as strips), a blue color filter 110, a green color filter 112, a red color filter 114, an emitter layer 114, and a substrate 118. According to other embodiments, the white light emitting stack of OLED materials 104 may contain a single emitter layer 116 comprising a single white light emitting emitter material. Alternatively, according to other embodiments the white light emitting stack of OLED materials 104 may contain a single emitter layer comprising multiple emitter materials emitting multiple colors that in combination appear white, or in other embodiments it may contain multiple emitter layers emitting multiple colors that in combination appear white.

In the embodiments described in FIG. 1, white light 118 is emitted from the area of white light emitting stack of OLED materials 104 between, for instance, the cathode 102 and anode 106d. This white light 120 passes into blue color filter 110 and blue light 122 emerges. Similarly, white light emerges from the areas of the white light emitting stack of OLED material delineated by other combinations of cathode 102 and anodes 106b or 106c and passes through the red color filter 114 and the green color filter 114 producing respectively red and green light. In this way red, green and blue sub-pixels of the display may be turned on and off by electrically addressing the proper cathode 102 and anode 106a, 106b, 106c, or 106d combination.

The substrate 118 is a transparent substrate and may include any suitable material. For example, according to various embodiments the substrate 118 includes a transparent material such as, for example, glass or a transparent plastic such as polymethyl methacrylate or polycarbonate.

The prior art system 100 avoids low yielding steps of patterning the various OLED material because only the cathode layers 102 need to be to be patterned by a shadow mask. Thus a practical manufacture of a display is made possible. The prior art system 100 allows for the economic manufacture of large screen OLED TV displays but suffers from inefficiency in light output. At least two-thirds of white light produced in prior art system 100 is lost in the color filters 110, 112, 114. One solution to overcoming the loss of light to the color filters has been to increase the current supplied to the OLED material thereby producing more light. Increasing current to the OLED material, however, cancels out the relative advantages of using OLED material in a display, which is the low power consumption of an OLED system. Increasing current additionally reduces the operating lifetime of OLED materials, because the lifetime of an OLED material roughly varies inversely to the square of the electrical current density passing through the OLED material.

BRIEF DESCRIPTION OF THE DRAWINGS

Various embodiments of the invention are described herein by way of example in conjunction with the following figures, wherein like reference characters designate the same or similar elements.

DETAILED DESCRIPTION

It is to be understood that at least some of the figures and descriptions of the invention have been simplified to illustrate elements that are relevant for a clear understanding of the invention, while eliminating, for purposes of clarity, other elements that those of ordinary skill in the art will appreciate may also comprise a portion of the invention. However, because such elements are well known in the art, and because they do not facilitate a better understanding of the invention, a description of such elements is not provided herein.

Figure 2:
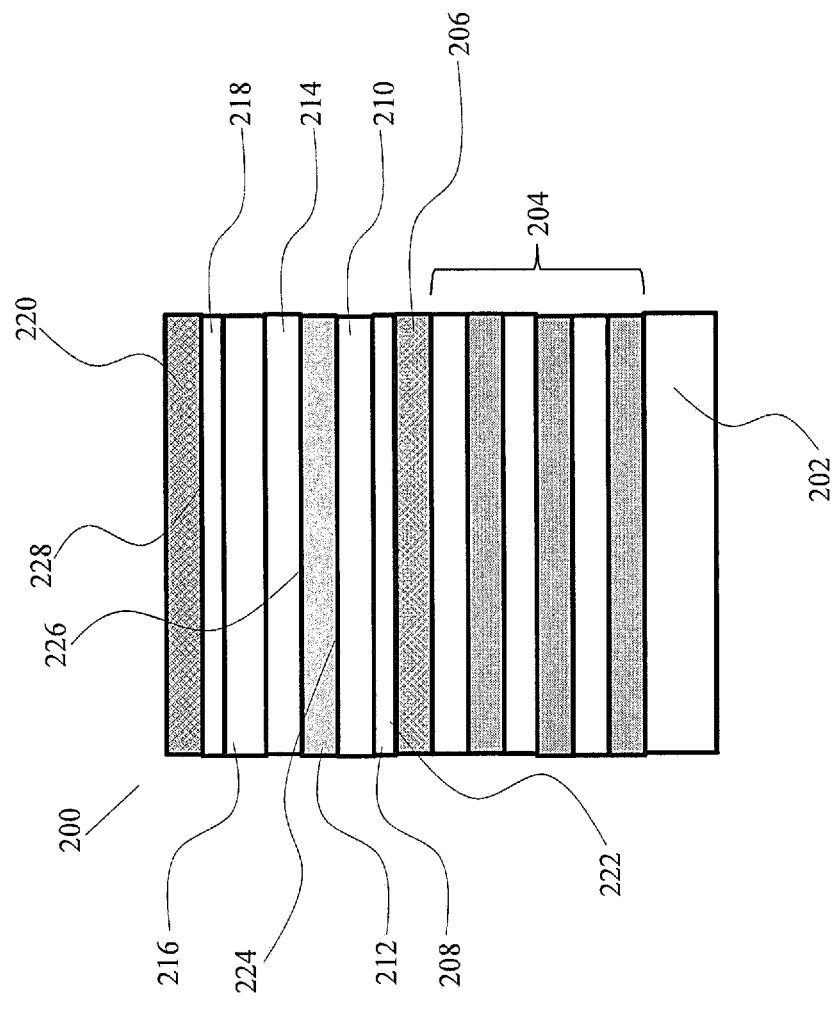
FIG. 2 illustrates various embodiments of a feedback enhanced organic light emitting diode.

FIG. 2 illustrates various embodiments of a feedback enhanced organic light emitting diode (FE-OLED) 200. For the embodiments shown in FIG. 2, the FE-OLED 200 includes a substrate 202, feedback structure 204, an anode 206, a hole injection layer 208, a first hole transporting layer 210, a second hole transporting layer 212, an emitter layer 214, an electron transporting layer 216, an electron injection layer 218 and a cathode 220. According to other embodiments, the FE-OLED 200 does not include the hole injection layer 208. In other words, according to various embodiments, the hole injection layer 208 is optional.

The substrate 202 is a transparent substrate and may include any suitable material. For example, according to various embodiments the substrate 202 includes a transparent material such as, for example, glass or a transparent plastic such as polymethyl methacrylate or polycarbonate. The feedback structure 204 may be any structure that feeds photons back towards the emitter layer 214. In various embodiments, the feedback structure 204 is formed such that it provides high reflectivity in a desired range of wavelengths. In the various embodiments described by FIG. 2, for example, the feedback structure 204 may be, among other things, a Bragg grating or an aperiodic feedback structure. The Bragg grating or the aperiodic feedback structure 204 is formed on or proximate the substrate 202. In the exemplary embodiment portrayed the lighter layers in the Bragg grating or the aperiodic feedback structure 204 represent layers with lower refractive indices and the darker layers represent layers with higher refractive indices. The layer thicknesses portrayed are for illustration only and will vary as different materials are used, and should not be taken as indicative of the optimum thickness for any particular device. It will be appreciated by one having ordinary skill in the art that any suitable feedback structure providing a desired reflectivity at a desired wavelength may be implemented in lieu of the feedback structure 204.

The anode 206 is a transparent anode and is formed on or proximate the feedback structure 204 and may include any suitable material. For example, according to various embodiments, the anode 206 includes a transparent material such as, for example, indium-tin oxide or some other transparent conductor. The anode 206 may also serve as a high refractive index layer in the feedback structure stack, where for example, the anode 206 may have a thickness of approximately equal to $(2N+1) \lambda_{emit}/4$, wherein N=0, 1, 2, or 3 and $\lambda_{emit}$ is a wavelength of light emitted by the emitter layer 214 and have a relatively high index of refraction with respect to the proximate layer of the feedback structure 204. The anode 206 has a "top" surface 222 which is an interface with the hole injection layer 208. For embodiments where the FE-OLED 200 does not include the hole injection layer 208, the "top" surface 222 is an interface with the hole transporting layer 210.

As shown in FIG. 2, according to various embodiments, the hole injection layer 208 is formed on or proximate the anode 206. For such embodiments, the hole injection layer 208 may include any suitable material. For example, according to various embodiments, the hole injection layer 208 includes poly(3,4-ethylenedioxythiophene) polystyrene sulfonate (PEDOT:PSS), copper phthalocyanine, or 2,3,8,0,14,15-hexaflourodiquinoxalino[2,3-a:2',3'-c] phenazine (HATNA-F6). According to other embodiments, the FE-OLED 200 does not include the hole injection layer 208. For embodiments where the FE-OLED 200 includes the hole injection layer 208, the hole transporting layer 210 is formed on or proximate the hole injection layer 208. For embodiments where the FE-OLED 200 does not include the hole injection layer 208, the hole transporting layer 210 is formed on or proximate the anode 206.

According to various embodiments, the combined thicknesses of the hole injection layer 208 and the hole transporting layer 210 can be adjusted such that light rays reflected from the surface 222 and the surface 224 are in phase with each other and in phase (the light rays interfere constructively) with light reflected from feedback structure 204. The feedback structure 204, the anode 206 thickness and the combined thicknesses of the hole injection layer 208 and the hole transporting layer 210 can all be designed such that the light fed back into the emitter layer 214 is at a wavelength emitted by the light emitting material in that layer. For example, according to various embodiments the hole injection layer 208 and the hole transporting layer 210 can have a combined optical thickness equal to approximately $(2N+1) \lambda_{emit}/4$, wherein N=0, 1, 2, or 3 and $\lambda_{emit}$ is a wavelength of light emitted by the emitter layer 214, and thereby serve as a low index layer in a feedback structure that includes the feedback structure 204, the anode 206, and layers 208 and 210. Because of the thickness required for layer 210, it may be necessary that layer 210 have a hole mobility greater than of conventional hole transport materials. The hole mobilities of the hole injection layer 208 and the hole transporting layer 210 may be greater than 5×10-5 cm2/volt·sec, preferably 5×10-4 cm2/volt·sec and most preferably 5×10-3 cm2/volt·sec. These high mobilities may be achieved by doping the material of the hole transporting layer 210 with an p-type dopant, for example 2,3,5,6-tetrafluoro-7,7,8,8-tetracyano-quinodimethane (See Physica Status Solidi A 210 (1), pp. 9-43). The hole transporting layer 210 may be formed from a p-type dopant and any suitable hole transporting material. For example, according to various embodiments, the hole transporting layer 210 may be formed from an p-type dopant in combination with N,N,N',N'-tetra-(3-methylphenyl)-3,3'-dimethylbenzidine (HMTPD), Di-[4-(N,N-di-p-tolyl-amino)-phenyl]cyclohexane, (TAPC), or 4,4'-Bis(carbazol-9-yl)biphenyl (CBP).

The hole transporting layer 212 is formed on or proximate the hole transporting layer 210 and has a "bottom" surface 224 and a "top" surface 226. The "bottom" surface 224 is an interface with the hole transporting layer 210 and the "top" surface 226 is an interface with the emitter layer 214. The material in the hole transporting layer 212 is chosen to have a higher refractive index than either the hole injection layer 208 and the hole transporting layer 210 or the emitter layer 214. The thickness of the hole transporting layer 212 can be adjusted such that light rays reflected from the surface 224 and the surface 226 are in phase with each other and in phase (the light rays interfere constructively) with light reflected from feedback structure 204. According to various embodiments the hole transporting layer 212 can have an optical thickness approximately equal to $(2N+1)\lambda_{emit}/4$, wherein N=0, 1, 2, or 3 and $\lambda_{emit}$ is a wavelength of light emitted by the emitter layer 214 and thereby serve as a high index layer in the feedback structure stack consisting of, for example, feedback structure 204, anode 206, and layers 208, 210 and 212. Because of the thickness required for layer 212, it may be necessary that it have a hole mobility greater than of conventional hole transporting materials. The hole mobility of the hole transporting layer 212 may be greater than 5×10-5 cm2/volt·sec, preferably 5×10-4 cm2/volt·sec and most preferably 5×10-3 cm2/volt·sec. These high mobilities may be achieved by doping the material of the hole transporting layer 212 with an p-type dopant, for example 2,3,5,6-tetrafluoro-7,7,8,8-tetracyano-quinodimethane (See Physica Status Solidi A 210 (1), pp. 9-43). The hole transporting layer 212 may be formed from a p-type dopant and any suitable hole transporting material. For example, according to various embodiments, the hole transporting layer 212 may be formed from an p-type dopant in combination with N,N,N',N'-tetra-(3-methylphenyl)-3,3'-dimethylbenzidine (HMTPD), Di-[4-(N,N-di-p-tolyl-amino)-phenyl]cyclohexane, (TAPC), or 4,4'-Bis(carbazol-9-yl)biphenyl (CBP).

As shown in FIG. 2, the emitter layer 214 is formed on or proximate the hole transporting layer 212, the electron transporting layer 216 is formed on or proximate the emitter layer 214, the electron injection layer 218 is formed on or proximate the electron transporting layer 216, and the cathode 220 is formed on or proximate the electron injection layer 218. The cathode 220 has a "bottom" surface 228 which is an interface with the electron injection layer 218. The emitter layer 214 is formed from any suitable material, for example, according to various embodiments the emitter layer 214 includes 9,10-di(2-naphthyl)anthracene, poly(2,5-dioctyl-1,4-phenylenevinylene)(POPPV), or 4,4'0N,N'-dicarbazole-biphenyl (CBP) doped with tris(2-phenylpyridine)iridium(Ir(ppy)3). The electron transporting layer 216 is formed from any suitable material. For example, according to various embodiments, the electron transporting layer 216 includes 3-(4-biphenyl)-4-phenyl-5-tert-butylphenyl-1,2,4-triazole (TAZ), bathocuproine (BCP), tris(8-hydroxyquinolinato)aluminium(Alq3), or diphenylbis(4-(pyridine-3-yl)phenyl)silane(DPPS). The electron injection layer most often comprises lithium fluoride.

It is often useful to have two hole transporting layers (e.g., hole transporting layers 210, 212) in organic light emitting diodes with the layer nearest the emitter layer 214 (e.g., hole transporting layer 212) having electron blocking properties. The hole transporting layer having electron blocking properties presents a barrier that prevents negative charge carrying electrons from passing into it from the emitter layer 214. This helps to confine the recombination of holes and electrons to the emitter layer 214. For embodiments like those shown in FIG. 2, where the FE-OLED 200 includes two hole transporting layers 210, 212, the hole transporting layer 212 may be chosen to have electron blocking properties while the hole transporting layer 210 may be chosen to optimize hole transport.

When the FE-OLED 200 is in operation, positive charge carrying holes are injected from the anode 206 into the hole injection layer 208 and in turn into the hole transporting layer 210. The holes then transit the hole transporting layers 210, 212, and enter the emitter layer 214. While the positive charge carrying holes are injected from the anode 206 into the hole injection layer 208, negative charge carrying electrons can be concurrently injected from the cathode 220 into the electron injection layer 218, and in turn into the electron transporting layer 216. The electrons then transit the electron transporting layer 216 and then enter the emitter layer 214.

The electrons and holes recombine in the emitter material molecules in the emitter layer 214. This process creates excitons that collapse to emit light in some wavelength band. Light that is emitted in the direction shown as vertically downward in FIG. 2 interacts with surfaces 226, 224, and 222, and with feedback structure 204 such that light with a wavelength that falls within the reflection band of the feedback structure 204 is reflected back upward through layers 206, 208, 210, and 212 towards the emitter layer 214 interfering coherently at each interface 222, 224, 226 before returning to the emitter layer 214. Light that is emitted in the direction shown as upward in FIG. 2 is reflected back towards the emitter layer 214 from metallic cathode surface 228, which redirects the light back downward through the electron injection layer 218 and through the electron transport layer 216 and back into the emitter layer 214. In this way light is constrained such that it cycles vertically upward and downward in the optical cavity formed between surface 228 and the feedback structure 204. This results in a higher photon density within the emitter layer than would be the case in a conventional OLED. These feedback photons interact with newly forming excitons in the emitter layer 214 stimulating the formation of additional photons. The result is that nearly all the photons emitted by the FE-OLED 200 are emitted through the process of stimulated emission and nearly all the light produced is propagating in the directions shown as vertical in FIG. 2. The feedback structure 204 is configured so as to "leak out" an optimum amount of light so as to maximize the light output intensity of the FE-OLED 200.

Utilizing the hole injection layer 208, the hole transporting layer 210 and the hole transporting layer 212 as part of a feedback structure (comprising these layers, anode 206, and the feedback structure 204) reduces the thickness of the optical cavity in which light is concentrated thus increasing the photon density in the emitter layer 214. Also, when these layers are utilized as part of the feedback structure, less light interacts with the material in the anode 206 because it is reflected from surfaces 224 and 226 instead. Since the material(s) used for the anode 206 absorb some light especially at the blue end of the spectrum, the more light reflected before interaction with the anode 206, the more efficient the FE-OLED 200 will be.

Figure 3:
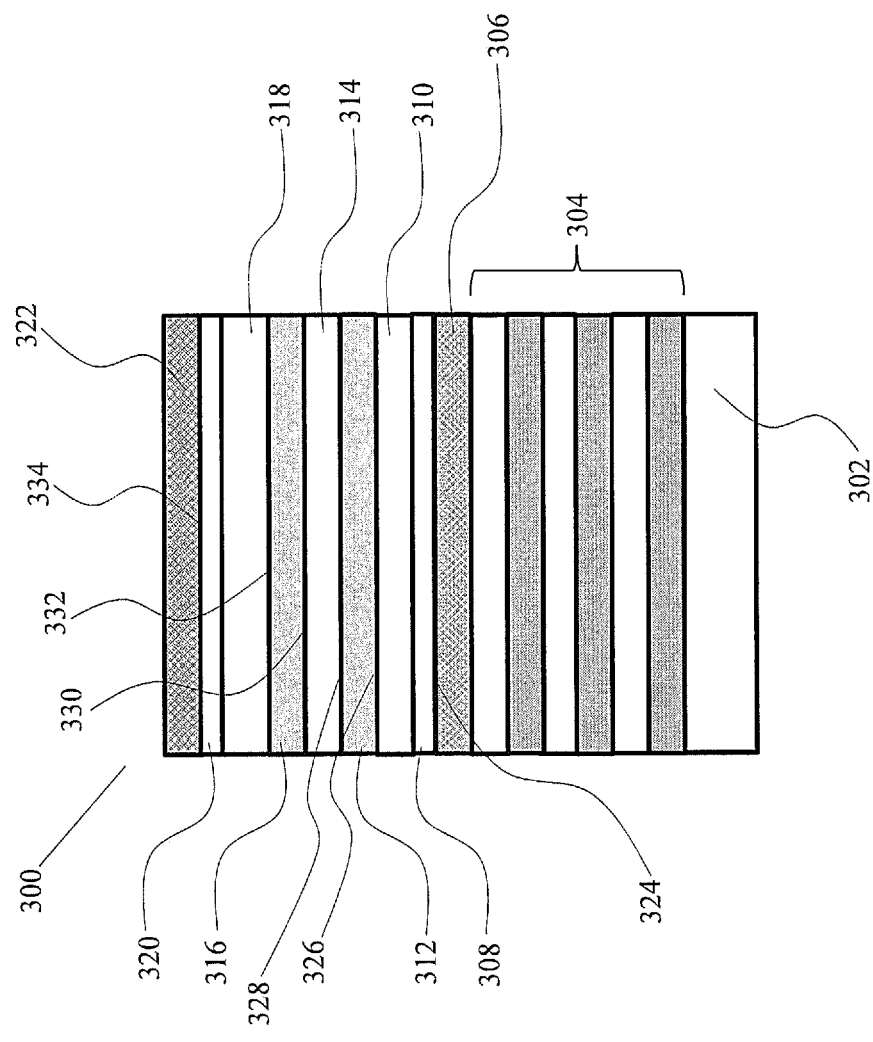
FIG. 3 illustrates various embodiments of a feedback enhanced organic light emitting diode.

FIG. 3 illustrates various embodiments of yet another feedback enhanced organic light emitting diode (FE-OLED) 300. For the embodiments shown in FIG. 3, the FE-OLED 300 includes a substrate 302, a feedback structure 304, an anode 306, a hole injection layer 308, a first hole transporting layer 310, a second hole transporting layer 312, an emitter layer 314, a first electron transporting layer 316, a second electron transporting layer 318, an electron injection layer 320 and a cathode 322. According to other embodiments, the FE-OLED 300 does not include one or more of the hole injection layer 308, the second electron transporting layer 318 and the electron injection layer 320. In other words, according to various embodiments, these layers are optional.

The substrate 302 is a transparent substrate and may include any suitable material. For example, according to various embodiments the substrate 302 includes a transparent material such as, for example, glass or a transparent plastic such as polymethyl methacrylate or polycarbonate. The feedback structure 304 may be any structure that feeds photons back towards the emitter layer 314. In various embodiments the feedback structure 304 is formed such that it provides high reflectivity in a desired range of wavelengths. In various embodiments described by FIG. 3, for example, the feedback structure may be, among other things, a Bragg grating or an aperiodic feedback structure. The Bragg grating or the aperiodic feedback structure 304 is formed on or proximate the substrate 302. In the exemplary embodiment portrayed the lighter layers in the Bragg grating or the aperiodic feedback structure 304 represent layers with lower refractive indices and the darker layers represent layers with higher refractive indices. The layer thicknesses portrayed are for illustration only and will vary as different materials are used, and should not be taken as indicative of the optimum thickness for any particular device. It will be appreciated by one having ordinary skill in the art that any suitable feedback structure providing a desired reflectivity at a desired wavelength may be implemented in lieu of the feedback structure 304.

The anode 306 is a transparent anode and is formed on or proximate the feedback structure 304 and may include any suitable material. For example, according to various embodiments, the anode 306 includes a transparent material such as, for example, indium-tin oxide or some other transparent conductor. The anode 306 may also serve as a high refractive index layer in the feedback structure stack comprising the feedback structure 304, the anode 306, the hole injection layer 308, if present, and the hole transport layer 310. For example, in various embodiments, the anode 306 may have a thickness equal to $(2N+1)\lambda_{emit}/4$, wherein N=0, 1, 2, or 3 and $\lambda_{emit}$ is a wavelength of light emitted by the emitter layer 314 and having a relatively high index of refraction with respect to the proximate layer of the feedback structure 304. The anode 306 has a "top" surface 324 which is an interface with the hole injection layer 308. For embodiments where the FE-OLED 300 does not include the hole injection layer 308, the "top" surface 324 is an interface with the hole transporting layer 310.

As shown in FIG. 3, according to various embodiments, the hole injection layer 308 is formed on or proximate the anode 306. For such embodiments, the hole injection layer 308 may include any suitable material. For example, according to various embodiments, the hole injection layer 308 includes poly(3,4-ethylenedioxythiophene) polystyrene sulfonate (PEDOT:PSS), copper phthalocyanine, or 2,3,8,9,14,15-hexaflourodiquinoxalineo[2,3-a:2',3'-c] phenazine (HATNA-F6). According to other embodiments, the FE-OLED 300 does not include the hole injection layer 308. For embodiments where the FE-OLED 300 includes the hole injection layer 308, the hole transporting layer 310 is formed on or proximate the hole injection layer 308. For embodiments where the FE-OLED 300 does not include the hole injection layer 308, the hole transporting layer 310 is formed on or proximate the anode 306.

According to various embodiments, the combined thicknesses of the hole injection layer 308 and the hole transporting layer 310 can be adjusted such that light rays reflected from the surface 324 and the surface 326 are in phase with each other and in phase (the light rays interfere constructively) with light reflected from feedback structure 304. The feedback structure 304, the anode 306 thickness and the combined thicknesses of the hole injection layer 308 and the hole transporting layer 310 can all be designed such that the light fed back into the emitter layer 314 is at a wavelength emitted by the light emitting material in that layer. The hole injection layer 308 and the hole transporting layer 310, in other various embodiments, can cooperate to serve as a low index layer in the feedback structure stack that also includes feedback structure 304 and anode 306 and, for example, can have a combined optical thickness approximately equal to $(2N+1)\lambda_{emit}/4$, wherein N=0, 1, 2, or 3 and $\lambda_{emit}$ is a wavelength of light emitted by the emitter layer 314. Because of the thickness required for layer 310, it may be necessary that it have a hole mobility greater than of conventional hole transporting materials. The hole mobilities of the hole injection layer 308 and the hole transporting layer 310 may be greater than 5×10-5 cm2/volt·sec, preferably 5×10-4 cm2/volt·sec and most preferably 5×10-3 cm2/volt·sec. These high mobilities may be achieved by doping the material of the hole transporting layer 310 with an p-type dopant, for example 2,3,5,6-tetrafluoro-7,7,8,8-tetracyano-quinodimethane (see Physica Status Solidi A 210 (1), pp. 9-43).). The hole transporting layer 310 may be formed from such a p-type dopant and any suitable hole transporting material. For example, according to various embodiments, the hole transporting layer 310 may be formed from an p-type dopant in combination with N,N,N',N'-tetra-(3-methylphenyl)-3,3'-dimethylbenzidine (HMTPD), Di-[4-(N,N-di-p-tolyl-amino)-phenyl]cyclohexane, (TAPC), or 4,4'-Bis (carbazol-9-yl)biphenyl (CBP).

The hole transporting layer 312 is formed on or proximate the hole transporting layer 310 and has a "bottom" surface 326 and a "top" surface 328. The "bottom" surface 326 is an interface with the hole transporting layer 310 and the "top" surface 328 is an interface with the emitter layer 314. The material in the hole transporting layer 312 is chosen to have a higher refractive index than either the hole injection layer 308 and the hole transporting layer 310 or the emitter layer 314. The thickness of the hole transporting layer 312 can be adjusted such that light rays reflected from the surface 326 and the surface 328 are in phase (the light rays interfere constructively) with each other and in phase with light reflected from feedback structure 304. The hole transporting layer 312 serves as a high index layer in the feedback structure stack comprising the feedback structure 304, the anode 306, and layers 308, 310 and 312, and for example can have an optical thickness approximately equal to $(2N+1)\lambda_{emit}/4$, wherein. N=0, 1, 2, or 3 and $\lambda_{emit}$ is a wavelength of light emitted by the emitter layer 314. Because of the thickness required for layer 312, it may be necessary that it have a hole mobility greater than that of conventional hole transporting materials. Because of the thickness required for layer 312, it may be necessary that it have a hole mobility greater than of conventional hole transporting materials. The hole mobility of the hole transporting layer 312 may be greater than 5×10-5 cm2/volt·sec, preferably 5×10-4 cm2/volt·sec and most preferably 5×10-3 cm2/volt·sec. These high mobilities may be achieved by doping the material of the hole transporting layer 312 with an p-type dopant, for example 2,3,5,6-tetrafluoro-7,7,8,8-tetracyano-quinodimethane (See Physica Status Solidi A 210 (1), pp. 9-43).

As shown in FIG. 3, the emitter layer 314 is formed on or proximate the hole transporting layer 312, the electron transporting layer 316 is formed on or proximate the emitter layer 314, the electron transporting layer 318 is formed on or proximate the electron transporting layer 316, the electron injection layer 320 is formed on or proximate the electron transporting layer 318, and the cathode 322 is formed on or proximate the electron injection layer 320. The electron transporting layer 316 has a "bottom" surface 330 and a "top" surface 322. The "bottom surface 330 is an interface with the emitter layer 314 and the "top" surface 332 is an interface with the electron transporting layer 318. The cathode 322 has a "bottom" surface 334 which is an interface with the electron injection layer 320. The emitter layer 314 is formed from any suitable material on or proximate the hole transporting layer 312. For example, according to various embodiments, the emitter layer 112 includes 9,10-di(2-naphthyl)antracene,poly(2,5-dioctyl-1,4-phenylenevinylene) (POPPV), or 4,4'-N,N'-dicarbazole-biphenyl (CBP) doped with tris(2-phenylpyridine)iridium(Ir(ppy)3).

The electron transporting layer 316 has a higher refractive index than the emitter layer 314 and has an optical thickness chosen such that light emitted by the emitter layer 314 reflects from the top surface 332 and the bottom surface 330 of the electron transporting layer 316 and interferes constructively. The electron transporting layer 316 therefore assists in localizing light in the emitter layer 314. According to various embodiments, the electron transporting layer 316 can have an optical thickness that is equal to $(2N+1)\lambda_{emit}/4$, wherein N=0, 1, 2, or 3 and $\lambda_{emit}$ is a wavelength of light emitted by the emitter layer 314. The wavelength may not be the peak emission intensity wavelength of the emissive material, but can be chosen to match the wavelength of light reflected from the feedback structure 304. Because of the thickness required for layer 316, it may be necessary that it have an electron mobility greater than of conventional electron transporting materials. The electron mobility may be greater than 5×10-5 cm2/volt·sec, preferably 5×10-4 cm2/volt·sec and most preferably 5×10-3 cm2/volt·sec. These high mobilities may be achieved by doping the material of the electron transporting layer 316 with an n-type dopant, for example an n-type dopant of the types described in Physica Status Solidi A 210 (1), pp. 9-43, for example in various embodiments a conventional electron transport material may be doped with cesium, bis(cyclopentadienyl)-cobalt(II)(CoCP2), or rhodocene dimer. The electron transporting layer 316 may be formed of such an n-type dopant and any suitable electron transporting material. For example, according to various embodiments, the electron transporting layer 316 may be formed from an n-type dopant in combination with 3-(4-biphenyl)-4-phenyl-5-tert-butylphenyl-1,2,4-triazole (TAZ), bathocuproine (BCP), tris(8-hydroxy-quinolinato)aluminium (Alq3), or diphenylbis(4-(pyridin-3-yl)phenyl)silane (DPPS).

The electron injection layer 320 aids in transferring electrons from the metal cathode 322 into the second electron transporting layer 318 or into the first electron transporting layer 316 (for embodiments where the FE-OLED device 300 does not include the second electron transporting layer 318).

The cathode 322 is a metal cathode and is formed on or proximate the electron injection layer 320. The "bottom" surface 334 of the cathode 322 is a reflective surface. For embodiments where the FE-OLED 300 does not include the electron injection layer 320, the cathode 322 is formed on or proximate the second electron transporting layer 318. For embodiments where the FE-OLED 300 does not include the electron injection layer 320 and the second electron transporting layer 318, the cathode 322 is formed on or proximate the first electron transporting layer 316. The cathode 322 may include any suitable material. For example, according to various embodiments, the cathode 322 includes a metal material such as, for example, aluminum. According to various embodiments, the electron injection layer 320 includes lithium fluoride and the cathode 322 includes aluminum. Lithium fluoride layers used in this way are quite thin (e.g. 0.5 nanometers), but other electron injection layers 320 which include different material(s) may be thicker.

The refractive indices of the electron transporting layer 318 and the electron injection layer 320, if they are present, are lower than that of the electron transporting layer 316. The combined optical thickness of the electron transporting layer 318 and the electron injection layer 320 can be chosen such that reflections from the "bottom" surface of the electron transporting layer 318 (the "top" surface of the electron transporting layer 316) and the reflective surface 334 of the cathode 322 interfere constructively for light of the same wavelength as is fed back from the surfaces of the electron transporting layer 316. The electron transporting layer 318 and the electron injection layer 320 thereby may assist in localizing light in the emitter layer 314.

According to various embodiments, the electron transporting layer 318 and the electron injection layer 320 can have a combined optical thickness that is equal to approximately $(N+1)\lambda_{emit}/2$, wherein N=0, 1, 2, or 3 and $\lambda_{emit}$ is the wavelength of light fed back from the surfaces of the electron transporting layer 316. The "half wave" thicknesses are due to the phase shift that occurs when light is reflected from a metal surface of cathode 322. Because of the thickness required for layer 318, it may be necessary that it have an electron mobility greater than those of conventional electron transporting materials. The electron mobility may be greater than 5×10-5 cm2/volt·sec, preferably 5×10-4 cm2/volt·sec and most preferably 5×10-3 cm2/volt·sec. These high mobilities may once again be achieved by doping the material of the electron transporting layer 318 with an n-type dopant, for example in various embodiments a conventional electron transport material may be doped with cesium, bis(cyclopentadienyl)-cobalt(II)(CoCP2), or rhodocene dimer.

For embodiments where the electron transporting layer 318 and the electron injection layer 320 are not present, the electron transporting layer 318 can have an optical thickness equal to approximately $(N+1)\lambda/2$, wherein N=0, 1, 2, or 3 and $\lambda$ is a wavelength of light emitted by the emissive material in the emitter layer 314 so that light rays reflected from the reflective surface 334 of the cathode 322 and from the "bottom" surface 330 of the electron transporting layer 316 will be in phase. For embodiments where electron transporting layer 318 is not present and the electron injection layer 320 is present, the thickness of the electron transporting layer 316 can be adjusted to maximize the intensity of light fed back into the emitter layer 314. Accordingly, together, cathode 322, and layers 320,318, and 316 combined function as a feedback structure feeding light back through emitter layer 314.

In the various embodiments described by FIG. 3, therefore, the emitter layer 314 is situated between two feedback structures, one formed on the "bottom" side of the emitter layer 314 comprising the feedback structure 304, the anode 306, and layers 310 (if present), 308 (if present) and 312; and the second formed on the "top" side of the emitter layer 314 comprising layers 316, 318 (if present), 320 (if present) and the cathode 322. Accordingly, the light emitted by the emissive material in the emitter layer 314 is highly localized in the emitter layer 314 yielding maximum levels of stimulated emission.

Figure 1:
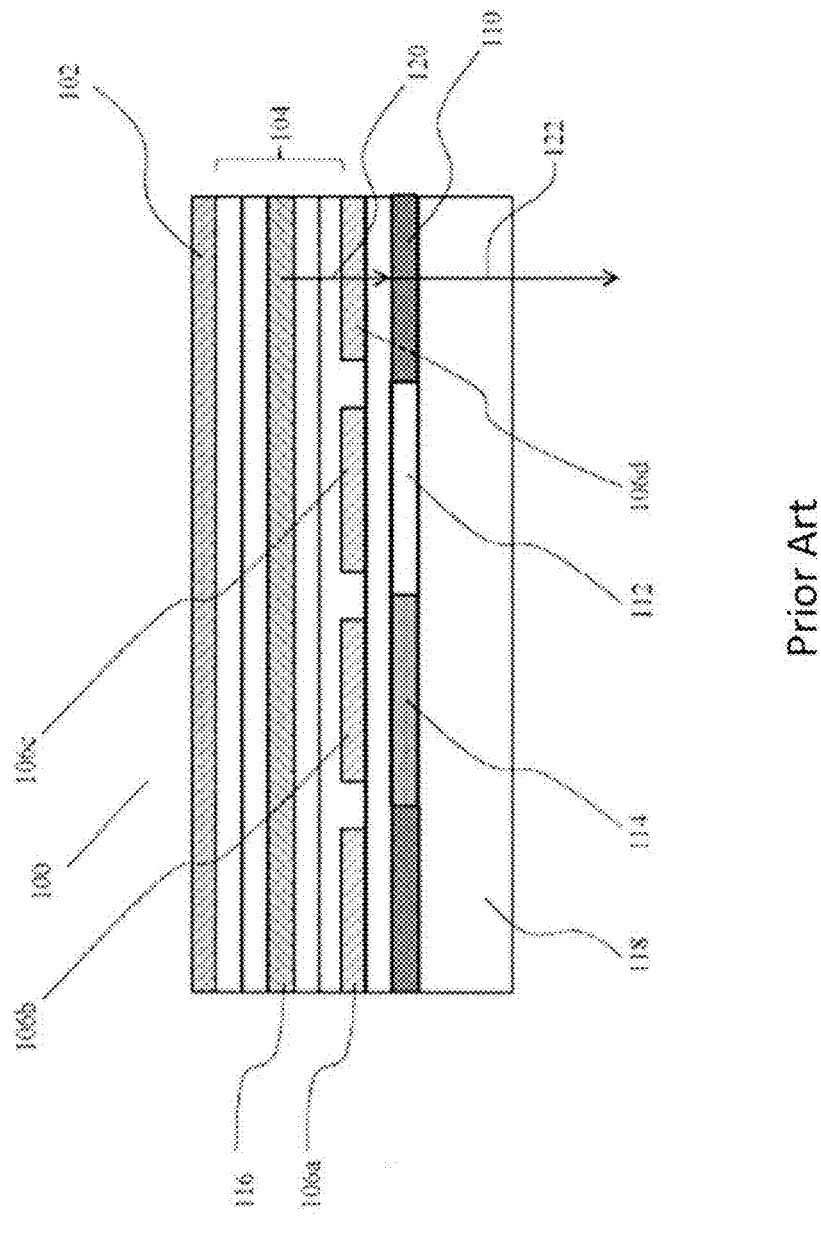
FIG. 1 illustrates various embodiments of a prior art system.

For each of the embodiments described hereinabove with respect to FIGS. 1-3, the emitter layer is represented as having a refractive index which is lower than at least one of the charge transporting layers adjacent to it. However, this need not be the case. According to various embodiments of a feedback enhanced organic light emitting diode (FE-OLED), the emitter layer can have a refractive index which is higher than an adjacent layer.

Figure 4:
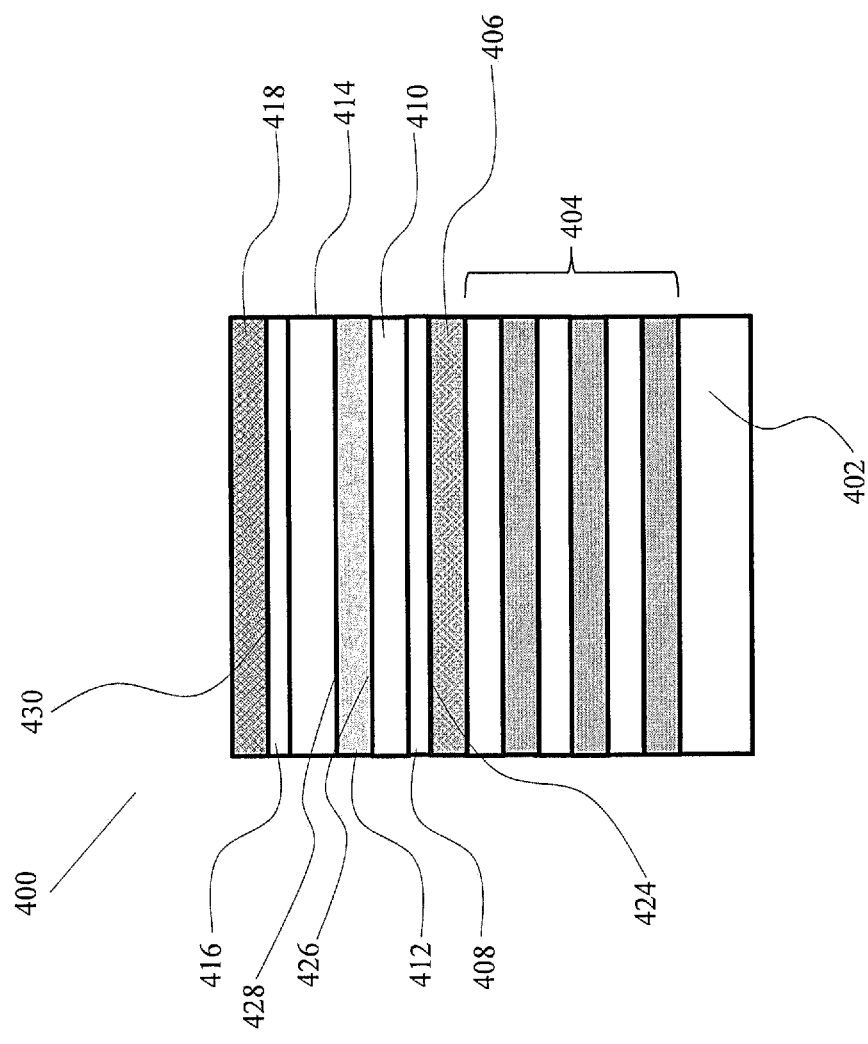
FIG. 4 illustrates various embodiments of a feedback enhanced organic light emitting diode.

FIG. 4 illustrates various embodiments of yet another feedback enhanced organic light emitting diode (FE-OLED) 400. For the embodiments shown in FIG. 4, the FE-OLED 400 includes a substrate 402, a structure 404, an anode 406, a hole injection layer 408, a hole transporting layer 410, an emitter layer 412, an electron transporting layer 414, an electron injection layer 416 and a cathode 418. According to other embodiments, the FE-OLED 400 does not include the hole injection layer 408 and/or the electron injection layer 416. In other words, according to various embodiments, one or more of the layers 408 and 416 are optional. As described in more detail herein, below, the emitter layer 412 has a refractive index which is higher than at least one adjacent layer.

The substrate 402 is a transparent substrate and may include any suitable material. For example, according to various embodiments the substrate 402 includes a transparent material such as, for example, glass or a transparent plastic such as polymethyl methacrylate or polycarbonate. The feedback structure 404 may be any structure that feeds photons back towards the emitter layer 412. In various embodiments the feedback structure 404 is formed such that it provides high reflectivity in a desired range of wavelengths. In various embodiments described by FIG. 4, for example, the feedback structure may be, among other things, a Bragg grating or an aperiodic feedback structure. The Bragg grating or the aperiodic feedback structure 404 is formed on or proximate the substrate 402. In the exemplary embodiments portrayed the lighter layers in the Bragg grating or the aperiodic feedback structure 404 represent layers with lower refractive indices and the darker layers represent layers with higher refractive indices. The layer thicknesses portrayed are for illustration only and will vary as different materials are used, and should not be taken as indicative of the optimum thickness for any particular device. It will be appreciated by one having ordinary skill in the art that any suitable feedback structure providing a desired reflectivity at a desired wavelength may be implemented in lieu of the feedback structure 404.

The anode 406 is a transparent anode and is formed on or proximate the feedback structure 404 and may include any suitable material. For example, according to various embodiments, the anode 406 includes a transparent material such as, for example, indium-tin oxide or some other transparent conductor. The anode 406 may, according to various embodiments, also serve as a high refractive index layer in the feedback structure stack consisting of the anode 406 and the feedback structure 404, in other words the anode serves as a functional layer of the proximately formed feedback structure 404. In order to serve in this role, the anode 406 may be, for example, have a thickness equal to $(2N+1)\lambda_{emit}/4$, wherein N=0, 1, 2, or 3 and $\lambda_{emit}$ is a wavelength of light emitted by the emitter layer 412, and also have a refractive index higher than that of the adjacent layers 408 and 410 and the adjacent material in feedback structure 404. The anode 406 has a "top" surface 424 which is an interface with the hole injection layer 408. For embodiments where the FE-OLED 400 does not include the hole injection layer 408, the "top" surface 424 is an interface with the hole transporting layer 410.

As shown in FIG. 4, according to various embodiments, the hole injection layer 408 is formed on or proximate the anode 406. For such embodiments, the hole injection layer 408 may include any suitable material. For example, according to various embodiments, the hole injection layer 408 includes poly(3,4-ethylenedioxythiophene) polystyrene sulfonate (PEDOT:PSS), toper phthalocyanine, or 2,3,8,9, 14,15-hexaflourodiquinoxalino[2,3-a:2',3'-c] phenazine (HATNA-F6). According to other embodiments, the FE-OLED 400 does not include the hole injection layer 408. For embodiments where the FE-OLED 400 includes the hole injection layer 408, the hole transporting layer 410 is formed on or proximate the hole injection layer 408. For embodiments where the FE-OLED 400 does not include the hole injection layer 408, the hole transporting layer 410 is formed on or proximate the anode 406.

As shown in FIG. 4, the emitter layer 412 is formed on or proximate the hole transporting layer 410, the electron transporting layer 414 is formed on or proximate the emitter layer 412, the electron injection layer 416 is formed on or proximate the electron transporting layer 414, and the cathode 418 is formed on or proximate the electron injection layer 416. The electron transporting layer 414 has a "bottom" surface 428 and the emitter layer 412 has a "bottom" surface 426. The "bottom" surface 428 is an interface with the emitter layer 412 and the surface 426 is an interface with the hole transporting layer 410. The cathode 418 has a "bottom" surface 430 which is an interface with the electron injection layer 416.

The hole injection layer 408 and the hole transporting layer 410, according to various embodiments described by FIG. 4, have a lower refractive index than emitter layer 412 or anode 406. The combined thicknesses of the hole injection layer 408 and the hole transporting layer 410 can be adjusted such that light rays reflected from the surface 424 and the surface 426 are in phase with each other and in phase (interfere constructively) with light reflected from feedback structure 404. In this way layers 408 and 410 can cooperate to serve as a low index layer in the feedback structure stack that consists of feedback structure 404, anode 406, and layers 408 and 410 and can have a combined optical thickness equal to $(2N+1)\lambda_{emit}/4$, wherein N=0, 1, 2, or 3 and $\lambda_{emit}$ is a wavelength of light emitted by the emitter layer 412. Because of the thickness required for the combined layers 408 and 410, it may be necessary that it have a hole mobility greater than that of conventional hole transport materials. The hole mobilities of the hole injection layer 408 and the hole transporting layer 410 may be greater than 5×10-5 cm2/volt·sec, preferably 5×10-4 cm2/volt·sec and most preferably 5×10-3 cm2/volt·sec. These high mobilities may be achieved by doping the material of the hole transporting layer 410 with an p-type dopant, for example 2,3, 5,6-tetrafluoro-7,7,8,8-tetracyano-quinodimethane (See Physica Status Solidi A 210 (1), pp. 9-43).

The electron injection layer 416 aids in transferring electrons from the metal cathode 418 into the electron transporting layer 414. The cathode 418 is a metal cathode and is formed on or proximate the electron injection layer 416. The "bottom" surface 430 of the cathode 418 is a reflective surface. For embodiments where the FE-OLED 400 does not include the electron injection layer 416, the cathode 418 is formed on or proximate the electron transporting layer 414. The cathode 418 may include any suitable material. For example, according to various embodiments, the cathode 418 includes a metal material such as, for example, aluminum. According to various embodiments, the electron injection layer 416 includes lithium fluoride and the cathode 418 includes aluminum. Lithium fluoride layers used in this way are quite thin (e.g. 0.5 nanometers), but other electron injection layers 416 which include different material(s) may be thicker.

The refractive indices of the electron transporting layer 414 and the electron injection layer 416 (if it is present), are lower than that of the emitter layer 412. The combined optical thickness of the electron transporting layer 414 and the electron injection layer 416 can be chosen such that reflections from the "bottom" surface 428 of the electron transporting layer 414 (the "top" surface of the emitter layer 412) and the reflective surface 430 of the cathode 418 interfere constructively. According to various embodiments, the combined optical thickness of the electron transport layer 414 and the electron injection layer 416 is equal to approximately $(N+1)\lambda_{emit}/2$, wherein N=0, 1, 2, or 3 and $\lambda_{emit}$ is a wavelength of light emitted by the emissive material in emitter layer 412. The wavelength may not be the peak emission intensity wavelength of the emissive material, but can be chosen to match the wavelength of light reflected from the feedback structure 404. Because of its thickness, the electron transporting layer 414 has a high electron mobility as compared conventional amorphous or polymeric electron transporting materials. The electron mobility may be greater than $5\times10^{-5}$ cm2/volt·sec, preferably $5\times10^{-4}$ cm2/volt·sec and most preferably $5\times10^{-3}$ cm2/volt·sec. These high mobilities may once again be achieved by doping the material of the electron transporting layer 414 with an n-type dopant Specific examples of n-type dopants include cesium, bis(cyclopentadienyl)-cobalt(II) (CoCP2), or rhodocene dimer. The electron transporting layer 414 may be formed of such an n-type dopant and any suitable electron transporting material. For example, according to various embodiments, the electron transporting layer 114 may be formed from an n-type dopant in combination with 3-(4-biphenyl)-4-phenyl-5-tert-butylphenyl-1,2,4-triazole (TAZ), bathocuproine (BCP), tris(8-hydroxy-quinolinato)aluminium (Alq3), or diphenylbis(4-(pyridin-3-yl)phenyl)silane (DPPS).

The hole transporting layer 410 forms part of a feedback structure stack along with feedback structure 404, anode 406, and layer 408, and the electron transporting layer 414 functions as part of feedback structure stack along with layer 416 and cathode 418, the light emitted by the emissive material in the emitter layer 412 is highly localized in the emitter layer 412 yielding maximum levels of stimulated emission.

Figure 5:
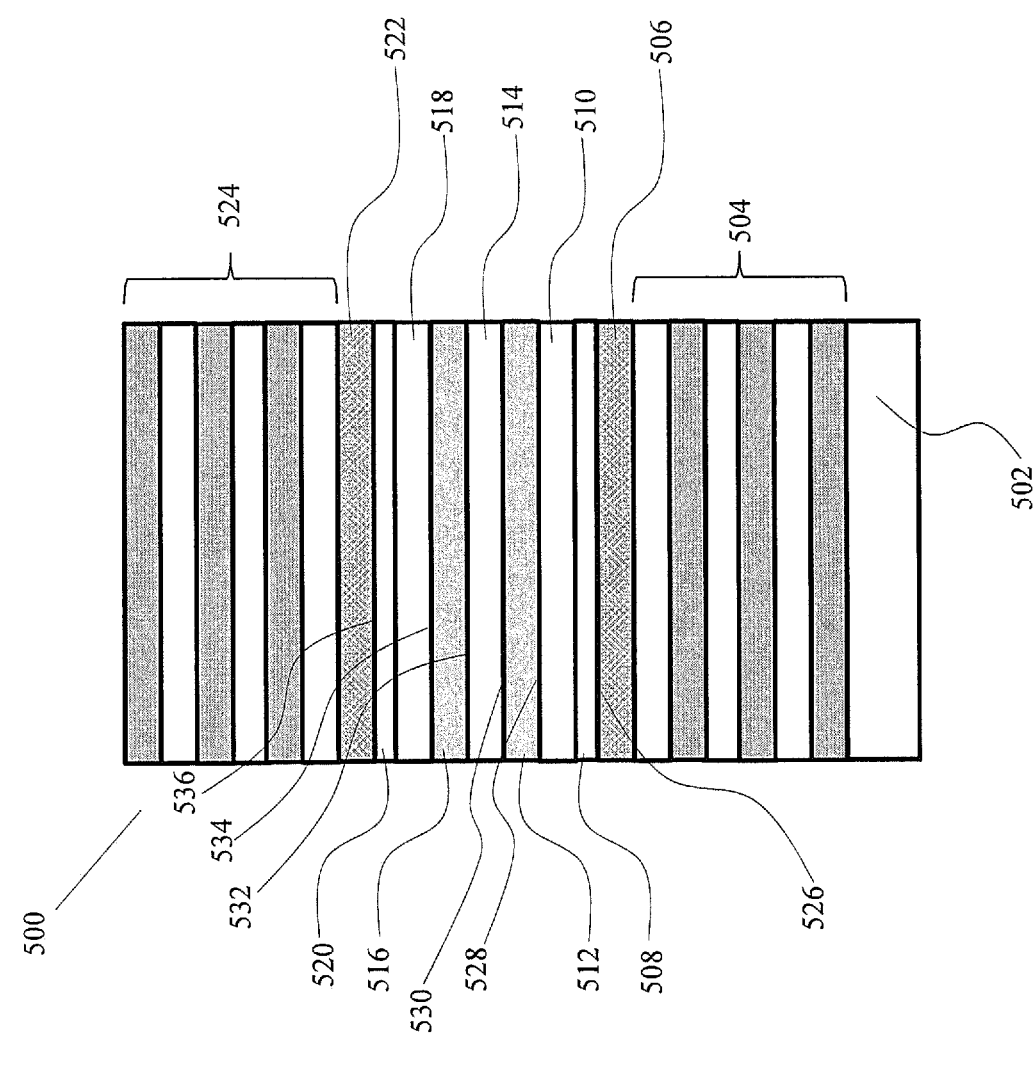
FIG. 5 illustrates various embodiments of a feedback enhanced organic light emitting diode.

FIG. 5 illustrates various embodiments of yet another feedback enhanced organic light emitting diode (FE-OLED) 500. For the embodiments shown in FIG. 5, the FE-OLED 500 includes a substrate 502, a first feedback structure 504, an anode 506, a hole injection layer 508, a first hole transporting layer 510, a second hole transporting layer 512, an emitter layer 514, a first electron transporting layer 516, a second electron transporting layer 518, an electron injection layer 520, a cathode 522 and a second feedback structure 524. According to other embodiments, the FE-OLED 500 does not include one or more of the hole injection layer 508, the second electron transporting layer 518 and the electron injection layer 520. In other words, according to various embodiments, these layers are optional. The FE-OLED 500 is similar to the FE-OLED 300 but is different in that it includes the transparent cathode 522 and the second feedback structure 524 in lieu of the metal cathode 322 of the FE-OLED 300.

The substrate 502 is a transparent substrate and may include any suitable material. For example, according to various embodiments the substrate 502 includes a transparent material such as, for example, glass or a transparent plastic such as polymethyl methacrylate or polycarbonate. Because the embodiments described by FIG. 5 may be configured to allow light to exit the device through the second feedback structure 524, in some embodiments substrate 502 may not be light transmitting. The first feedback structure 504 may be any structure that feeds photons back towards the emitter layer 514. In various embodiments the feedback structure 504 is formed such that it provides high reflectivity in a desired range of wavelengths. In various embodiments described by FIG. 5, for example, the feedback structure may be, among other things, a Bragg grating or an aperiodic feedback structure. The Bragg grating or the aperiodic feedback structure 504 is formed on or proximate the substrate 502. In the exemplary embodiment portrayed the lighter layers in the Bragg grating or the aperiodic feedback structure 504 represent layers with lower refractive indices and the darker layers represent layers with higher refractive indices. The layer thicknesses portrayed are for illustration only and will vary as different materials are used, and should not be taken as indicative of the optimum thickness for any particular device. It will be appreciated by one having ordinary skill in the art that any suitable feedback structure providing a desired reflectivity at a desired wavelength may be implemented in lieu of the feedback structure 504.

The anode 506 is a transparent anode and is formed on or proximate the feedback structure 504 and may include any suitable material. For example, according to various embodiments, the anode 506 includes a transparent material such as, for example, indium-tin oxide or some other transparent conductor. The anode 506 may also serve to function as a high refractive index layer in conjunction with the feedback structure 504 stack by, for example, having an optical thickness equal to $(2N+1)\lambda_{emit}/4$, wherein N=0, 1, 2, or 3 and $\lambda_{emit}$ is a wavelength of light emitted by the emitter layer 514. The anode 506 has a "top" surface 526 which is an interface with the hole injection layer 508. For embodiments where the FE-OLED 500 does not include the hole injection layer 508, the "top" surface 526 is an interface with the hole transporting layer 510.

As shown in FIG. 5, according to various embodiments, the hole injection layer 508 is formed on or proximate the anode 506. For such embodiments, the hole injection layer 508 may include any suitable material. For example, according to various embodiments, the hole injection layer 508 includes poly(3,4-ethylenedioxythiophene) polystyrene sulfonate (PEDOT:PSS), copper phthalocyanine, or 2,3,8,9,14,15-hexafluorodiquinoxalino[2,3-a:2',3'-c]phenazine (HATNA-F6). According to other embodiments, the FE-OLED 500 does not include the hole injection layer 508. For embodiments where the FE-OLED 500 includes the hole injection layer 508, the hole transporting layer 510 is formed on or proximate the hole injection layer 508. For embodiments where the FE-OLED 500 does not include the hole injection layer 508, the hole transporting layer 510 is formed on or proximate the anode 506.

According to various embodiments, the combined thicknesses of the hole injection layer 508 and the hole transporting layer 510 can be adjusted such that light rays reflected from the surface 526 and the surface 528 are in phase with each other and in phase (the light rays interfere constructively) with light reflected from feedback structure 504. The feedback structure 504, the anode 506 thickness and the combined thicknesses of the hole injection layer 508 and the hole transporting layer 510 can all be designed such that the light fed back into the emitter layer 514 is at a wavelength emitted by the light emitting material in that layer. The hole injection layer 508 and the hole transporting layer 510 can cooperate to serve as a low index layer in the feedback structure stack comprising the feedback structure 504, the anode 506, layers 508, 510, and 512, and can have a combined optical thickness to $(2N+1)\lambda_{emit}/4$, wherein N=0, 1, 2, or 3 and $\lambda_{emit}$ is a wavelength of light emitted by the emitter layer 514. Because of the required thickness of the hole transport layer 510, it may be necessary to have a hole mobility in layer 510 that is greater than that of conventional hole transport materials. The hole mobilities of the hole injection layer 508 and the hole transporting layer 510 may be greater than $5\times10^{-5}$ cm2/volt·sec, preferably $5\times10^{-4}$ cm2/volt·sec and most preferably $5\times10^{-3}$ cm2/volt·sec. These high mobilities may be achieved by doping the material of the hole transporting layer 510 with an p-type dopant, for example 2,3,5,6-tetrafluoro-7,7,8,8-tetracyano-quinodimethane (See Physica Status Solidi A 210 (1), pp. 9-43). The hole transporting layer 510 may be formed from such a p-type dopant and any suitable hole transporting material. For example, according to various embodiments, the hole transporting layer 510 may be formed from an p-type dopant in combination with N,N,N',N-tetra-(3-methylphenyl)-3,3'-dimethylbenzidine (HMTPD), Di-[4-(N,N-di-p-tolyl-amino)-phenyl]cyclohexane, (TAPC), or 4,4'-Bis (carbazol-9-yl)biphenyl (CBP).

The hole transporting layer 512 is formed on or proximate the hole transporting layer 510 and has a "bottom" surface 528 and a "top" surface 530. The "bottom" surface 528 is an interface with the hole transporting layer 510 and the "top" surface 530 is an interface with the emitter layer 514. The material in the hole transporting layer 512 is chosen to have a higher refractive index than either the hole injection layer 508 and the hole transporting layer 510 or the emitter layer 514. The thickness of the hole transporting layer 512 can be adjusted such that light rays reflected from the surface 528 and the surface 530 are in phase with each other and in phase (the light rays interfere constructively) with light reflected from feedback structure 504. The hole transporting layer 512 serves as a high index layer in the feedback structure stack consisting of feedback structure 504, anode 506, and layers 508, 510 and 512, and may have an optical thickness equal to $(2N+1)\lambda/4$, wherein N=0, 1, 2, or 3 and $\lambda$ is a wavelength of light emitted by the emitter layer 514. Because of the thickness required for layer 512, it may be necessary that it have a hole mobility greater than of conventional hole transport materials. The hole mobility of the hole transporting layer 512 may be greater than $5\times10$-5 cm2/volt·sec, preferably $5\times10$-4 cm2/volt·sec and most preferably $5\times10$-3 cm2/volt·sec. These high mobilities may be achieved by doping the material of the hole transporting layer 512 with an p-type dopant, for example 2,3,5,6-tetrafluoro-7,7,8,8-tetracyano-quinodimethane (See Physica Status Solidi A 210 (1), pp. 9-43).

As shown in FIG. 5, the emitter layer 514 is formed on or proximate the hole transporting layer 512, the electron transporting layer 516 is formed on or proximate the emitter layer 514, the electron transporting layer 518 is formed on or proximate the electron transporting layer 516, the electron injection layer 520 is formed on or proximate the electron transporting layer 518, the cathode 522 is formed on or proximate the electron injection layer 520 and the second feedback structure 524 is formed on or proximate the cathode 522. The electron transporting layer 516 has a "bottom" surface 532 and a "top" surface 534. The "bottom" surface 532 is an interface with the emitter layer 514 and the "top" surface 534 is an interface with the electron transporting layer 518. The cathode 522 has a "bottom" surface 536 which is an interface with the electron injection layer 520.

The second feedback structure 524 may be any structure that feeds photons back towards the emitter layer 514. In various embodiments the second feedback structure 524 is formed such that it provides high reflectivity in a desired range of wavelengths. In various embodiments described by FIG. 5, for example, the feedback structure may be, among other things, a Bragg grating or an aperiodic feedback structure. In the exemplary embodiment portrayed the lighter layers in the Bragg grating or the aperiodic feedback structure 524 represent layers with lower refractive indices and the darker layers represent layers with higher refractive indices. The layer thicknesses portrayed are for illustration only and will vary as different materials are used, and should not be taken as indicative of the optimum thickness for any particular device. It will be appreciated by one having ordinary skill in the art that any suitable feedback structure providing a desired reflectivity at a desired wavelength may be implemented in lieu of the feedback structure 524.

The emitter layer 514 is formed from any suitable material. For example, according to various embodiments, the emitter layer 514 includes 9,10-di(2-naphthyl)anthracene, poly(2,5-dioctyl-1,4-phenylenevinylene) (POPPV), or 4,4'-N,N'-dicarbazole-biphenyl (CBP) doped with tris(2-phenylpyridine)iridium (Ir(ppy)3).

The electron transporting layer 516 has a higher refractive index than the emitter layer 514 and has an optical thickness chosen such that reflections of light emitted by the emitter layer 514 from the top surface 534 and the bottom surface 532 of the electron transporting layer 516 interfere constructively. The electron transporting layer 516 therefore assists in localizing light in the emitter layer 514. The electron transporting layer 516 can, for example, have optical thickness that is equal to $(2N+1)\lambda_{emit}/4$, wherein N=0, 1, 2, or 3 and $\lambda_{emit}$ is a wavelength of light emitted by the emitter layer 514. The wavelength may not be the peak emission intensity wavelength of the emissive material, but according to various embodiments can be approximately one quarter wavelength of light reflected from the feedback structure 504. Because of the thickness required for layer 516, it may be necessary that it have an electron mobility greater than of conventional electron transporting materials. The electron mobility may be greater than $5\times10$-5 cm2/volt·sec, preferably $5\times10$-4 cm2/volt·sec and most preferably $5\times10$-3 cm2/volt·sec. These high mobilities may be achieved by doping the material of the electron transporting layer 516 with an n-type dopant, for example an n-type dopant of the types described in Physica Status Solidi A 210 (1), pp. 9-43. Specific examples of n-type dopants include cesium, bis (cyclopentadienyl)-cobalt(II) (CoCP2), or rhodocene dimer. The electron transporting layer 516 may be formed of such an n-type dopant and any suitable electron transporting material. For example, according to various embodiments, the electron transporting layer 114 may be formed from an n-type dopant in combination with 3-(4-biphenyl)-4-phenyl-5-tert-butylphenyl-1,2,4-triazole (TAZ), bathocuproine (BCP), tris(8-hydroxy-quinolinato)aluminium (Alq3), or diphenylbis(4-(pyridin-3-yl)phenyl)silane (DPPS).

The electron injection layer 520 aids in transferring electrons from the cathode 522 into the second electron transporting layer 518 or into the first electron transporting layer 516 (for embodiments where the FE-OLED device 500 does not include the second electron transporting layer 518).

The cathode 522 is a transparent cathode, is formed on or proximate the electron injection layer 520 and includes a "bottom" surface 536. For embodiments where the FE-OLED 500 does not include the electron injection layer 520, the cathode 522 is formed on or proximate the second electron transporting layer 518. For embodiments where the FE-OLED 500 does not include the electron injection layer 520 and the second electron transporting layer 518, the cathode 522 is formed on or proximate the first electron transporting layer 516. The cathode 522 may include any suitable material.

The refractive indices of the electron transporting layer 518 and the electron injection layer 520, if they are present, are lower than that of the electron transporting layer 516 and of the transparent cathode 522. The combined optical thickness of the electron transporting layer 518 and the electron injection layer 520 can be chosen such that reflections from the "bottom" surface of the electron transporting layer 518 (the "top" surface of the electron transporting layer 516) and the bottom surface 536 of the cathode 522 interfere constructively for light of the same wavelength as is fed back from the surfaces of the electron transporting layer 516. The electron transporting layer 518 and the electron injection layer 520 therefore also assists in localizing light in the emitter layer 514.

According to various embodiments, the transparent cathode 522 may be required to comprise a partially reflective metal layer adjacent the electron transporting layer 520. If that is the case, the electron transporting layer 518 and the electron injection layer 520 may have a combined optical thickness that lies between $\lambda/4$ and $(N+1)\lambda_{emit}/2$, wherein N=0, 1, 2, or 3 and $\lambda_{emit}$ is the wavelength of light fed back from the surfaces of the electron transporting layer 516. Because of the thickness required for layer 520, it may be necessary that it have an electron mobility greater than of conventional electron transporting materials The electron mobility may be greater than $5\times10$-5 cm2/volt·sec, preferably $5\times10$-4 cm2/volt·sec and most preferably $5\times10$-3 cm2/volt·sec. These high mobilities may once again be achieved by doping the material of the electron transporting layer 518 with an n-type dopant. Specific examples of n-type dopants include cesium, bis(cyclopentadienyl)-cobalt(II) (CoCP2), or rhodocene dimer.

Since both the hole transporting layers 510 and 512 function as parts of a feedback structure stack that also includes feedback structure 504, anode 506, and layer 508, and since the electron transporting layers 516 and 518 function as parts of feedback structure stack that also includes feedback structure 524, layer 520 and cathode 522, the light emitted by the emissive material in the emitter layer 514 is highly localized in the emitter layer 514 yielding maximum levels of stimulated emission.

When the FE-OLED 500 is in operation, positive charge carrying holes are injected from the anode 506 into the hole injection layer 508 and, in turn, into the hole transporting layer 510. The holes then transit the hole transporting layers 510 and 512, and enter the emitter layer 514. The holes may be blocked from exiting the emitter layer 514 by a jump downward in the energy level of the highest occupied molecular orbitals in going from the emitter layer 514 to the electron transporting layer 516 which may exhibit hole blocking properties. While the positive charge carrying holes are injected from the anode 506 into the hole injection layer 508, negative charge carrying electrons can be concurrently injected from the cathode 522 into the electron injection layer 520 and in turn into the electron transporting layer 518. The electrons then transit electron transporting layers 518 and 516 entering the emitter layer 514. Similarly, the electrons can be blocked from passing into the hole transport material by utilizing a hole transport material that exhibits electron blocking properties.

The electrons and holes then recombine in the molecules of the emissive material of the emitter layer 514. This process creates excitons that collapse to emit light in some wavelength band. Light that is emitted in the direction shown as vertically "downward" in FIG. 5 interacts with the feedback structure stack comprised of feedback structure 504, anode 506, and layers 508, 510, and 512 such that light with a wavelength that falls within the reflection band of that feedback structure stack is reflected back upward through the emitter layer. Light that is emitted in the direction shown as "upward" in FIG. 5 interacts with the feedback structure stack comprised of feedback structure 524, cathode 522, and layers 520, 518, and 516 such that light with a wavelength that falls within the reflection band of that feedback structure stack is reflected back downward through the emitter layer. In this way, light which is constrained between the two feedback structure stacks cycles vertically upward and downward in the emitter layer. This results in a higher photon density within these layers than would be the case in a conventional OLED. These feedback photons interact with newly forming excitons stimulating the formation of additional photons. The result is that nearly all the photons emitted by the FE-OLED 500 are emitted through the process of stimulated emission and nearly all the light produced is propagating in the directions shown as vertical in FIG. 5. One or both of the feedback structures 504 and 524 are configured so as to "leak out" an optimum amount of light so as to maximize the light output intensity of the FE-OLED 500.

Utilizing the charge carrier transporting layers 510, 512, 516 and 518; and the charge carrier injection layers 508 and 520 as part of feedback structures (comprising these layers and the electrodes 506 and 522 along with the feedback structures 504 and 524) reduces the thickness of the optical cavity within the device down to consisting only of the emitter layer 514. Thus light is very highly concentrated with the emitter layer 514 increasing the photon density. Also, when these layers are utilized to feed light back into the emitter layer, less light interacts with the surfaces 526 and 536 of the electrodes 506 and 522 because it is reflected from surfaces 528, 530, 532 and 534 instead. Since the materials used for electrodes 506 and 522 absorb some light as it is reflected from them, the more light that is reflected before interaction with electrodes 506 and 522, the more efficient the FE-OLED 500 will be.

Figure 6:
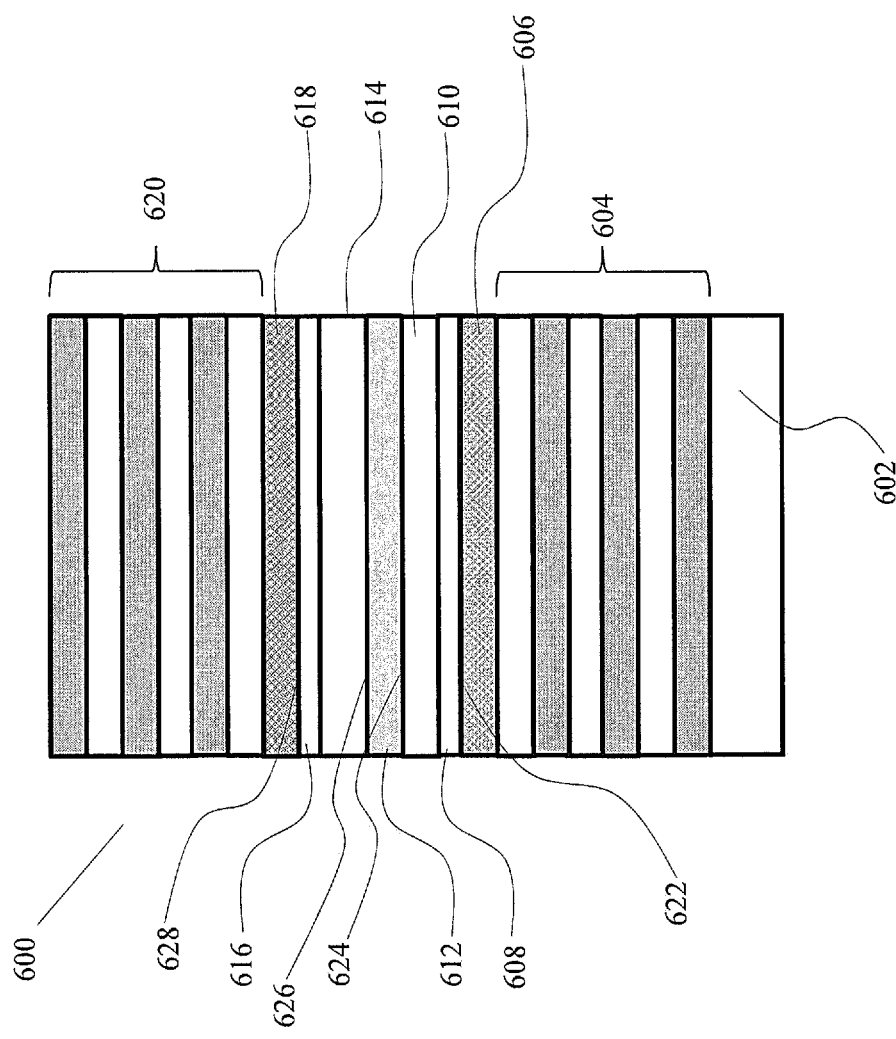
FIG. 6 illustrates various embodiments of a feedback enhanced organic light emitting diode.

FIG. 6 illustrates various embodiments of yet another feedback enhanced organic light emitting diode (FE-OLED) 600. For the embodiments shown in FIG. 6, the FE-OLED 600 includes a substrate 602, a first feedback structure 604, an anode 606, a hole injection layer 608, a hole transporting layer 610, an emitter layer 612, an electron transporting layer 614, an electron injection layer 616, a cathode 618 and a second feedback structure 620. According to other embodiments, the FE-OLED 600 does not include one or more of the hole injection layer 608 and the electron injection layer 616. In other words, according to various embodiments, these layers are optional. The FE-OLED 600 is similar to the FE-OLED 400 but is different in that it includes the transparent cathode 618 and the second feedback structure 620 in lieu of the metal cathode 418 of the FE-OLED 400.

The substrate 602 is a transparent substrate and may include any suitable material. For example, according to various embodiments the substrate 602 includes a transparent material such as, for example, glass or a transparent plastic such as polymethyl methacrylate or polycarbonate. Because the embodiments described by FIG. 6 may be configured to allow light to exit the device through the second feedback structure 620, in some embodiments substrate 602 may not be light transmitting. The first feedback structure 604 may be any structure that feeds photons back towards the emitter layer 612. In various embodiments the feedback structure 604 is formed such that it provides high reflectivity in a desired range of wavelengths. In various embodiments described by FIG. 6, for example, the feedback structure may be, among other things, a Bragg grating or an aperiodic feedback structure. The Bragg grating or the aperiodic feedback structure 604 is formed on or proximate the substrate 602. In the exemplary embodiment portrayed the lighter layers in the Bragg grating or the aperiodic feedback structure 604 represent layers with lower refractive indices and the darker layers represent layers with higher refractive indices. The layer thicknesses portrayed are for illustration only and will vary as different materials are used, and should not be taken as indicative of the optimum thickness for any particular device. It will be appreciated by one having ordinary skill in the art that any suitable feedback structure providing a desired reflectivity at a desired wavelength may be implemented in lieu of the feedback structure 604.

The anode 606 may, in various embodiments, also serve as a high refractive index layer in the feedback structure stack consisting of the anode 606 and the feedback structure 604; in other words, the anode serves as a functional layer of the proximately formed feedback structure. In order to fill this role the anode 606 may, for example, have a thickness equal to $(2N+1)\lambda_{emit}/4$, wherein N=0, 1, 2, or 3 and $\lambda_{emit}$ is a wavelength of light emitted by the emitter layer 612, and also have a refractive index higher than that of the adjacent layers 608 and 610 and the adjacent material in feedback structure 604. The anode 606 has a "top" surface 622 which is an interface with the hole injection layer 608. For embodiments where the FE-OLED 600 does not include the hole injection layer 608, the "top" surface 622 is an interface with the hole transporting layer 610.

As shown in FIG. 6, according to various embodiments, the hole injection layer 608 is formed on or proximate the anode 606. For such embodiments, the hole injection layer 608 may include any suitable material. For example, according to various embodiments, the hole injection layer 608 includes poly(3,4-ethylenedioxythiophene) polystyrene sulfonate (PEDOT:PSS), copper phthalocyanine, or 2,3,8,9,14,15-hexafluorodiquinoxalino[2,3-a:2',3'-c]phenazine (HATNA-F6). According to other embodiments, the FE-OLED 600 does not include the hole injection layer 608. For embodiments where the FE-OLED 600 includes the hole injection layer 608, the hole transporting layer 610 is formed on or proximate the hole injection layer 608. For embodiments where the FE-OLED 600 does not include the hole injection layer 608, the hole transporting layer 610 is formed on or proximate the anode 606.

As shown in FIG. 6, the emitter layer 612 is formed on or proximate the hole transporting layer 610, the electron transporting layer 614 is formed on or proximate the emitter layer 612, the electron injection layer 616 is formed on or proximate the electron transporting layer 614, the cathode 618 is formed on or proximate the electron injection layer 616 and the second feedback structure 620 is formed on or proximate the cathode 618. The electron transporting layer 614 has a "bottom" surface 626 and the emitter layer 612 has a surface 624. The "bottom" surface 626 is an interface with the emitter layer 612 and the surface 624 is an interface with the hole transporting layer 610. The cathode 618 has a "bottom" surface 628 which is an interface with the electron injection layer 616.

The second feedback structure 620 may be any structure that feeds photons back towards the emitter layer 612. In various embodiments the second feedback structure 620 is formed such that it provides high reflectivity in a desired range of wavelengths. In various embodiments described by FIG. 6, for example, the feedback structure may be, among other things, a Bragg grating or an aperiodic feedback structure. In the exemplary embodiment portrayed the lighter layers in the Bragg grating or the aperiodic feedback structure 620 represent layers with lower refractive indices and the darker layers represent layers with higher refractive indices. The layer thicknesses portrayed are for illustration only and will vary as different materials are used, and should not be taken as indicative of the optimum thickness for any particular device. It will be appreciated by one having ordinary skill in the art that any suitable feedback structure providing a desired reflectivity at a desired wavelength may be implemented in lieu of the feedback structure 620.

According to various embodiments, the combined thicknesses of the hole injection layer 608 and the hole transporting layer 610 can be adjusted such that light rays reflected from the surface 622 and the surface 624 are in phase with each other and in phase (the light rays interfere constructively) with light reflected from feedback structure 604. The feedback structure 604, the anode 606 thickness and the combined thicknesses of the hole injection layer 608 and the hole transporting layer 610 can all be designed such that the light fed back into the emitter layer 612 is at a wavelength emitted by the light emitting material in that layer. The hole injection layer 608 and the hole transporting layer 610 can cooperate to serve as a low index layer in the feedback structure stack that also includes the anode 606 and the feedback structure 604 and can have an optical thickness equal to $(2N+1)\lambda_{emit}/4$, wherein N=0, 1, 2, or 3 and $\lambda_{emit}$ is a wavelength of light emitted by the emitter layer 612. Because of the thickness required for layer 612, it may be necessary that it have a hole mobility greater than of conventional electron transporting materials. The hole mobilities of the hole injection layer 608 and the hole transporting layer 610 may be greater than 5×10-5 cm2/volt·sec, preferably 5×10-4 cm2/volt·sec and most preferably 5×10-3 cm2/volt·sec. These high mobilities may be achieved by doping the material of the hole transporting layer 610 with an p-type dopant, for example 2,3,5,6-tetrafluoro-7,7,8,8-tetracyano-quinodimethane (See Physica Status Solidi A 210 (1), pp. 9-43). The hole transporting layer 510 may be formed from a p-type dopant and any suitable hole transporting material. For example, according to various embodiments, the hole transporting layer 510 may be formed from an p-type dopant in combination with N,N,N',N'-tetra-(3-methylphenyl)-3,3'-dimethylbenzidine (HMTPD), Di-[4-(N,N-di-p-tolyl-amino)-phenyl]cyclohexane, (TAPC), or 4,4'-Bis(carbazol-9-yl)biphenyl (CBP).

For the embodiments shown in FIG. 6, the emitter layer 612 has a higher refractive index than the hole transporting layer 610 which results in the reflectivity of the surface 624. The electron injection layer 616 aids in transferring electrons from the transparent cathode 418 into the electron transporting layer 614.

The refractive indices of the electron transporting layer 614 and the electron injection layer 616 (if it is present), are lower than that of the emitter layer 612. The combined optical thickness of the electron transporting layer 614 and the electron injection layer 616 can be chosen such that reflections from the "bottom" surface 626 of the electron transporting layer 614 (the "top" surface of the emitter layer 612) and the "bottom" surface 628 of the cathode 618 interfere constructively. According to various embodiments, the transparent cathode 618 may be required to comprise a partially reflective metal layer adjacent the electron injection layer 616. If that is the case, the electron transporting layer 614 and the electron injection layer 616 may have a combined optical thickness that lies between $\lambda/4$ and $(N+1)\lambda_{emit}/2$, wherein N=0, 1, 2, or 3 and $\lambda_{emit}$ is a wavelength of light emitted by the emitter layer 612. The wavelength may not be the peak emission intensity wavelength of the emissive material, but can be chosen to match the wavelength of light reflected from the feedback structure 604. Because of the thickness required for layer 614, it may be necessary that it have an electron mobility greater than of conventional electron transporting materials. The electron mobility may be greater than 5×10-5 cm2/volt·sec, preferably 5×10-4 cm2/volt·sec and most preferably 5×10-3 cm2/volt·sec. These high mobilities may once again be achieved by doping the material of the electron transporting layer 614 with an n-type dopant. Specific examples of n-type dopants include cesium, bis(cyclopentadienyl)-cobalt(II) (CoCP2), or rhodocene dimer.

Since the hole transporting layer 610 functions as part of a feedback structure stack that also includes feedback structure 604, anode 606, and layer 608; and the electron transporting layer 614 functions as part of a feedback structure stack that also includes feedback structure 620, cathode 618, and layer 614 the light emitted by the emissive material in the emitter layer 612 is highly localized in the emitter layer 612 yielding maximum levels of stimulated emission.

In view of the above, it will be appreciated that when the hole transporting layer(s) and/or the electron transport layer(s) of the above-described FE-OLEDs are made thick enough, they can act as functional layers in the feedback structures that enable stimulated light emission in the FE-OLEDs. This greater thickness is achievable by doping the charge transporting layers with electrical dopants that increase their charge carrier mobilities.

In some embodiments of FE-OLEDs it may be advantageous to add extra layers such as additional charge carrier transporting, charge carrier injection, charge carrier blocking, and exciton blocking layers. These layers may be added so long as the optical function of the charge carrier transporting layers as elements of the feedback structure stacks is not eliminated. Additionally, efficiency can be increased by utilizing a band-edge type FE-OLED devices as disclosed in U.S. Patent Application 62/183,771 in lieu of the various FE-OLED embodiments disclosed in FIGS. 2-6.

For each of the embodiments described hereinabove with respect to FIGS. 2-6, the emitter layer, or in other embodiments a band-edge FE-OLED, may provide an output in a selected range of wavelengths which corresponds to the reflectivity bands of the various described feedback structure stacks. This selected range of wavelengths may also include a small range of wavelengths surrounding a wavelength corresponding to any wavelength which is efficiently emitted in the emitter material of the emitter layer by means of stimulated emission. However, in order to provide a multi-color output in an active matrix type display, according to various embodiments, the feedback enhanced organic light emitting diodes (FE-OLEDs) described herein above may be used in conjunction with photoluminescent structures having light emission in desired wavelength bands corresponding to the desired color outputs. Preferably, the wavelength of light emitted by the emitter layer and reflected by the feedback structures is optimized to efficiently induce photoluminescence in photoluminescent materials comprising the photoluminescent structures used to form the pixels and sub-pixels of an active matrix display.

A photoluminescent material is a material that emits light after photoexcitation, i.e. absorption of photons. Following excitation, various relaxation processes occur in which new photons are radiated from the photoluminescent material, a process which depending on the material selected can occur within a few femtoseconds or can take up to hours. Photoluminescent materials can also be selected based a preferred absorption spectrum or based on a preferred emission spectrum, or based on some combination of these considerations.

Figure 7:
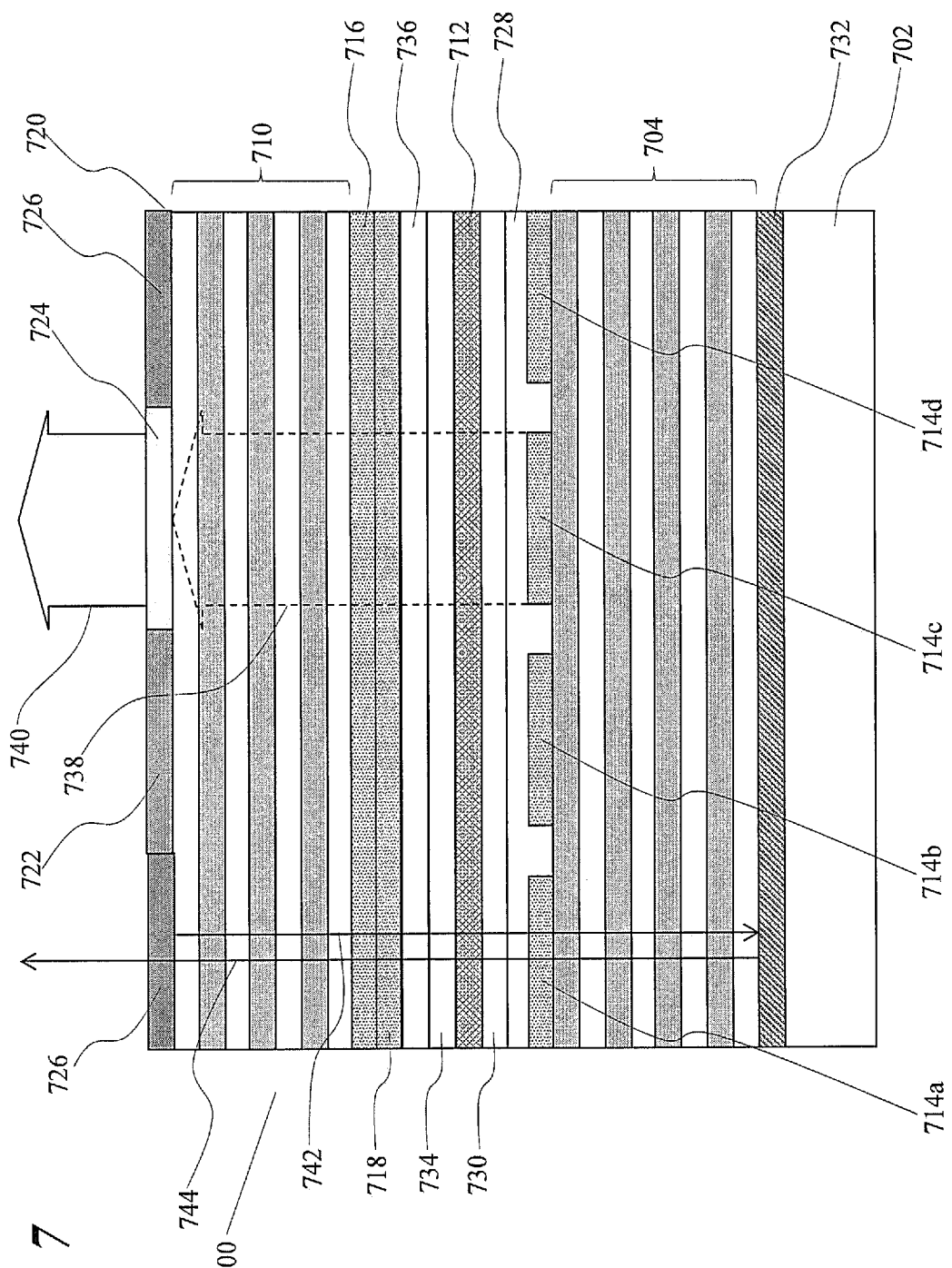
FIG. 7 illustrates various embodiments of an active matrix feedback enhanced organic light emitting diode.

FIG. 7 illustrates one of various embodiments of an active matrix feedback enhanced organic light emitting diode (AM FE-OLED) 200. For the embodiments shown in FIG. 7, the AM FE-OLED 700 includes a substrate 702, a first feedback structure 704 comprising alternating high refractive index sub-layers and low refractive index sub-layers, a second feedback structure 710, an emitter layer 712, anodes 714a, 714b, 714c, 714d, a first cathode layer 716, a second cathode layer 718, a photoluminescent layer 720 comprising photoluminescent structures 722, 724, and 726, a hole injection layer 728, a hole transport layer 730, a reflector 732, an electron injection layer 734, and an electron transport layer 736. According to other embodiments, the AM FE-OLED 700 does not include the hole injection layer 728, the hole transport layer 730, the reflector 732, the electron injection layer 734, and/or the electron transport layer 736. In other words, according to various embodiments, one or more of the layers 728, 730, 732, 734, and 736 are optional.

The substrate 702 is a may include any suitable material. For example, according to various embodiments the substrate 702 includes a transparent material such as, for example, glass or a transparent plastic such as polymethyl methacrylate or polycarbonate, according to other embodiments the substrate may be opaque to visible light. According to various embodiments the first feedback structure 704 is formed parallel to the substrate 702. For illustration purposes, FIG. 7 depicts the first feedback structure 704 having darker layers representing high refractive index sub-layers and lighter layers representing low refractive index sub-layers. According to the embodiments described in FIG. 7, the sub-layers may have a thickness equal to:

$$d_i = \lambda_i/4, \text{ where}$$

$d_i$=the thickness of layer i,
$\lambda_i$=the wavelength of light to be fed back into the emitter layer;

According to various other embodiments, as is described in the '921 patent and the '995 publication, the first feedback structure 704 may also be aperiodic with some of the sub-layers having thicknesses equal to:

$$d_i = (2N+1)\kappa_i/4, \text{ where}$$

$d_i$=the thickness of layer i,
$\lambda_i$=the wavelength of light to be fed back into the emitter layer,
N=an integer.

The second feedback structure 710 is similar in structure to the first feedback structure 704, and like the first feedback structure 704 may be any suitable feedback structure irrespective of the characteristics of the first feedback structure 704. The second feedback structure 710 is formed opposite to the first feedback structure 704 with respect to the emitter layer 712, and is made to be partially transmissive to light having the wavelength $\lambda_i$.

The emitter layer 712 comprises an organic electroluminescent material that emits light in a spectral band that contains the desired wavelength to cause photoexcitation within the photoluminescent structures 722, 724, and 726. According to the various embodiments shown in FIG. 7, the emitter layer 712 is arranged parallel to the substrate 702 and between the anodes 714 and the first cathode layer 716. In various embodiments, for example, the emitter layer 712 emits light having a wavelength of 420 nm that is short enough to stimulate emission from a blue photoluminescent material, for example, in the embodiments described by FIG. 7, the photoluminescent structure 726.

The anodes 714 are patterned in a layer opposite the emitter layer 712 with respect to the first cathode layers 716; and the second cathode layers 718 are formed opposite the anodes 714 with respect to the first cathodes 716. According to the embodiments described in FIG. 7, the anodes 714 and first cathode layers 716 and second cathode layers 718 are further arranged such that by energizing an individual anode, for example anode 214a, emission is stimulated in the region of emitter layer 712 that is approximately delineated by the intersection of a projection of the surface of anode 714a and a projection of the surface of the first cathode layer 716, and second cathode layer 718, onto a parallel surface of the emitter layer 712. Each anode in the layer of anodes 714 and each segmented cathode composed of segments (extending into the page of FIG. 7) of cathode layers 714 and 716 is individually addressable, such that by selectively energizing selected anodes and cathodes a region of the emitter layer 712 between the selected anode and selected cathode (e.g. the area bounded by the intersection of a projection of the surface of anode 714a and a projection of the surface of the first cathode layer 716, and second cathode layer 718, onto a parallel surface of the emitter layer 712) is excited and therefore emits light in that region in a predominantly collimated fashion in a direction predominantly normal to the emitter layer surface. The first cathode layers 716 and second cathode layers 718 in FIG. 7 are depicted from the side, and represent a cathode structure, a series of these cathode structures comprising first cathode layers 716 and second cathode layers 718 may be patterned extending back from the plane of FIG. 7 and arranged perpendicularly with respect to the anode layer 714 such that a normal vector to the plane of the anodes 714 and a normal vector to the plane of the first cathodes 716 are parallel to each other.

The anodes 714 and the first cathode layers 716 and second cathode layers 718 are transparent. The anode material may be formed proximate to the feedback structure 704 and serve as a functional layer of the feedback structure 704. Also according to various embodiments the first cathode layers 716 may be formed from a transparent conductive oxide such as indium-tin oxide (ITO), and the second cathode layers 718 may be formed from a very thin transparent layer of low work function metal such as aluminium or samarium/silver alloy. According to other embodiments, carbon nanotubes may be utilized as a transparent cathode structure. Additionally, according to various other embodiments, as taught in the first cathode layers 716 and second cathode layers 718 may also serve as functional layers of the second feedback structure 710.

In the embodiments depicted in FIG. 7, a photoluminescent layer 720 is comprised of photoluminescent blue, red, and green sub-pixels comprised of, for example, photoluminescent structures 722, 724, and 726 respectively comprising a red photoluminescent sub-pixel formed from 722, a green photoluminescent sub-pixel formed from 724, and a blue photoluminescent sub-pixel formed from 726. Furthermore, in the various embodiments described by FIG. 7, each photoluminescent structure 722, 724, and 726 is depicted from its side, and represents a series of photoluminescent structures extending back away from the plane of the figure, each constituting a colored sub-pixel, which according to other embodiments may also vary in the luminescent wavelength from one photoluminescent structure to the next extending back away from the plane of FIG. 7.

The photoluminescent material comprising the photoluminescent structures 722, 724, and 726 are selected such that they are each efficiently excited into photoluminescence by the light radiation emitted by the emitter layer 712. According to various other embodiments, as will be appreciated by one of skill in the art, the photoluminescent layer may be comprised of any suitable combination of colors of visible and/or non-visible light photoluminescent structures. Also, according to various embodiments, the FE-OLED-based device 700 may be integrated with an active matrix switching element (not depicted) to produce an AM FE-OLED whereby each photoluminescent structure 722, 724, and 726 is registered to a corresponding combination of anodes 714 and cathode structures. By energizing a particular combination of anode 714 and cathode structures comprising first 716 and, if present, second 718 cathode layers, a region of the emitter corresponding to the appropriate photoluminescent structure 722, 724, or 726 emits visible light 738. These particular combinations of anodes 714 and cathode structures are electrically connected to integrated active matrix switching elements such that each photoluminescent structure is thereby associated with an integrated active matrix switching element. As will be appreciated by one skilled in the art, accordingly, the AM FE-OLED will emit a desired color, or combination of colors of light, depending on which combination of anodes 714 and cathode structures comprising first 716 and, if present, second 718 cathode layers are energized by a combination of active matrix switching elements, not shown.

The design of active matrix switching elements for OLEDs is well-known and any number of switching element configurations may also be used with FE-OLEDS. When in operation, as for example in one of various embodiments of a display, the device is energized by applying an electric potential difference between some number of anodes 714 and some number of cathode structures comprising first cathode layers 716 and, if present, second cathode structures 718. This applied electric potential induces electrical charge carrying holes to be injected into the device 700 from anodes 714 and electrons to be injected into the FE-OLED 700 from the first cathode layers 716 through second cathode layers 718. The injected holes and electrons re-combine in the emitter layer 712 to yield excitons that collapse to emit visible light 738. Visible light 738 which is travelling normal to the plane of the emitter layer 712 is re-directed back through the emitter layer 712 by the first feedback structure 704 and the second feedback structure 710. Each time this light passes back through the emitter later 712 it encounters more excitons and initiates stimulated emission through the collapse of these excitons. As a result, a substantial amount, if not essentially all, light emission in the AM FE-OLED becomes stimulated emission and is emitted in a narrow cone of angles around the normal to the plane of layer 712. This vertically emitted light encounters the appropriate photoluminescent structure (722, 724, or 726) causing the desired color of photoluminescent light to be emitted.

While the various embodiments of this invention operate through stimulated emission it will be appreciated that in many applications it is preferred that the photon density within the various embodiments of the AMFE-OLED is limited in order to prevent the device from forming a laser so as to avoid issues such as speckle. It will further be appreciated that the first feedback structure 704 and the second feedback structure 710 will be designed such that the of the light emitted from the emission layer 712 will predominantly comprise wavelengths in a narrow energy band centered on $\lambda_i$.

In one example of the various embodiments described in FIG. 7, when visible light 738 is emitted from the emitter layer 712 from the area between anode 714c and first cathode 716, for example, it will either be re-directed back into the emitter layer 712 by the first reflector layer 204 or the second reflector layer 710, or the visible light 738 will pass through the partially transmissive second feedback structure 710 and impinge on the surface of photoluminescent sub-pixel 224. As described above, the first feedback structure 704 and the second feedback structure 710 are designed such that wavelength $\lambda_i$ strongly excites luminescence in the materials of photoluminescent structures 722, 724 and 726. The result of this example then is that green light 740 is emitted from photoluminescent structure 724. Thus, as will be appreciated, the FE-OLED-based device 700, in various embodiments, may be used in combination with an array of active matrix switching elements such that the photoluminescent structures 722, 724, and 726 may be used as sub-pixels of a single pixel within a full-color display, where each sub-pixel is electrically addressable by applying electric potentials across the appropriate anodes 714 and first cathodes 716 and second cathodes 718. While FIG. 7 describes various embodiments of an AM FE-OLED 700 that have three colors of sub-pixels, which may be used in an RGB full-color display; the AM FE-OLED may also be configured with other photoluminescent structures emitting light in any suitable color. For example, a four color sub-pixel architecture may be formed having emitting light centered on 440 nm, 490 nm, 520 nm, and 650 nm. In other various embodiments, it will be appreciated that $\lambda_t$ and the photoluminescent structures may be chosen to emit in non-visible wavelengths or any wavelength for which suitable photoluminescent material is available.

It must be appreciated that the near collimated emission of light by the electrically addressed pixels in the FE-OLED structure is critical to the proper functioning of a display of this type. If the light was not collimated as for instance is the case with conventional OLEDs, light from a particular pixel would illuminate multiple photoluminescent structures of varying colors making it impossible to display a color image.

Light emitting from the photoluminescent structures 722, 724, and 726 may also propagate back through the AMFE-OLED 700, for example as depicted in FIG. 7 by ray 742. For this reason, in various embodiments it may be advantageous to incorporate a reflector layer 732 to reflect light back out the through the photo-luminescent sub-pixels 722, 724, and 726 and thus out of the AMFE-OLED 700 and thereby out of the front surface of the display.

Figure 8:
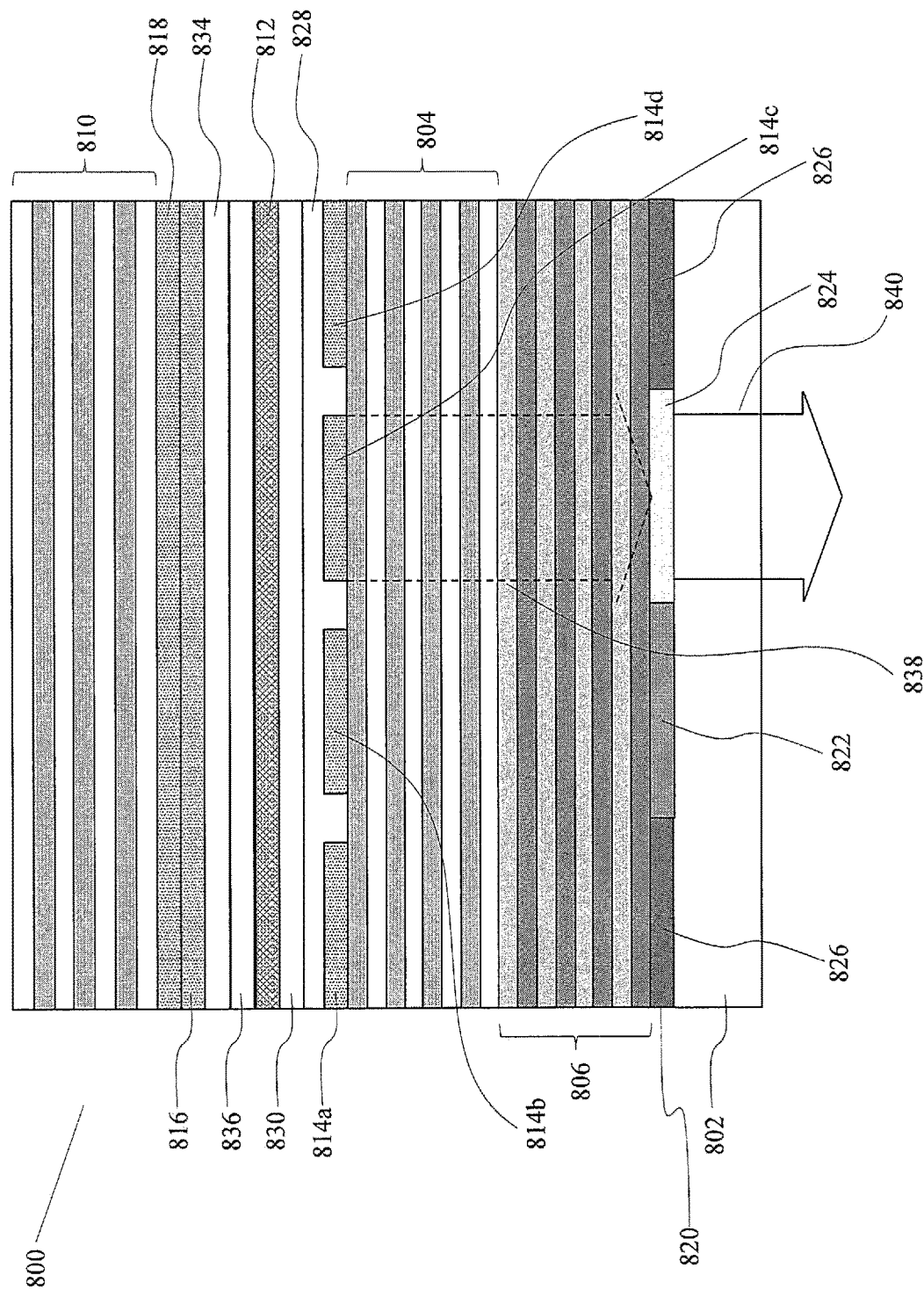
FIG. 8 illustrates various embodiments of another active matrix feedback enhanced organic light emitting diode.

As will be appreciated, the disclosed invention is not limited to the precise ordering of FE-OLED layers as in the embodiments described by FIG. 7. For example, FIG. 8 illustrates another of various embodiments of an active matrix feedback enhanced organic light emitting diode (AM FE-OLED) 800. In the embodiments described by FIG. 8, the AM FE-OLED is a bottom emitting devices in which the resulting light output, e.g. green light 840, is emitted through the substrate 802, as opposed to the top emitting devices disclosed by FIG. 7. For the embodiments shown in FIG. 8, the AM FE-OLED 800 includes a substrate 802, emitter layer 812, anodes 814a, 814b, 814c, 814d, first cathode layer 816, second cathode layer 818, photoluminescent layer 820 comprising red, green and blue photoluminescent structures 822, 824, 826, hole injection layer 828, hole transport layer 830, electron injection layer 834, and electron transport layer 836; and, these layers and structures serve essentially the same purpose and operate in the same manner as in those embodiments described in FIG. 7. It will be appreciated that the color, or wavelength, of light emitted the photoluminescent structures 822, 824, 826 may be any desired color or wavelength, and the colors shown in the embodiments described by FIG. 8 are set forth here to serve as an example.

In the various embodiments described in FIG. 8, AMFE-OLED 800 further includes a selectively or partially transmissive first feedback structure 804, second feedback structure 810 that is highly reflective of light emitted from the emitter layer 812, and a reflective structure 806 (for instance, a distributed Bragg reflector). Reflective structure 806 is substantially transparent to the wavelengths emitted from emitter layer 812, but is also substantially reflective of light emitted from photoluminescent structures 822, 824, 826. In this way, reflective structure 806 serves to direct essentially all of the light produced by the photoluminescent structures 822, 824, 826 through the substrate 802, i.e. out of the bottom of the device.

It will be further appreciated that viewing the embodiments disclosed in FIG. 8 in comparison with those embodiments described in FIG. 7, reflective structure 806 serves a comparable function to the reflector 732, i.e. directing the light emitted by the photoluminescent structures out of the device. The decision as to whether to use either a reflector situated at the distal end of the device opposite the photoluminescent layer or a partially transmissive reflective structure situated proximate to the photoluminescent layer is left to the designer of a particular application based on the requirements and needs of the designer.

Figure 9:
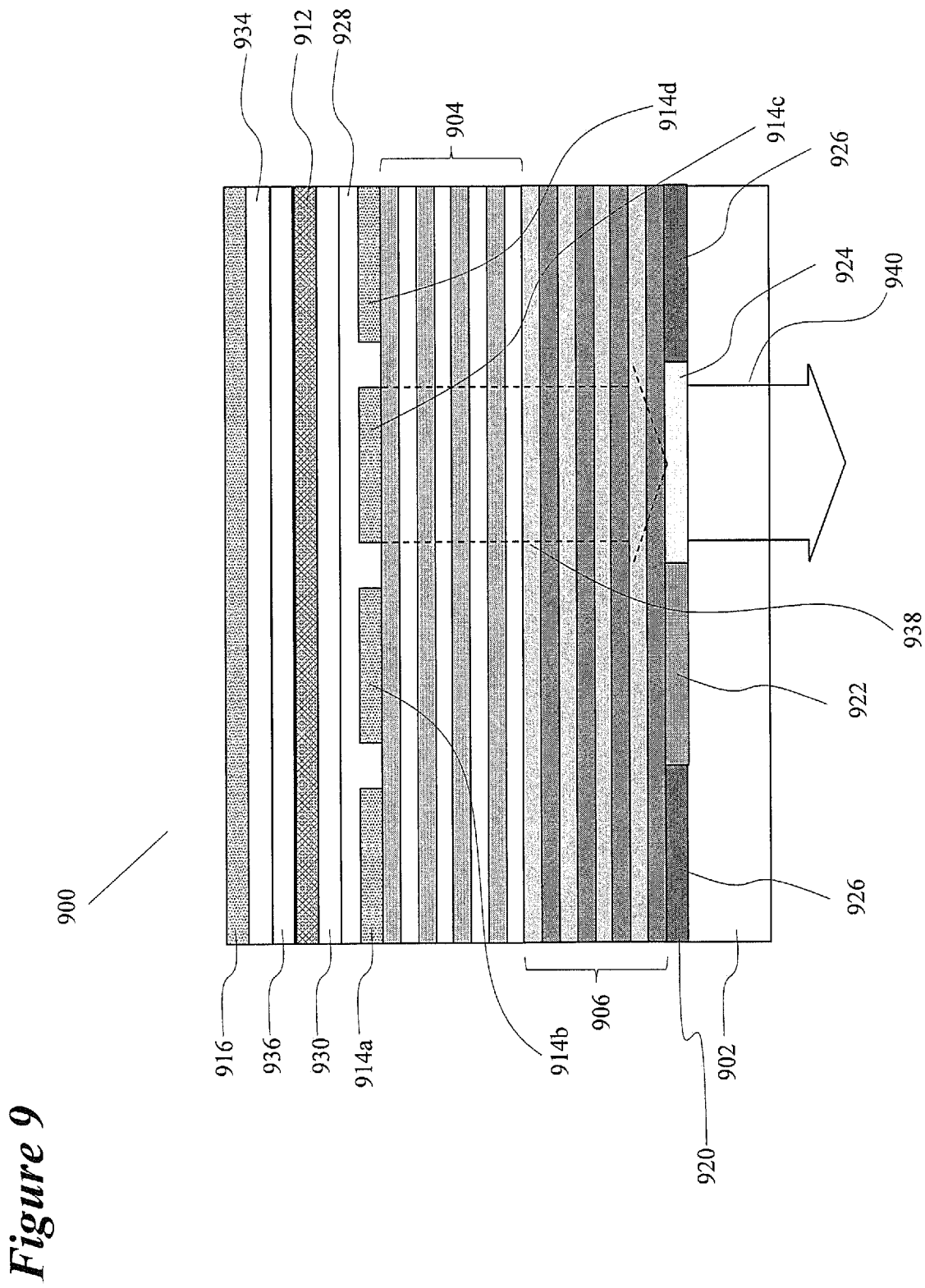
FIG. 9 illustrates various embodiments of another active matrix feedback enhanced organic light emitting diode.

FIG. 9 describes additional embodiments of an AM FE-OLED 900. For the embodiments shown in FIG. 9, the AM FE-OLED 900 includes a substrate 902, emitter layer 912, anodes 914a, 914b, 914c, 914d, a cathode layer 916, photoluminescent layer 920 comprising red, green and blue photoluminescent structures 922, 924, 926, hole injection layer 928, hole transport layer 930, electron injection layer 934, and electron transport layer 936; and, these layers and structures serve essentially the same purpose and operate in the same manner as in those embodiments described in FIG. 8. It will be appreciated that the color, or wavelength, of light emitted the photoluminescent structures 922, 924, 926 may be any desired color or wavelength, and the colors shown in the embodiments described by FIG. 9 are set forth here to serve as an example. AM FE-OLED 900 is similar to device 800 except that feedback structure 810 is replaced in AM FE-OLED 900 with a reflective metal cathode 916 which also serves as a feedback structure.

Figure 10:
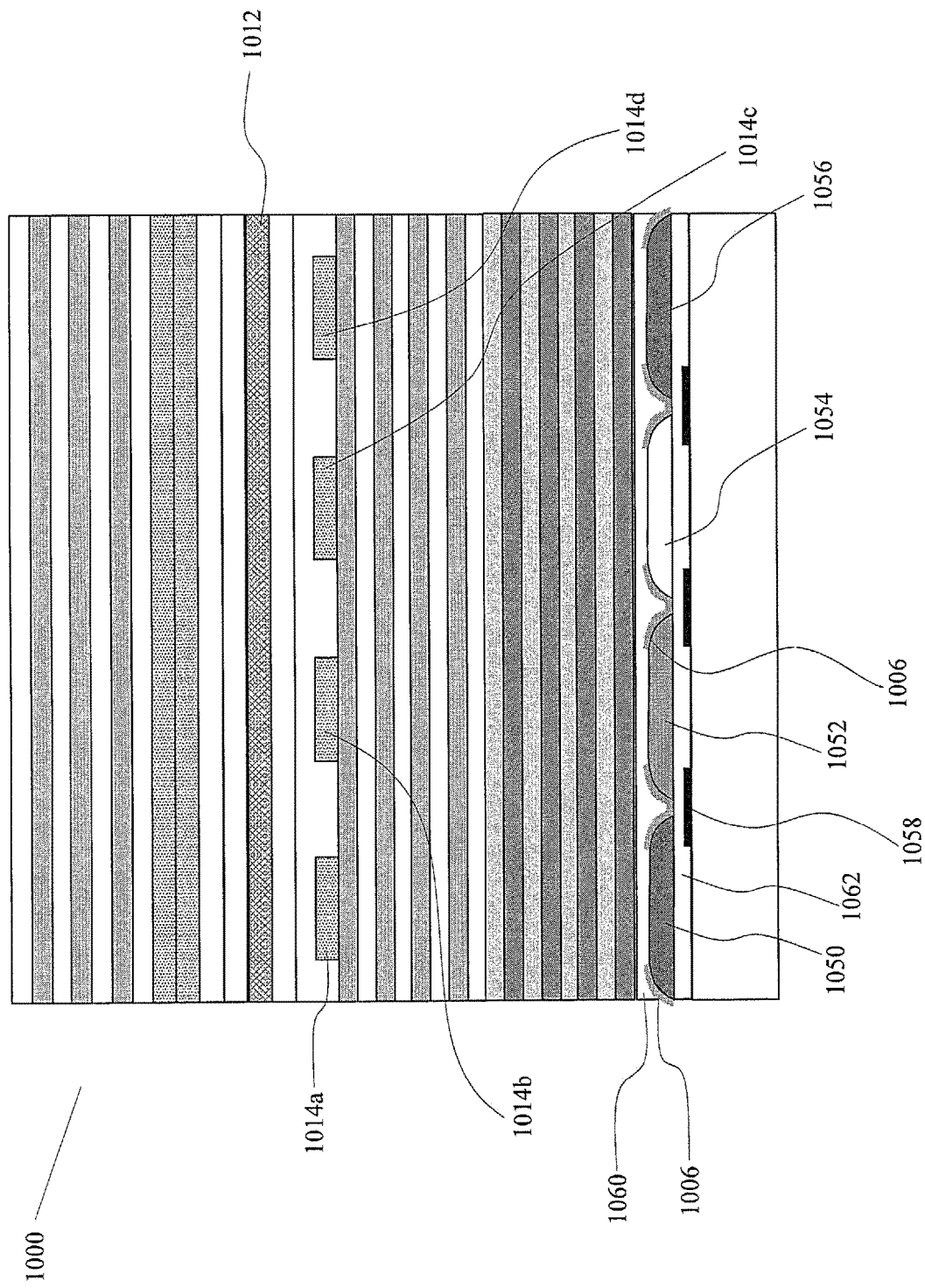
FIG. 10 illustrates various embodiments of another active matrix feedback enhanced organic light emitting diode; and, FIG. 11 illustrates various embodiments of another active matrix feedback enhanced organic light emitting diode.

An issue with the devices described so far is the potential for light to be generated by photoluminescence parallel to the plane of photoluminescent layer 902. Such light is likely to be constrained within the photoluminescent structures until it is absorbed, and therefore the light is unable to escape the AM FE-OLED, for example AM FE-OLED 900, thereby lowering the energy efficiency of the device, for example AM FE-OLED 900. FIG. 10 depicts an AM FE-OLED 1000 which contains variations to minimize this cause of inefficiency.

FIG. 10 describes various embodiments of an AM FE-OLED 1000. AM FE-OLED 1000 contains structures 1014a, 1014b, 1014c, and 1014d that are patterned anode segment performing the same function as 714a, 714b, 714c, 714d in device 700. In the embodiments described in FIG. 10, structures 1050, 1052, 1054, 1056 are photoluminescent structures each comprising a photoluminescent material which luminesces in a desired wavelength. These photoluminescent structures 1050, 1052, 1054, 1056 are not in contact with each other as in previous examples. By setting photoluminescent structures 1050, 1052, 1054, 1056 apart so they do not touch, the light emitted in the plane of any one of photoluminescent structures 1050, 1052, 1054, 1056 is prevented from propagating across multiple structures and thereby being absorbed. The photoluminescent structures 1050, 1052, 1054, 1056 have rounded edges when a cross section of the AMFE-OLED 1000 is viewed from the side, as in FIG. 10, rather than squared off edges as in, for example the embodiments described by FIG. 8. Additionally, the edges of each photoluminescent structure 1050, 1052, 1054, 1056 may be coated with a layer of reflective metal 1006. This causes light emitted in the plane of structures 1050, 1052, 1054, 1056 to be reflected at an angle that allows the light to emit through the surface of the structures 1050, 1052, 1054, 1056 and out of the device 1000. This layer of reflective metal 1006 coating the edges of the photoluminescent structures 1050, 1052, 1054, 1056 may be visible to one viewing a resulting display, and may cause glare under high ambient illumination. To reduce or remove the resulting glare and to hide the reflective metal coating 1006 the structures 1050, 1052, 1054, 1056 may be outlined with an opaque coating such as, but not limited to, a black coating 1058. In order to properly form the device 1000, planarizing layers 1060 and 1062 are added. These planarizing layers 1060 and 1062 can be formed from any suitable materials, for example one capable of forming a planar surface atop the rounded photoluminescent structures 1050, 1052, 1054, 1056, and preferably from a material that is transparent to the wavelengths of light emitted by the emitter layer 1012 or the light emitted from the photoluminescent materials comprising structures 1050, 1052, 1054, 1056. Additionally, layers 1060 and 1062 need not be formed of the same material.

Figure 11:
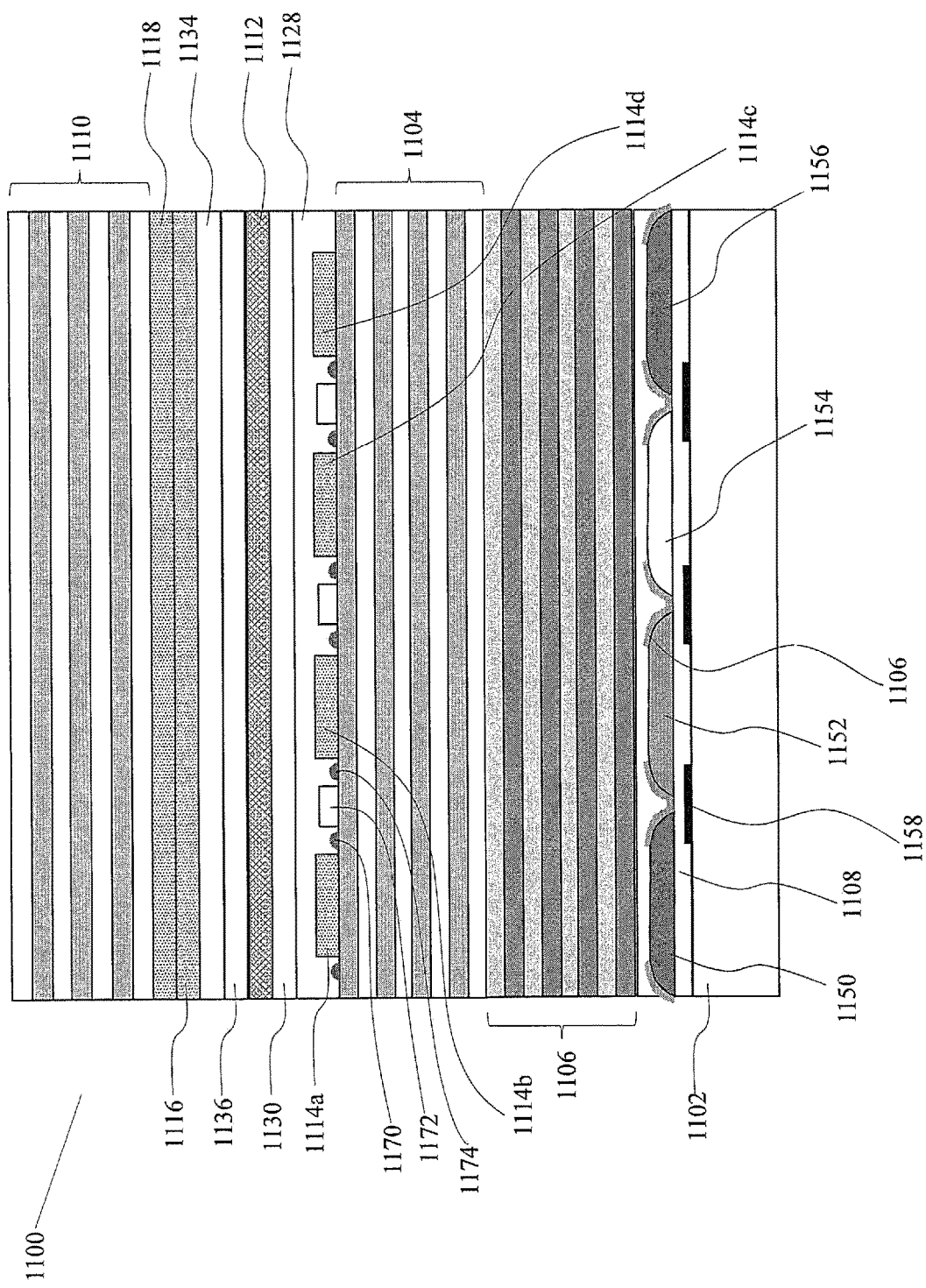

For simplicity's sake the embodiments of AM FE-OLEDs described in FIGS. 7-10 have omitted any means of electronically addressing the individual pixels and sub-pixels comprising the various photoluminescent structures, for example 722, 824, 926, 1050, and 1152. FIG. 11 describes various additional embodiments of an AM FE-OLED 1100. The embodiments described by FIG. 11 demonstrate how active matrix circuitry may be located in an AM FE-OLED generally. It will be appreciated that the embodiments described above by FIGS. 7-10 may be modified to include the enhancements shown in the embodiments described by FIG. 11.

In the embodiments shown in FIG. 11, the AMFE-OLED 1100 includes a substrate 1102, emitter layer 1112, anodes 1114*a*, 1114*b*, 1114*c*, 114*d*, first cathode layer 1116, second cathode layer 1118, photoluminescent structures 1150, 1152, 1154, 1156, hole injection layer 1128, hole transport layer 1130, electron injection layer 1134, and electron transport layer 1136. The layers and structures identified in AM FE-OLED 1100 as described in FIG. 11 serve a similar purpose and operate in a similar manner as in those embodiments described by FIGS. 7-10. It will be appreciated that the color, or wavelength, of light emitted the photoluminescent structures 1150, 1152, 1154, 1156 may be any desired color or wavelength. It will also be appreciated that the photoluminescent structures 1150, 1152, 1154, 1156 in the embodiments described in FIG. 11 are similar to the photoluminescent structures 722, 724, 726 in the embodiments described in FIG. 7 and necessarily differ only in their cross-sectional shape.

In the various embodiments described in FIG. 11, AM FE-OLED 1100 further includes a selectively or partially transmissive first feedback structure 1104, second feedback structure 1110 that is highly reflective of light emitted from the emitter layer 1112, and a reflective structure 1106. Reflective structure 1106 is substantially transparent to the wavelengths emitted from emitter layer 1112 but is also substantially reflective of light emitted from photoluminescent structures 1150, 1152, 1154, 1156. In this way, reflective structure 1106 serves to direct essentially all of the light produced by the photoluminescent structures 1150, 1152, 1154, 1156 through the substrate 1102, i.e. out of the bottom of the device.

It will be further appreciated that viewing the embodiments disclosed in FIG. 11 in comparison with those embodiments described in FIG. 7, third feedback structure 1106 serves a comparable function to the reflector 732, i.e. directing the light emitted by the photoluminescent structures out of the device. The decision as to whether to use either a reflector situated at the distal end of the device opposite the photoluminescent layer, or to use a partially transmissive feedback structure situated proximate to the photoluminescent layer is left to the designer of a particular application based on the requirements and needs of the designer.

The embodiments described in FIG. 11 include three active matrix components: signal lines 1170, sub-pixel control circuits 1172, and voltage supply lines 1174. The sub-pixel control circuits 1172 may comprise multiple thin film transistors and capacitors. As will be appreciated, active matrix components and methods of implementing sub-pixel control circuits, voltage supply lines and signal lines are well known in the art.

FE-OLED, also known as defect-mode devices, exploit the phenomenon of stimulated emission by creating a high photon density within a cavity, or defect, between two feedback means, where the cavity contains an emissive material, for example the emitter of an OLED. The feedback means may be two photonic crystals, wherein the stop-bands are tailored to reflect light emitted by the emissive material back towards the emissive material. Alternatively, the feedback means may be a single photonic crystal opposite a metallic reflector or mirror, or, the feedback means be two holographically recorded materials gratings. As described above, FE-OLEDs provide many improvements over traditional light emitting devices used in displays; however FE-OLEDs suffer for being difficult to mass produce.

Figure 12:
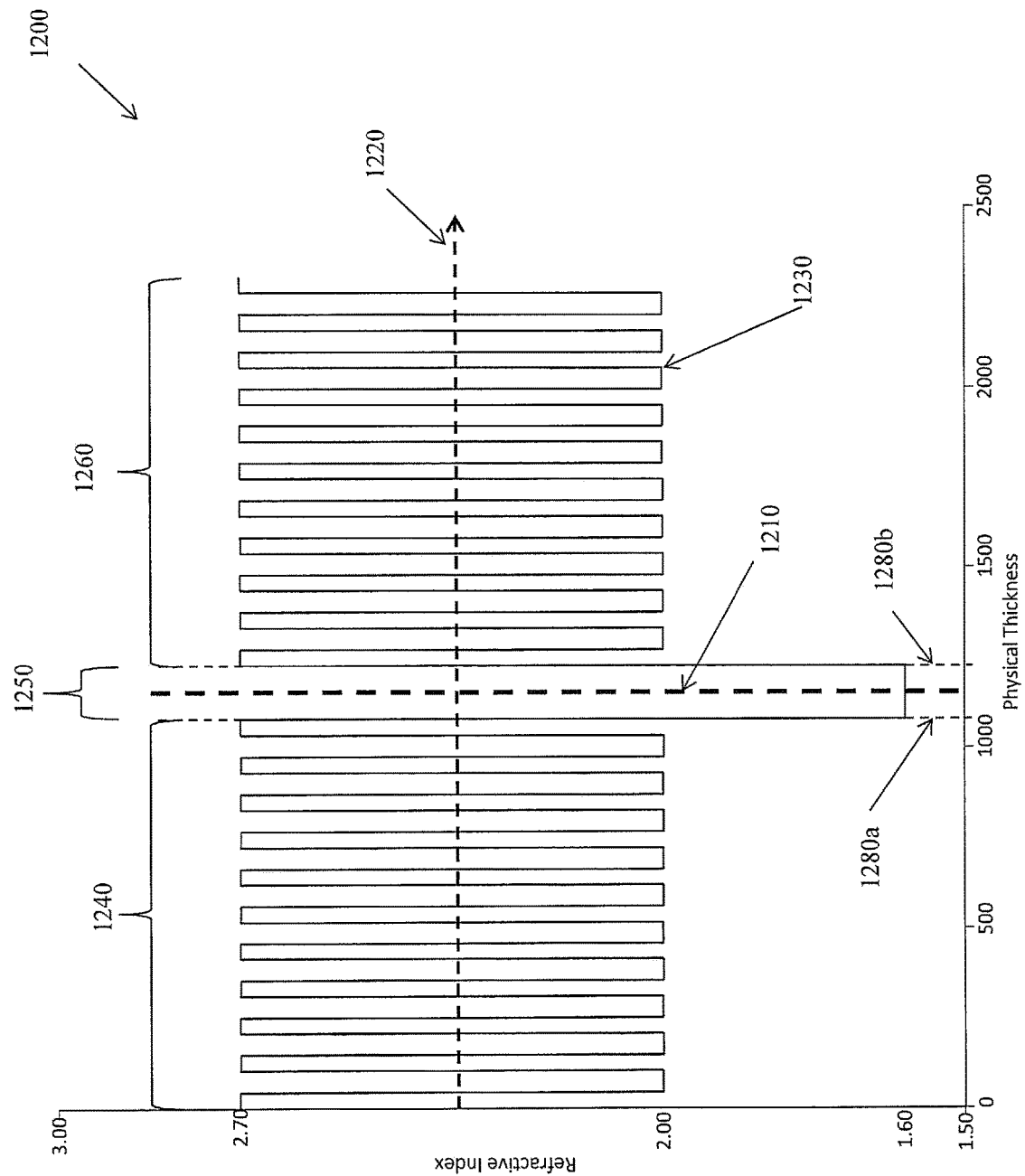
FIG. 12 illustrates index of refraction profile of a simple model defect mode device.
Figure 13:
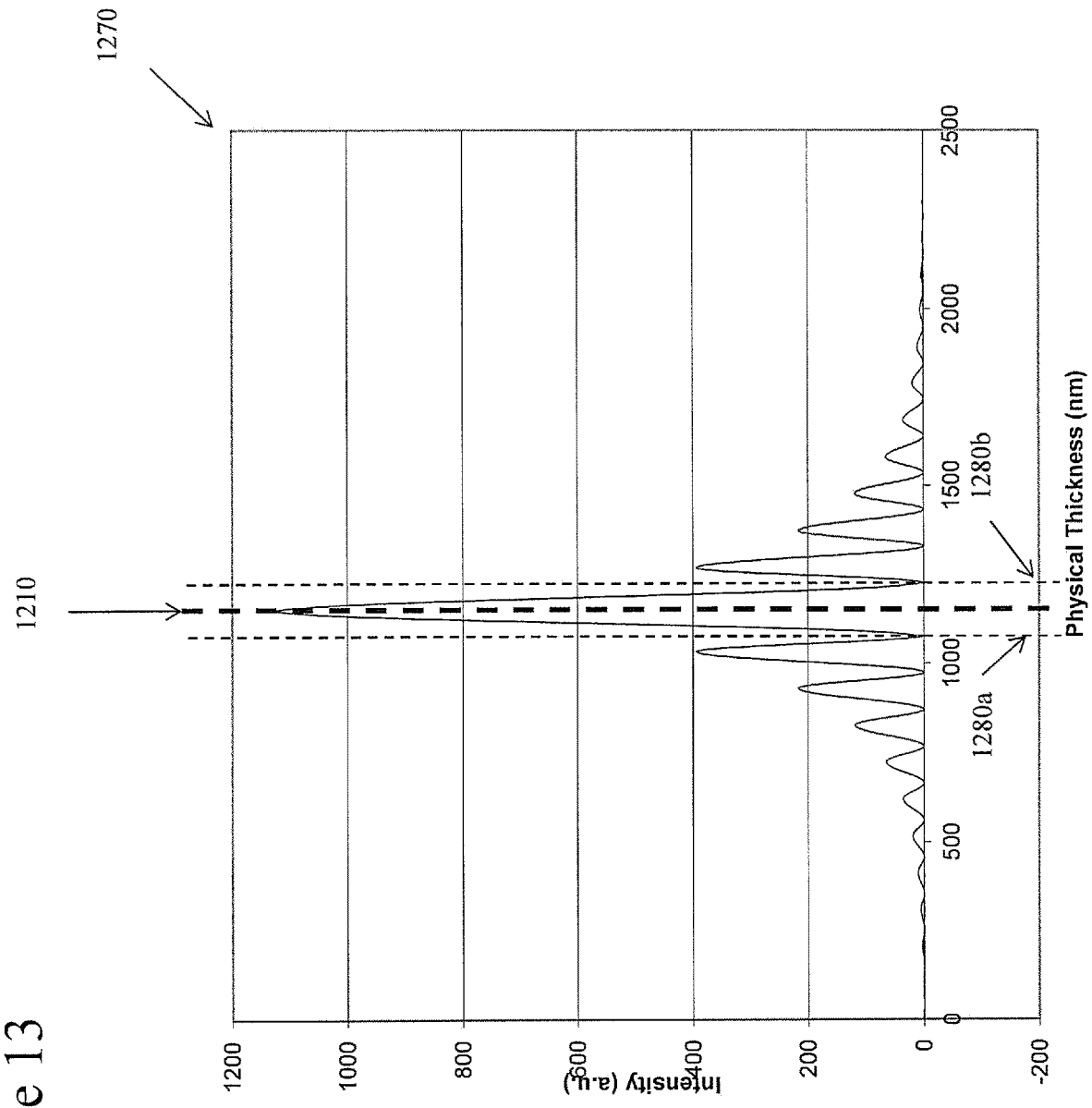
FIG. 13 illustrates the optical intensity of the light distributed through a defect mode device overlaying the defect mode device resonant cavity.

To illustrate the difficulties, consider, a simplified model (not shown) of such an FE-OLED which consists of two DBR's separated by a cavity, such that the DBR surfaces are parallel to each other. Also, consider FIG. 12 illustrating a refractive index profile 1200 experienced by light travelling through such a model FE-OLED device parallel to transmission axis 1220; and, consider FIG. 13 illustrating the resulting light intensity distribution 1270 within the device. Within the cavity, having a refractive index profile 1250, of such a device, an OLED (not shown), or portions thereof may be formed. Ideally the OLED is formed such that the emitter material of the OLED is precisely aligned along a plane 1210 within the cavity, plane 1210 ideally experiencing maximum light intensity in order to maximize further stimulated emission within the emitter material. In such a device, light travelling through the device will experience a changing index of refraction along a transmission axis 1220. This changing index of refraction will be periodic passing through the first portion of the photonic crystal, corresponding to refractive index profile 1240, or through the second portion of the photonic crystal, corresponding to refractive index profile 1260, but this periodicity will be interrupted by the cavity, which will cause a phase slip. The model device consists of a stack of 143 layers (not shown), giving rise to the refractive index profile 1230. The first section of the profile 1240 corresponds to a stack of eleven 43.98 nm thick layers of a transparent material having a refractive index of 2.70, and interposed between these layers are ten layers of a transparent material each 59.38 nm thick having a refractive index of 2.00. The layers alternate from high to low refractive index through the stack and each of the layers has a physical thickness such that its optical thickness (refractive index multiplied by physical thickness) is equal to 118.8 nm, or a quarter wave thickness for light having wavelength of 475 nm. On top of the last of these 21 layers is a 148.44 nm thick layer 1250 of a material having a refractive index of 1.60. On top of this layer is a second feedback means 1260 consisting of 21 more layers identical to the first 21 in the stack. In this model light emission is assumed to occur in a plane 1210 at the center of the central 148.44 nm thick layer. In summary, FE-OLEDs are embodied as two feedback means, e.g. two photonic crystals (e.g. 1240 and 1260) with the emitter layer of an OLED located in a cavity 1250 between the two feedback means.

FIG. 13 shows a plot 1270 of the modeled light intensity distribution through the FE-OLED, described above, along transmission axis 1220 of FIG. 12, when the OLED emits light having a wavelength of 475 nm into the stack. It can be seen that there is a strongly peaked maximum or anti-node of light intensity at the center of the central 148.44 nm thick layer, corresponding to plane 1210, with nodes of zero intensity at the boundaries 1280a and 1280b of this central layer. Thus the two twenty-one layer feedback structures are reflecting light back into the cavity formed by the 148.44 nm thick central layer.

The operating principle of FE-OLEDs, is that the high photon density within the cavity results in very efficient stimulation of light emission from the emitter in the cavity as long as the emitter is centered precisely on plane 1210. Difficulties with devices of this type arise because the maximum light intensity occurs in a very narrow region within the cavity, and light intensity rapidly drops off moving away from plane 1210. In the modeled example shown in FIG. 12 and FIG. 13 this plane is centered in the cavity between the feedback layers. However, in this simplified model the material in the cavity has a uniform refractive index.

In practice, generally this is not the case, because multiple OLED functional layers, comprising different materials with different refractive indices, lie within the cavity 250 and this results in a different, more complicated, distribution of light intensity. The thickness and location of the layers that make up the OLED are largely dictated by electronic considerations and thus it may not be possible to locate an emitter layer at the plane 1210 where maximum light intensity occurs. If it is possible, registering the emitter layer to occur in the location of maximum light intensity 1210 is a difficult task. A further issue is that the strength of the light intensity localization in the cavity of these devices is very sensitive to the cavity thickness and could vary considerably from device to device if the OLED's organic layer thicknesses are not held to very tight tolerances. Referring back to FIG. 12 and the device upon which the profile 1230 is modelled, because a cavity is necessary for light localization, the resonant cavity 1250 and thus the emitter layer, and the functional and non-functional layers surrounding the emitter layer in various embodiments, do not (and cannot) function as part of the photonic crystal itself. Thus, defect-mode devices are embodied as two feedback means, e.g. with index of refraction profiles described by 1240 and 1260, e.g. two photonic crystals, with the emitter layer of an OLED located in a cavity 1250 between the two feedback means.

In summary, up until the present time the commercial potential of FE-OLEDs has not been able to be realized because of yield issues having to do with maintaining proper layer thicknesses, the difficulty in spatially registering the two photonic crystal structures required one to the other, and the difficulty in registering the emitter layer at the peak optical power of the light distribution in the device; which peak optical power is itself dependent on the interplay between the period of the refractive index in each feedback means, the thickness of the cavity, the special registration of the two feedback means and the variations in index of refraction that arise in practice within the cavity caused by the presence of the OLED layers. Given the difficulty in manufacturing FE-OLED type devices, it is similarly difficult to modify the manufacturing processes to provide multiple colors of light (i.e. the desired output spectrum), because modifying the periodicity of the index of refraction variation in order to shift the stopband also requires modification of the size of the resonant optical cavity between the two devices, reregistering the phase of the two feedback means on either side of the resonant cavity and also reregistering the location of the emitter layer within the resonant optical cavity such that it falls on the peak optical power 1210.

A second type of device enhancement based on stimulated emission, which exploits phenomena manifested at the EMR modes found at the spectral edges of a photonic stop-band, is disclosed. This second type of device is referred to as a band-edge emission device. A band edge emission arises when light is emitted inside a photonic crystal structure. When an emitter material is disposed within a photonic crystal and excited, for example by application of a voltage (electric pumping) or by optically pumping, to emit light having a band of wavelengths some of which are overlapped by the stop-band, light is prohibited from propagating through the photonic structure in that band. Instead light having wavelengths at the edge of the stop-band or band-gap will be emitted into the photonic crystal and then emerge from a surface or surfaces of the photonic crystal structure. In various embodiments of this type of device an emitter material is disposed entirely within one layer of a DBR constituting a photonic crystal.

It is tempting to assume that if an emitter material is introduced within a photonic crystal, wherein some portion of the emission spectrum of the emitter material is overlapped by the photonic stop-band of the photonic crystal, that the emission modes or states that would exist in free space, but for the photonic crystal, are destroyed. However, such emission modes are only expelled from, or prohibited from existing within, the photonic crystal and instead of being destroyed can be envisioned as being 'stacked-up' at the edges of the stop-band. In terms of density of states, the number of allowable wave propagation states or modes per interval of frequency in the EMR spectrum increases substantially at the edges of the stop-band.

Figure 14:
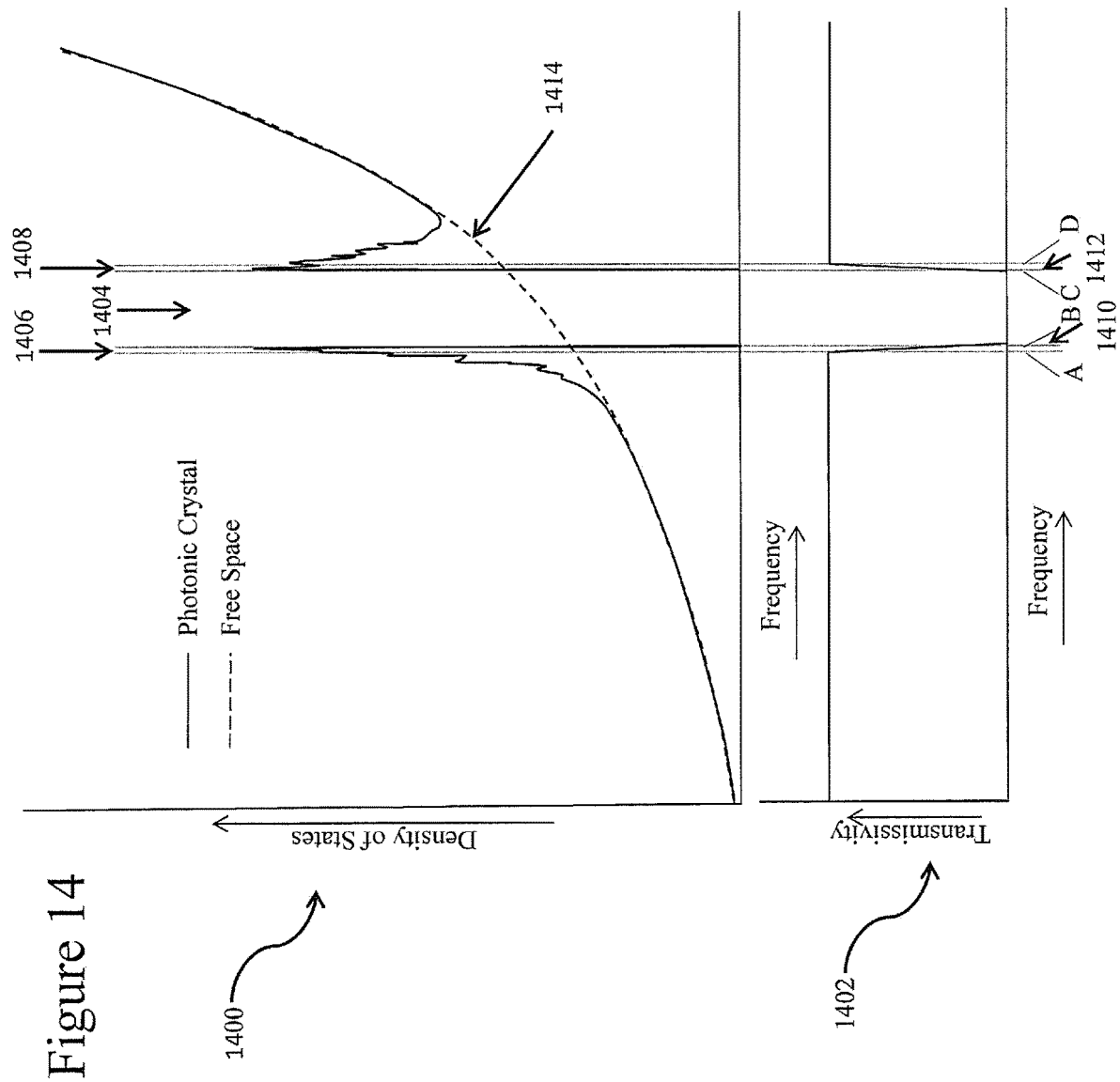
FIG. 14 illustrates the density of states spectrum in a medium having a photonic refractive index profile and corresponding transmissivity spectrum.

As described above, spontaneous emission is suppressed for wavelengths of light within a photonic band-gap. This is because the probability that an excited state atom is de-excited through either spontaneous emission or stimulated emission is proportional to the density of photon states, which vanishes throughout the photonic band-gap for given modes. For an illustrative example, FIG. 14 illustrates the density of states spectrum 1400 of an emission medium disposed within a photonic crystal, and the transmission spectrum 1402 for a photonic crystal having a stop-band or band-gap 1404 in which the density of states goes to zero and so prohibits the propagation of modes having frequencies falling within the band-gap 1404, i.e. between frequencies B and C. Overlaying this spectrum is the free space density of states spectrum 1414 of the emissive material existing outside the photonic crystal. In terms of EMR frequency, frequency B forms the lower boundary 1410 of stop-band 1404 and frequency C forms the upper bound 1412 of stop-band 1404. Because the amount of light that an emitting molecule will emit into its surroundings depends on the density of states available to propagate the light, an emitter molecule emitting into a surrounding photonic crystal having a density of states spectrum 1400 will emit considerably more light photons at frequencies falling in the lower range 1406, between frequencies A and B, or in the upper range 1408, between frequencies C and D. Additionally, photonic crystals have the benefit of being at least partially transparent to band-edge frequencies as is seen by the transmissivity spectrum 1402 showing decreasing transmissivity through the lower region 1406 and then increasing transmissivity through the upper region 1408 as the frequency increases, thus allowing band-edge emission to escape the device.

Referring to FIG. 14, when EMR modes having frequencies falling within the stop-band 1404 are induced by an emitter material within a photonic crystal having stop-band 1404 the density of states for EMR within stop-band 1404 are suppressed and tend towards zero, while the density of states for modes of light having frequencies approaching the lower bound 1410 from the left, or approaching the upper bound 1412 from the right, increases substantially, in particular for modes of light having frequencies in the lower range 1406, between frequencies A and B, and in the upper range 1408, between frequencies C and D. These emissions in lower range 1406 and upper range 1408 are known as band-edge emissions. As can be seen from FIG. 14 there is an increased density of states, in relation to free space (e.g. 1414), extending beyond ranges A-B and C-D, thus the ranges A-B and C-D could be altered outwardly from the stop-band and still be described as encompassing band-edge emissions.

A band-edge emission having a frequency spectrum centered on a frequency $v_{AB}$ in lower range 1406 corresponds to EMR having a wavelength spectrum centered on wavelength $\lambda_{AB}=(c/v_{AB})$ which corresponds to modes of light having wavenumber $k_{AB}=(2\pi/\lambda_{AB})$; and similarly a band-edge emission having frequency spectrum centered on $v_{CD}$ in upper range 1408 corresponds to EMR having a wavelength spectrum centered on $\lambda_{CD}=(c/v_{CD})$ which corresponds to modes of light having wavenumbers $k_{CD}=(2\pi/\lambda_{CD})$. A band-edge emission spectrum centered on $v_{AB}$ then is comprised of photons having a statistical distribution of energy centered on $E_{AB}=hv_{AB}=h(c/\lambda_{AB})$, (h being Planck's constant). Light in these devices with a frequency $v_{AB}$ equivalent to wavelength $\lambda_{AB}$ will have a very large number of modes in the small band of wavenumbers centered on $k_{AB}$. Modes having the wavenumber $k_{AB}$ can have varying phases φ. Whereas, in FE-OLED devices the modes all have nodes locked onto the cavity edges, e.g. as in FIG. 13, and thus there is a single mode for each allowed wavenumber, in band edge devices, many modes with the same wavenumber are allowed and this means that the plot of photon density versus position through the device is smooth with no nodes, as discussed below. As a result variations in emitter layer position within a photonic crystal have little effect in a band edge device.

Because of the partial transmissivity of a photonic crystal to these band-edge modes, light emitted at these wavelengths builds up within the medium comprising the band-edge photonic crystal. The combination of the higher than normal level of photon emission at wavelengths adjacent to the stop-band combined with build up of these photons within the medium due to internal reflections yields very high photon densities throughout the bulk of the photonic crystal medium. These high photon densities ensure further stimulated emission from essentially all of the excited state emitter molecules embedded within the photonic crystal. In a one-dimensional photonic crystal, the direction of propagation of stimulated emission photons is normal to the emission surface.

Until now solid state band-edge organic light emitting diodes (BE-OLEDs) have not seemed to be possible because of the spatial mismatch between the assumed distribution of photons in the photonic crystal structure and the much smaller volume occupied by the emitter material. It was accepted that without doping emitter material throughout the extent of the photonic crystal structure, as had been the case in previously produced band-edge lasers, the insufficient interaction of previously emitted light entrained in the photonic crystal with excited emitter molecules would preclude a useful and efficient light emitting device.

Surprisingly a new light emitting device containing an OLED embedded in a single thin layer within a single photonic crystal will function as a non-lasing band-edge emitting light emitting device while providing a substantial amount of emitted light. Moreover, such a device provides substantially increased efficiency over conventional LEDs, OLEDs and cavity type FE-OLEDs. Optical power output on the order of 300 lumens per watt has been achieved. This increased efficiency is realized while having the benefit of being simpler to produce and generating less heat. Disclosed devices additionally provide a very refined emission spectrum occurring predominantly within a relatively narrow range of frequencies occurring close to the band edge of the photonic stop-band of the photonic crystal. The manufacture of these devices also allows a designer to easily fine tune the output frequency (i.e. color of the emitted light) of the resulting device by varying only a single factor—the periodicity of the index of refraction.

This allows the fabrication of devices that emit highly saturated colors of selected wavelengths because of their relatively narrow emission spectrum. As a result, full-color, OLED displays fabricated with red, green, and blue pixels utilizing band-edge emission can replicate a wide gamut of colors across the CIE color space.

Enhancements and features of the present invention and methods of accomplishing the same may be understood more readily by reference to the following detailed description of example embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims, and equivalents thereof. Thus, in some embodiments, known structures and devices are not shown in order not to obscure the description of the invention with unnecessary detail. Like numbers refer to like elements throughout. In the drawings, the thickness of layers and regions are exaggerated for clarity.

It will be understood that when an element or layer is referred to as being "on," or "connected to" another element or layer, it can be directly on or connected to the other element or layer or intervening elements or layers may be present. In contrast, when an element is referred to as being "directly on" or "directly connected to" another element or layer, there are no intervening elements or layers present. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the present invention refers to "one or more embodiments of the present invention." When discussing thicknesses or lengths of physical components or portions of the inventive device embodiments in terms of a wavelength of light, the thickness is such that light passing through such a component experiences an equivalent optical thickness (i.e. refractive index times physical thickness). For example a physical length equal to an optical thickness of ¼ of the wavelength of emitted light in a medium having an index of refraction of 1.1 where the emitted light is 600 nm, would result in an optical thickness of 150 nm, or a physical thickness equal to the optical thickness divided by 1.1, thus a physical thickness of 136.36 nm. One of skill in the art will appreciate when such an equivalent thickness is necessitated by the function of the component being described and where thickness and optical thickness may be used interchangeably.

Spatially relative terms, such as "below," "beneath," "lower," "above," "upper," and the like, may be used herein for ease of description to describe one element or feature's relationship to another element(s) or feature(s) as illustrated in the drawings. It will be understood that the spatially relative terms are intended to encompass different orientations of the device in use or operation in addition to the orientation depicted in the drawings.

Embodiments described herein will be described referring to plan views and/or cross sectional views by way of ideal schematic views of the invention. Accordingly, the example views may be modified depending on manufacturing technologies and/or tolerances. Therefore, the embodiments of the invention are not limited to those shown in the views, but include modifications in configuration formed on the basis of manufacturing processes. Therefore, regions shown in the drawings have schematic properties, and shapes of regions shown in the drawings are examples of specific shapes of regions of elements and do not limit aspects of the invention In one embodiment the device disclosed herein may be a unitary photonic crystal having an emitter material disposed within the photonic crystal. In various embodiments the emitter material may be located in the emitter layer of an OLED. Also, in various embodiments, the unitary photonic crystal may be a DBR, and may consist of a series of layers of various materials having different indexes of refraction, arranged in such a way that light passing through the device experiences a substantially periodic index of refraction profile. The index of refraction profile may be a periodic square wave type function such as that shown in FIG. 15, or in other embodiments it may be a continuously varying substantially periodic index of refraction.

The OLED may be formed as a single thin layer. In the case where the photonic crystal is a DBR, the OLED may alternatively comprise a single layer or one or more of the alternating index layers. In a device of this type the emitter layer and the associated electric charge carrier transporting and electric charge carrier blocking layers generally found in OLEDs combine together to form one or more active layers or active zones. Alternatively the OLED components are contained within an inactive material having appropriate index of refraction, wherein the OLED components and the material together form an active layer or active zone. As used herein, active zone and active layer and active region are used synonymously and refer generally to any part of photonic crystal containing aspects or components which function as a an OLED, irrespective of its geometry, excepting that the index of refraction experienced by light passing through the photonic crystal in a particular direction experiences a substantially continuously varying periodic index of refraction that is substantially uninterrupted passing through the geometry containing the active region. As used herein, inactive material means any material that does not relate to the electrical functioning of the OLED device. The active region may comprise in part inactive material. In one embodiment, the photonic crystal comprises a DBR consisting of a stack of dielectric layers having an alternating index of refraction from one layer to the next (e.g. high, low, high, low, high, low, etc.) and the active layer or layers are λ/4 in optical thickness where λ is a wavelength of the central frequency of the stop-band of the photonic crystal, and the index of refraction of the active layer containing emitter material is lower than the index of refraction of each adjacent layer. Alternatively, the index of refraction of the active zone, or layer, is higher than the index of refraction of each adjacent layer. In another embodiment there are two active zones adjacent to each other, one active layer having a higher index of refraction than the other. In another embodiment there are three active layers, one comprising an anode, one comprising an OLED minus its electrodes, and one comprising a cathode, wherein the anode layer and the cathode layer are each adjacent to the OLED layer. Additionally there may be additional active regions or zones or layers throughout the photonic crystal. In any case in which the photonic crystal is a DBR the pattern of alternating high and low refractive index layers or zones of λ/4 optical thickness characteristic of photonic crystals carries on through the entire device stack, including the active layer(s), thus forming a single photonic crystal structure that emits light at the band-edge when the anode and cathode are energized. More generally, the periodicity of the periodic index of refraction is substantially uninterrupted throughout the light emitting photonic crystal.

In these devices the interaction of the photons that build up in density in the photonic crystal structure with the thin (preferably λ/4 optical thickness or less) organic emitter material layer does not induce lasing, but does interact sufficiently to ensure that essentially all light emission is stimulated in nature. Thus the emission is particularly useful for display and lighting applications because the light emitted from a BE-OLED is speckle-free emission. Speckle-free emission is collimated light produced by stimulated emission that does not produce the well-known speckle effect of visible laser light—that is the 'salt and pepper' effect created by the destructive interference of laser photons on a viewing surface.

The OLED contains an emitter material whose free space electroluminescence emission yields a significantly high radiance at the band-edge wavelengths, that is to say, a radiance that when measured normal to the device surface is preferably at least 25% and most preferably at least 50% of the radiance at the peak spectral electroluminescence for the material. In other words, the measured radiance of luminescence light emitted by the light emitting material utilized in the organic light emitting diode is greater than one-quarter of the peak radiance of the luminescence emission spectrum of the emitter material measured normal to its light emitting surface. In other words, the emitter material in free space emits a substantial amount of light in the wavelengths corresponding to the band-edge wavelengths of the photonic crystal. For the sake of simplicity this is referred to as the emitter material emits light into the band-gap, or into the band-edge modes of the photonic crystal.

A particularly advantageous aspect of the disclosed devices is that the location of the emitter layer within the device need not be as precise as is the case with the defect-mode devices.

Figure 15:
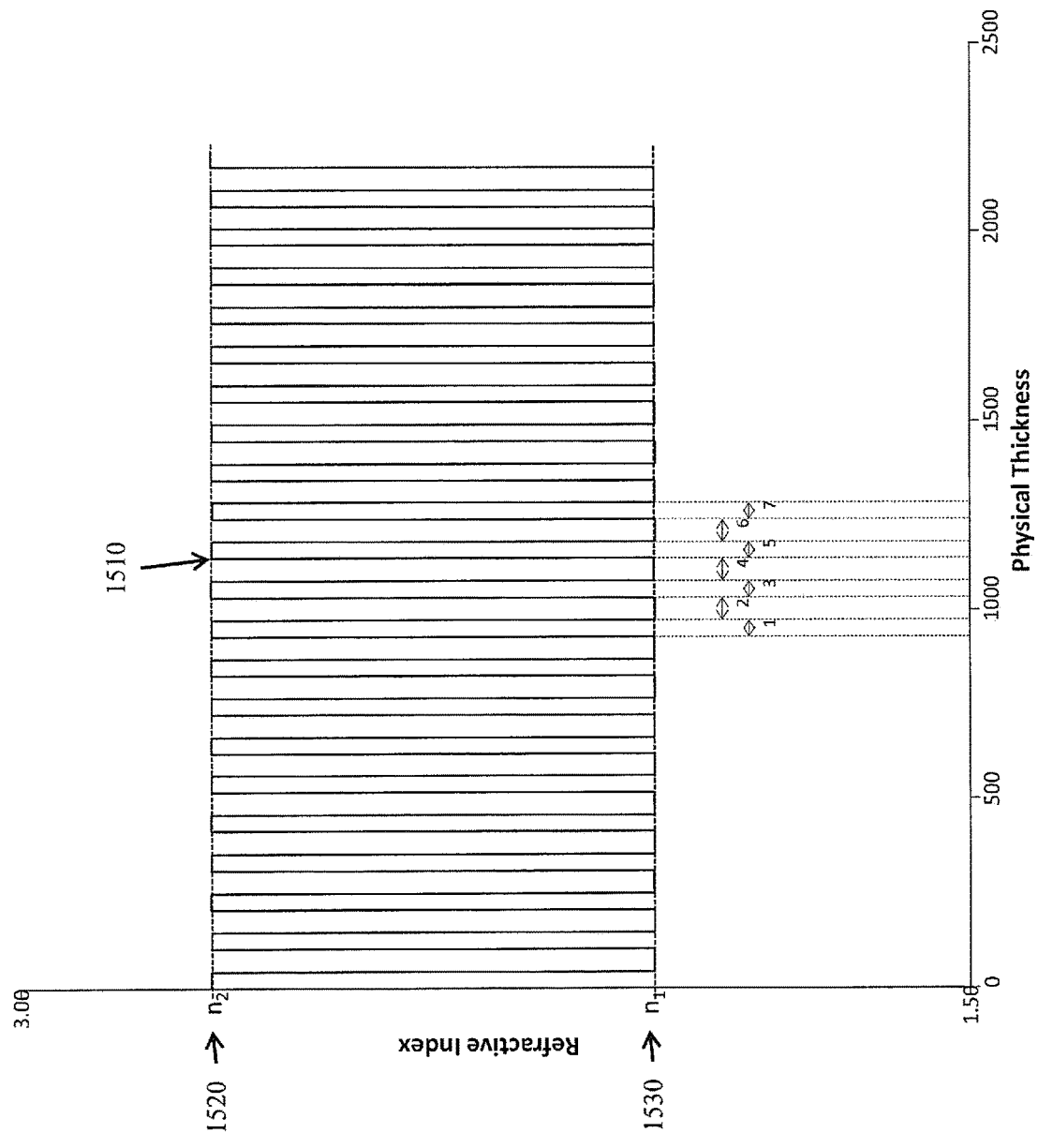
FIG. 15 illustrates the index of refraction profile of a model band-edge emitting photonic structure device.
Figure 16:
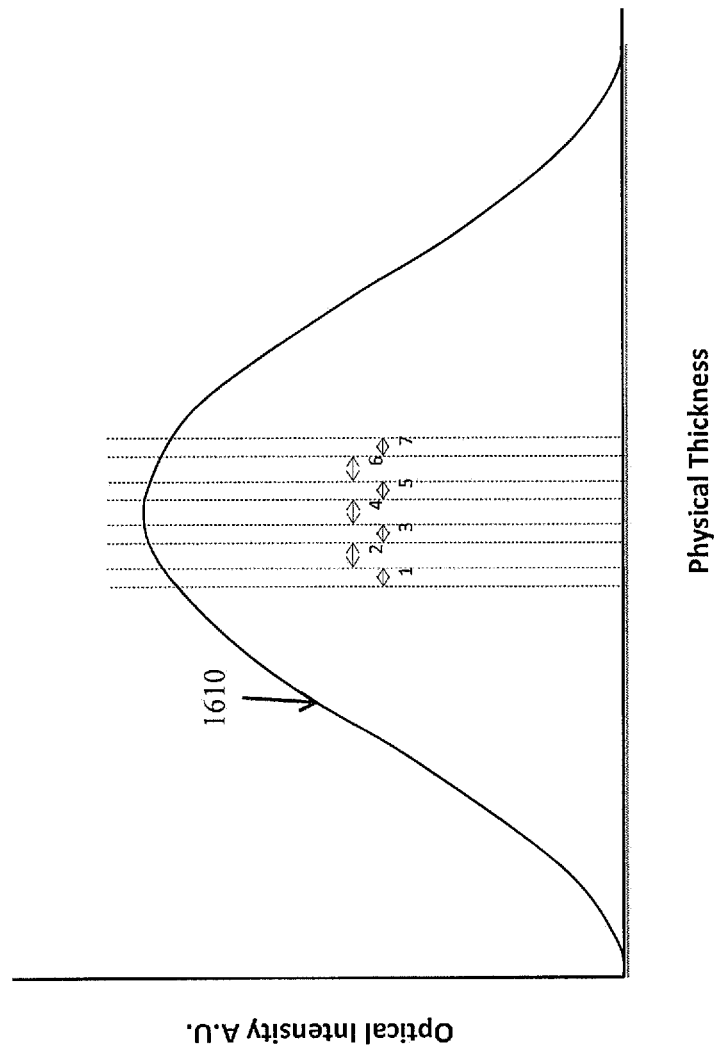
FIG. 16 illustrates the optical intensity of the light distributed through a band-edge emitting photonic structure device.

In the following discussion, compare FIGS. 12 & 13 with FIGS. 15 & 16. The refractive index profile 1510 of a simplified computer model of a disclosed BE-OLED device is shown in FIG. 15. The device (not shown) described in this example consists of 43 layers or zones with alternating high ($n_2$) 1520 and low ($n_1$) 1530 refractive indices. (This number of layers is for exemplary purposes only and is not necessarily an optimum number of device layers.) Zone 4 corresponds to a layer containing light emitting material. Given this structure, when light is emitted from the emitter in zone 4 into band edge light propagation modes that exist within the photonic crystal structure, the distribution of light intensity 1610 within the device is that shown in FIG. 16. This distribution occurs because a very large number of modes exist and they not only have multiple wavelengths, but also have different phase relationships relative to the device layer boundaries for any particular emitted wavelength. This is in contrast to the FE-OLED devices described by FIG. 2 and FIG. 3 wherein there is a single light propagation mode and a sharply peaked light intensity distribution at the center of the central layer or zone. When zones 1 through 7, including zone 4 of FIG. 15 are projected onto the light intensity distribution 1610 in FIG. 16, it can be seen that the emitter layer could be located anywhere in zone 4 or, for that matter, in zones 2 through 6 with little impact on device performance, because there is little difference in light intensity in any of these regions 2 through 6.

Figure 17:
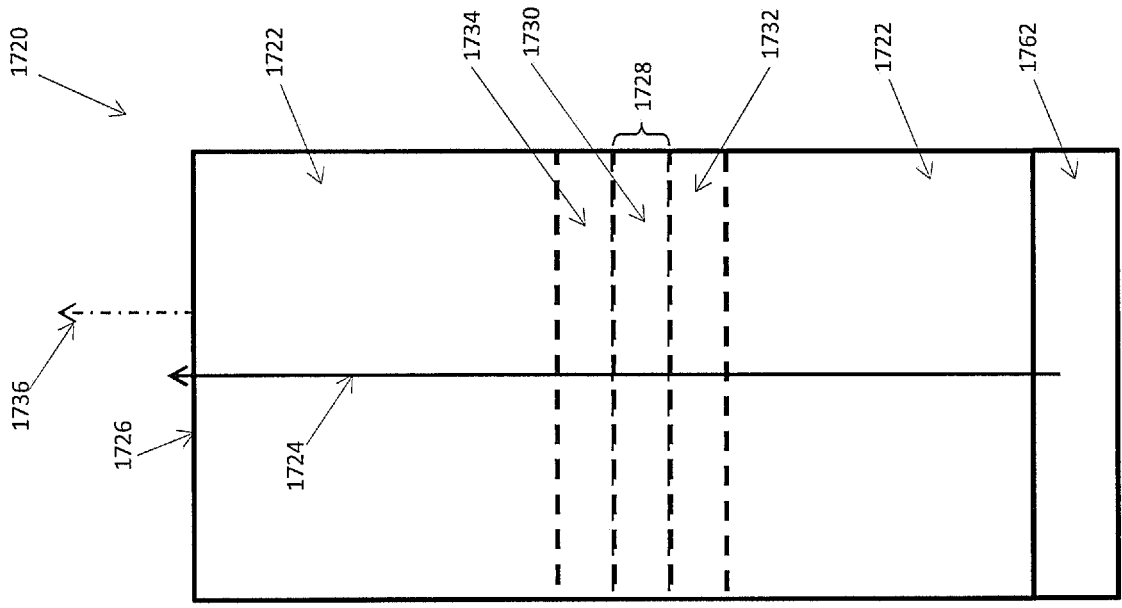
FIG. 17 illustrates various embodiments of the present invention along with an associated refractive index profile of the various embodiments described.
Figure 17:
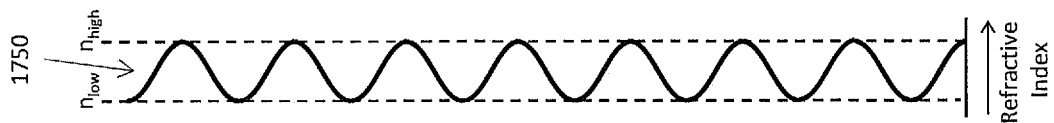
Figure 17:
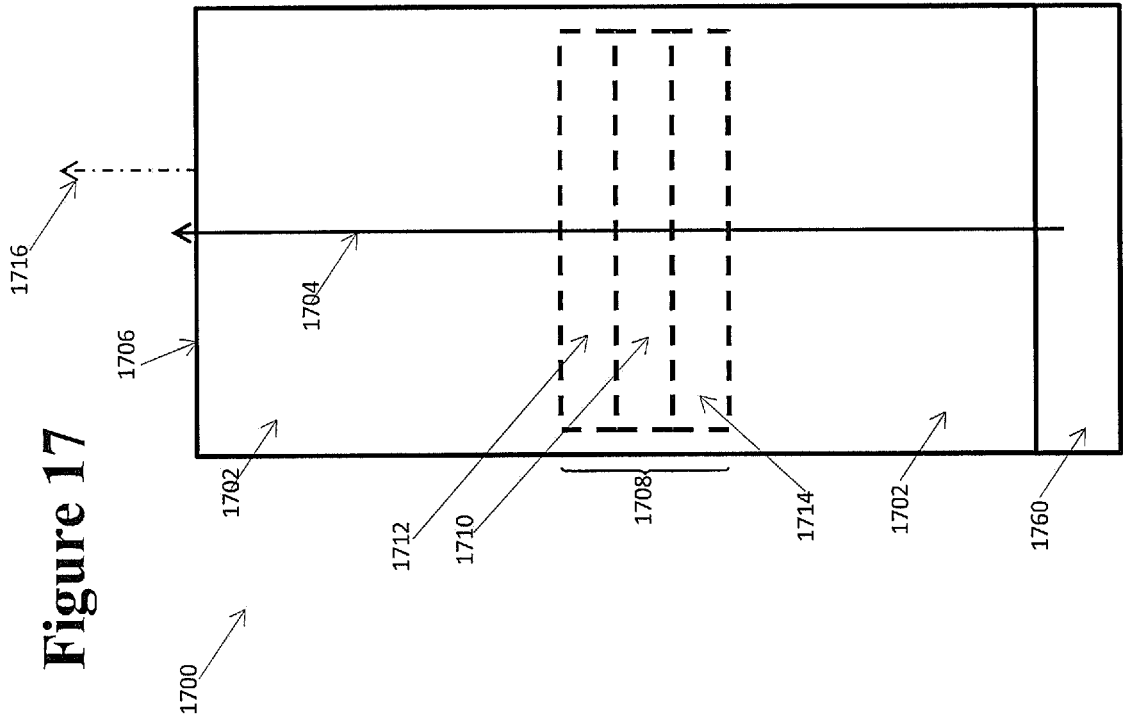

FIG. 17 illustrates cross-sections of various embodiments disclosed of the light emitting device 1700. Light emitting device 1700 comprises a photonic crystal structure 1702 which includes active zone 1708 comprising layers 1710, 1712, 1714 (indicated by the dotted lines), a non-limiting example of which is a DBR, (not illustrated); a transmission axis 1704; an emission surface 1706; and an active zone 1708. Active zone 1708 is disposed or formed within photonic crystal structure 1702 and further comprises an organic layer 1710, an anode 1712, and a cathode 1714. The organic layer further comprises a sublayer comprising an organic electroluminescent material (not shown) and a sublayer comprising a charge transporting material (not shown). The organic layer 1710 may further comprise one or more additional sublayers (not shown) comprising charge carrier transport layers, charge carrier injection layers, charge carrier blocking layers, thus it will be appreciated the organic layer 1710 may contain one or more additional OLED functional layers. It will be appreciated that layers 1710, 1712 and 1714 together comprise an OLED. As will be appreciated anode 1712 and cathode 1714 may each be a single electrode or alternatively may further comprise multiple layers of electrodes (not pictured). Active zone 1708 is formed such that the periodically varying index of refraction 1750 along transmission axis 1704 of the photonic structure is not disrupted, or is substantially not disrupted.

Preferably, the organic layer 1710 has a maximum optical thickness of approximately ¼ of a single wavelength corresponding the central wavelength prohibited within the photonic structure by the stop-band created by the periodic index of refraction 1750 (here the periodic index of refraction is illustrated as a sinusoid, alternatively it may be closer to or substantially a square wave, or some other substantially periodically varying index of refraction). If an optical thickness of ¼ wavelength is impractical for a particular embodiment, the optical thickness of the organic layer 1710 may be equal to approximately ¾ of the central wavelength of the stop-band. For example, the optical thickness of each of layers 1710, 1712, and 1714 is approximately ¼ of the central wavelength of the stop-band. When activated by a potential applied across anode 1712 and cathode 1714 the organic emitter molecules are excited and photons are emitted into the band-edge modes of the photonic crystal. As a result, visible light 1716 is emitted from the emission surface 1706 at wavelengths corresponding to the band-edge emissions, for example in the bands 1406 or 1408 of FIG. 14. Preferably, the molecules of the organic emitter material within the organic layer 1710 are spatially oriented to maximize stimulated emission parallel to the transmission axis 1704. As will be appreciated, when properly formed, the devices 1700 being of a photonic structure having a stopband, the density of states spectrum and transmissivity spectrum of device 1700 will be similar to those illustrated in FIG. 14.

In various embodiments the active zone 1708 comprises an organic layer 1710 that has a refractive index that is lower than that of the anode layer 1712 and cathode layer 1714, and the anode layer and cathode layer refractive indexes are higher than the adjacent portions of the photonic structure. In various embodiments the anode and the cathode may be adjacent to opposite sides of the organic layer 1710 and each may have thickness equivalent to ¼ wavelength of the central wavelength of the stopband, and the organic layer 1710, comprising a sub-layer of light emitting material, may have thickness equivalent to ¼ wavelength of the central wavelength of the stop-band and has a refractive index that is lower than that of the anode layer and cathode layer.

FIG. 17 also illustrates various other embodiments of a disclosed light emitting device 1720. Similarly to device 1700, device 1720 comprises a photonic crystal structure 1722, which includes layers 1732, 1728, and 1734 (indicated by the dotted lines), a non-limiting example of which is, for instance a DBR; a transmission axis 1724; an emission surface 1726; and an active zone 1728. Active zone 1728 is disposed or formed within photonic structure 1722 and further comprises an organic layer 1730. Photonic structure 1720 additionally includes two additional active zones 1732 and 1734, each may have thickness equivalent to ¼ wavelength of the central wavelength, respectively comprising an anode layer 1732, and a cathode layer 1734. Organic layer 1730 comprises an organic emitter material. Organic layer 1730 may further comprise additional OLED functional layers such as charge carrier layers and charge injection layers (not shown). Organic layer 1730 may also comprise one or more very thin metallic layers, for example a first 0.5 nm cathode layer (not illustrated) formed from a 50:50 mixture of samarium and silver, or a very thin charge injection layer, as these layers may be formed of materials having relatively low index of refraction. As will be appreciated anode 1732 and cathode 1734 may also each be a single electrode or alternatively may further comprise multiple layers of electrodes (not pictured). It will be appreciated that one or more OLED functional layers may be located within the anode layer 1732 or cathode layer 1734 depending on their respective index of refraction. Active zone 1728 is formed such that the periodically varying index of refraction 1750 along transmission axis 1724 of the photonic structure is not disrupted. Preferably, the active zone 1728 has a thickness of approximately ¼ of a single wavelength corresponding to the central mode prohibited within the photonic structure due to the stop-band created by the periodic index of refraction 1750. One physical difference between 1700 and 1720 is that the active zone 1728 extends planarly throughout two dimensions (i.e. horizontally across the cross section shown in FIG. 17 and into the page of FIG. 17) of the photonic structure, whereas active zone 1708 is entirely enclosed by the photonic structure (represented by the dotted lines of 1708 not extending to the boundary of device 1700). It will be thus appreciated that the active zones need not be layers, but more generally instead may be a zone confined to a small region of the horizontal extent of the photonic crystal. Preferably, the zone containing the organic emitter material may be confined, or localized, within a region comprising less than 10% of the optical thickness of the entire photonic crystal in the vertical direction. It will be appreciated that the active zone may be smaller or larger than the preferable thickness. It will be appreciated that the emitter material may be localized to a single layer comprising 10% or less of the vertical thickness of the photonic crystal 1720.

In various disclosed embodiments the light emitting device 1720 may be a photonic crystal comprising eleven or more vacuum deposited layers. These eleven layers may first be four or more layers of dielectric materials having alternating indexes of refraction of a pattern low-high-low-high-low-high, then a fifth layer comprising an anode, a sixth layer comprising an organic emitter material (or an OLED minus electrodes), a seventh layer comprising a cathode and finally four or more additional layers of dielectric materials having alternating indexes of refraction of a pattern high-low-high-low-high-low, wherein each layer has substantially the same optical thickness. In various disclosed embodiments, the fifth, sixth and seventh layers comprising an OLED may further comprise various sublayers such as a hole injection layer, a hole transport layer, an emitter layer, an electron transport layer, and an electron injection layer. In other embodiments the first four layers may be replaced by six or perhaps eight vacuum deposited layers with alternating high and low indices of refraction, or the final four layers may be replaced by six or perhaps eight vacuum deposited layers with alternating high and low indices of refraction. It will be appreciated that additional layers of alternating high and low indices of refraction layers may be incorporated without deviating from the invention. In various disclosed embodiments, the exemplary device, e.g. 1720, may be formed on a substrate 1762, which may comprise a dielectric material such as e.g. glass or plastic.

Various aspects of the devices disclosed herein may be formed using sputtering techniques, or vacuum evaporation techniques, or other similar techniques as will be appreciated by one of skill in the art. Devices may also be formed using a combination of these techniques. In various embodiments, a band-edge type enhanced OLED, may have either of the structures shown in FIG. 17. It is noted that the examples illustrated in FIG. 17 are not drawn to scale. It is also noted that in this example embodiment, thicknesses are approximate such that, e.g. 159 nm, is preferably 159 nm, but may vary slightly given the limitations of the technologies used to form the constituent layers of the following example. Minor variations do not significantly impact performance because the device is forgiving—another improvement over cavity type devices (e.g. FE-OLEDs) which are far more sensitive to variations. Non-limiting examples the structure of photonic crystal 1720 may be formed according to the following exemplary embodiments.

In one preferred embodiment, photonic structure 1722 may comprise a photonic crystal. To form photonic structure 1722, for example two successive pairs of layers of dielectric material having alternating high and low (relative to each other) index of refraction, each layer having 159 nm optical thickness, may be formed on transparent substrate 1762. Each pair may comprise a high index layer comprising $TiO_2$ and a low index layer which may comprise $SiO_2$. Non-limiting examples of alternative low index layers may be formed of LiF, or $MgF_2$. A non-limiting example of an alternative high index layer may be formed of $Nb_2O_5$. The high index layer in such a case would be formed adjacent to, or on, the substrate 1762, which comprising a dielectric material such as glass or plastic will have a relatively low index of refraction. The low index layer would then be formed adjacent to the high index layer. Each pair will be formed upon the previous pair such that the high index layer is formed adjacent to, or upon, the low index layer, thus for example upon substrate 1762, photonic crystal 1722 may be formed first sputtering one 71.7 nm layer of $TiO_2$ (optical thickness of 159 nm based on a measured refractive index of 2.218) then sputtering one 108.8 nm layer of $SiO_2$ (optical thickness of 159 nm based on a measured refractive index of 1.462), and repeating these steps two more times, such that this intermediate result comprises an uppermost layer having a low index of refraction.

Upon this intermediate result may be formed anode 1732, for example anode 1732 may be a transparent inorganic semiconductor anode comprising a 79.2 nm thick layer of $In_2O_3ZnO$ (indium-zinc oxide, IZO, 90:10) (optical thickness of 159 nm based on a measured refractive index of 2.008). Alternatively $In_2O_3$—$SnO_2$ (indium tin oxide, ITO) may be substituted for IZO. A ternary oxide such as gallium-indium-tin oxide may be used in devices meant to emit blue light since this material can have better transmissivity for blue light than the alternatives. Upon this anode 1732 may be formed an active layer 1728 having an optical thickness of 159 nm comprising, for example, the various organic materials and low refractive index material constituting the OLED (minus its electrodes), such that the index of refraction of active layer 1728 is lower than the index of refraction of the anode 1732.

Continuing the example immediately above, active zone 1728 may be formed for example by thermal evaporation of the various constituent sub-layers, which may comprise a layer of N,N'-Bis(naphthalen-1-yl)-N,N'-bis(phenyl)-benzidine (NPB) (for instance, 31.8 nm in physical thickness equivalent to an optical thickness of 65.6 nm based on a measured refractive index of 1.831) which material functions as a hole transporting material and a layer of tris-(8-hydroxyquinoline) aluminum (Alq3) (for instance, 47.8 nm in physical thickness equivalent to an optical thickness of 92.3 nm based on a measured refractive index of 1.724) which material functions as both an electron transporting and an emissive material. Therefore the active zone 1728 of photonic structure 1722 contains organic layer 1730. The two constraints on active zone 1728 in this exemplary embodiment are that it have an optical thickness of approximately 159 nm, and the index of refraction of the constituent layers are each respectively lower than the index of refraction of the anode layer 1732. One or more additional functional (for instance, metal and electron injection layers of the cathode) or non-functional layers may act as spacers if necessary to achieve the necessary thickness of active zone 1728. Upon completion of this intermediate result, the photonic structure 1722 comprises a substrate having a relatively low index of refraction, three alternating pairs of alternating dielectric layers of respectively high and low index of refraction, an anode layer having a high index of refraction and an active zone having a low index of refraction, where each layer of the intermediate result is approximately 159 nm in optical thickness. Optionally an electron injection layer of lithium fluoride (not illustrated) 0.5 nm in physical thickness (optical thickness of 0.6 nm based on a refractive index of 1.294) may be formed by vacuum thermal evaporation may be formed upon the $Alq_3$ layer. This thin, relatively low refractive index layer have an optical thickness totaling 0.6 nm.

Continuing the example immediately above, a first 0.5 nm cathode layer (not illustrated) formed from a 50:50 mixture of samarium and silver by vacuum thermal evaporation may be deposited on top of the lithium fluoride. This layer has an optical thickness of 0.5 nm and therefore has a negligible effect on the refractive index profile of the photonic crystal, and may be accounted for as part of the active layer 1728 or the second cathode layer 1734 A second cathode layer, for example 1734, may be formed upon the first cathode layer. The second cathode layer 1734 has an optical thickness of approximately 159 nm thick may be fabricated from sputtered IZO or another transparent conductive oxide. The second cathode layer 1734 has a relatively high index of refraction when compared with the materials comprising the active zone 1728, as well as having a high index of refraction when compared with $SiO_2$, or its alternatives.

Upon the cathode layer two successive pairs of layers of dielectric material having alternating low and high index of refractions may be formed, each layer approximately 150 nm thick. Each pair may comprise a low index layer which may comprise $SiO_2$, and a high index layer comprising $TiO_2$. As described above, non-limiting examples of alternative low index layers may be formed of LiF, or $MgF_2$. A non-limiting example of an alternative high index layer may be formed of $Nb_2O_5$. The low index layer in such a case would be formed adjacent to, or on top of, the cathode layer 1734, which will have a relatively high index of refraction. Each pair will be formed upon the previous pair such that the high index layer is formed adjacent to, or upon, the low index layer, thus for example upon cathode layer 1734, photonic crystal 1722 may continue to be formed by sputtering one 159 nm layer of SiO2 then sputtering one 159 nm layer of $Nb_2O_5$, and repeating this one more time, such that this final result comprises a single photonic crystal 1722 having an uppermost layer having a high index of refraction. It will be appreciated that the emitter material within the photonic crystal is confined to a region that is less than 10% of the overall optical thickness of the device.

In another alternative exemplary embodiment, exemplary photonic crystal, e.g. 1720, may instead be formed as follows. Beginning with transparent substrate 1762 comprising glass or plastic. As with the embodiment described above, three successive pairs of layers of dielectric material having alternating high and low (relative to each other) index of refraction, each layer 147.5 nm in optical thickness may be formed on the substrate. Each pair may comprise a high index layer comprising $Nb_2O_5$ and a low index layer which may comprise $SiO_2$. Non-limiting examples of alternative low index layers may be formed of LiF, or $MgF_2$. A non-limiting example of alternative high index layers may be formed of $TiO_2$. The high index layer in such a case may be formed adjacent to the substrate, which comprising glass or plastic will have a relatively low index of refraction. Each pair will be formed upon the previous pair such that the high index layer is formed adjacent to, or upon, the low index layer, thus for example upon substrate 1762, photonic crystal 1722 may be formed first sputtering one 82.2 nm layer of $Nb_2O_5$ (optical thickness of 147.5 nm based on a measured refractive index of 1.795) then sputtering one 101.2 nm layer of $SiO_2$ (optical thickness of 147.5 nm based on a measured refractive index of 1.457), and repeating this two more times, such that this intermediate result comprises an uppermost layer having a low index of refraction.

As in the previous embodiment described above, upon this intermediate result may be formed anode 1732, for example anode 1732 may be a transparent inorganic semiconductor anode comprising a 73.5 nm thick layer of $In_2O_3$—ZnO (indium-zinc oxide, IZO) (optical thickness of 147.5 nm based on a measured refractive index of 2.008). Alternatively the anode 1732 may comprise a layer of optical thickness 147.5 nm comprising approximately 10% $ZnO_2$ and 90% $In_2O_3$. Upon this anode 1732 may be formed an active layer 1728 having a total optical thickness of 147.5 nm comprising, for example, the various organic and other low refractive index materials constituting the OLED, such that the index of refraction of active layer 1728 is lower than the index of refraction of the anode 1732.

Continuing the example immediately above, active zone 1728 may be formed for example by thermal evaporation of the various constituent layers, which in this case may comprise (preferably in the following order): a thermally evaporated layer of copper phthalocyanine (CuPC) 2.0 nm in thickness (2.6 nm in optical thickness based on a refractive index of 1.318), or alternatively dipyrazino[2,3-f:2',3'-h]quinoxaline-2,3,6,7,10,11-hexacarbonitrile (HAT-CN), which functions as a hole injection layer; followed by a 35.0 nm thick thermally evaporated layer of 4,4'-Bis(9-carbazolyl)-1,1'-biphenyl (CBP) (64.4 nm in optical thickness based on a refractive index of 1.840) which material functions as a hole transporting material; a 15.0 nm thick layer of thermally evaporated CBP doped with 8% bis[2-(2-pyridinyl-N)phenyl-C] (acetylacetonato)iridium(III) (Ir $(ppy)_2(acac))$ (27.5 nm in optical thickness based on a refractive index of 1.831) which material functions as the emissive material; a 29.3 nm thick layer of 2,2',2"-(1,3,5-benzinetriyl-tris(1-phenyl-1-H-benzimidazol (TPBi) (50.8 nm in optical thickness based on a refractive index of 1.736) which functions as an electron transport layer; and a 1.0 nm layer of 8-hydroxyquinolatolithium (Liq) (1.7 nm in optical thickness based on a refractive index of 1.7), which functions as an electron injection layer. Therefore the active zone 1728 contains organic layer 1730. The two constraints on active zone 1728 in this exemplary embodiment are that it have a thickness of approximately 147.5 nm, and the index of refraction of the constituent layers are each respectively lower than the index of refraction of the anode layer 1732. One or more additional functional (for instance, metal and electron injection layers of the cathode) or non-functional layers may act as spacers if necessary to achieve the necessary thickness of active zone 1728. Upon completion of this intermediate result, the photonic crystal 1722 comprises a substrate having a relatively low index of refraction, three alternating pairs of alternating dielectric layers of respectively high and low index of refraction, an anode layer having a high index of refraction and an active zone having a low index of refraction, where each layer of the intermediate result is approximately 147.5 nm in thickness. Additionally, the hole injection layer and hole transport layers, respectively comprising CuPC and CBP in this example may be substituted with one layer of N,N-Bis-(1naphthalenyl)-N,N'-bis-phenyl-(1,1'-biphenyl)-4,4'-diamine (NBP), which is a hole transport material having electron blocking properties.

Continuing the example immediately above, a first 0.5 nm cathode layer (not illustrated) formed from a 50:50 mixture of samarium and silver by vacuum thermal evaporation may be deposited on top of the 8-hydroxyquinolatolithium. This layer has an optical thickness of 0.5 nm. A second cathode layer, for example 1734, may be formed upon the first cathode layer. The second cathode layer 1732 has an optical thickness of approximately 147.5 nm thick may be fabricated from sputtered IZO or another transparent conductive oxide. The second cathode layer 1734 has a relatively high index of refraction when compared with the materials comprising the active zone 1728, as well as having a high index of refraction when compared with $SiO_2$, or its alternatives.

Upon the cathode layer three successive pairs of layers of dielectric material having alternating low and high index of refractions may be deposited, each with an optical thickness of approximately 147.5 nm. Each pair may comprise a low index layer which may comprise $SiO_2$, and a high index layer comprising $Nb_2O_5$. As described above, non-limiting examples of alternative low index layers may be formed of quartz, LiF, or $MgF_2$. A non-limiting example of an alternative high index layer may be formed of $TiO_2$. The low index layer in such a case may be formed adjacent to, or on top of, the cathode layer 1734, which will have a relatively high index of refraction. Each pair will be formed upon the previous pair such that the high index layer is formed adjacent to, or upon, the low index layer, thus for example upon cathode layer 1734, photonic crystal 1722 may continue by sputtering one approximately 147.5 nm layer of $SiO_2$ then sputtering one approximately 147.5 nm layer of $Nb_2O_5$, and repeating this two more times, such that this final result comprises a single photonic crystal 1722 an uppermost layer having a high index of refraction.

In another alternative exemplary embodiment, exemplary photonic crystal, e.g. 1720, may instead be formed as follows. Beginning with transparent substrate 1762 comprising glass or plastic. Two successive pairs of layers of dielectric material having alternating high and low (relative to each other) index of refraction, each layer 162 nm in optical thickness may be formed on the substrate. Each pair may comprise a high index layer comprising $TiO_2$ and a low index layer which may comprise $SiO_2$. Non-limiting examples of alternative low index layers may be formed of LiF, or $MgF_2$. A non-limiting example of alternative high index layers may be formed of $Nb_2O_5$. The high index layer in such a case may be formed adjacent to the substrate, which comprising glass or plastic will have a relatively low index of refraction. Each pair will be formed upon the previous pair such that the high index layer is formed adjacent to, or upon, the low index layer, thus for example upon substrate 1762, photonic crystal 1722 may be formed first sputtering one 73.4 nm layer of $TiO_2$ (optical thickness of 162 nm based on a measured refractive index of 2.206) then sputtering one 110.7 nm layer of $SiO_2$ (optical thickness of 162 nm based on a measured refractive index of 1.463), and repeating this one more time, such that this intermediate result comprises an uppermost layer having a low index of refraction.

As in the previous embodiment described above, upon this intermediate result may be formed anode 1732, for example anode 1732 may be a transparent inorganic semiconductor anode comprising a 82.4 nm thick layer of $In_2O_3$—ZnO (indium-zinc oxide, IZO) (optical thickness of 162 nm based on a measured refractive index of 1.966). Alternatively the anode 1732 may comprise a layer of optical thickness 162 nm comprising approximately 10% $ZnO_2$ and 90% $In_2O_3$. Upon this anode 1732 may be formed an active layer 1728 having a total optical thickness of 162 nm comprising, for example, the various organic and other low refractive index materials constituting the OLED, such that the index of refraction of active layer 1728 is lower than the index of refraction of the anode 1732.

Continuing the example immediately above, active zone 1728 may be formed for example by thermal evaporation of the various constituent layers, which in this case may comprise: a thermally evaporated layer of N,N'-Bis(-77-aphthalene-1-yl)-N,N'-bis(phenyl)-benzidine (NPB) (for instance, 20 nm in physical thickness equivalent to an optical thickness of 35 nm based on a measured refractive index of 1.748) which functions as a hole injection and transporting layer; followed by a 5.0 nm thick thermally evaporated layer of 4,4',4"-tri(N-carbazoyl)triphenylamine (TcTa) (9.0 nm in optical thickness based on a refractive index of 1.807) which material functions as a triplet blocking material; a 15.0 nm thick layer of thermally evaporated 9-(3-(3,5-di(pyridine-2-yl)-1H-1,2,4-triazol-1-yl)phenyl-9H-carbazole (m-CBTZ) doped with 10% bis(2-phenylbenzothiazolato)(acetylacetonato)iridium (III) ($Ir(bt)_2(acac)$) (29.0 nm in optical thickness based on a refractive index of 1.935) which material functions as the emissive material; a 51.4 nm thick layer of TPBi (87.8 nm in optical thickness based on a refractive index of 1.708) which functions as an electron transport layer; and a 0.5 nm layer of lithium fluoride (0.7 nm in optical thickness based on a refractive index of 1.391), which functions as an electron injection layer. Therefore the active zone 1728 contains organic layer 1730. The two constraints on active zone 1728 in this exemplary embodiment are that it have a thickness of approximately 162 nm, and the index of refraction of the constituent layers are each respectively lower than the index of refraction of the anode layer 1732. One or more additional functional (for instance, metal and electron injection layers of the cathode) or non-functional layers may act as spacers if necessary to achieve the necessary thickness of active zone 1728. Upon completion of this intermediate result, the photonic crystal 1722 comprises a substrate having a relatively low index of refraction, two alternating pairs of alternating dielectric layers of respectively high and low index of refraction, an anode layer having a high index of refraction and an active zone having a low index of refraction, where each layer of the intermediate result is approximately 162 nm in thickness.

Continuing the example immediately above, a first 0.5 nm cathode layer (not illustrated) formed from a 50:50 mixture of samarium and silver by vacuum thermal evaporation may be deposited on top of the lithium fluoride. This layer has an optical thickness of 0.5 nm. A second cathode layer, for example 1734, may be formed upon the first cathode layer. The second cathode layer 1732 has an optical thickness of approximately 162 nm thick may be fabricated from sputtered IZO or another transparent conductive oxide. The second cathode layer 1734 has a relatively high index of refraction when compared with the materials comprising the active zone 1728, as well as having a high index of refraction when compared with $SiO_2$, or its alternatives.

Upon the cathode layer three successive pairs of layers of dielectric material having alternating low and high index of refractions may be deposited, each with an optical thickness of approximately 162 nm. Each pair may comprise a low index layer which may comprise $SiO_2$, and a high index layer comprising $TiO_2$. As described above, non-limiting examples of alternative low index layers may be formed of LiF, or $MgF_2$. A non-limiting example of an alternative high index layer may be formed of $Nb_2O_5$. The low index layer in such a case may be formed adjacent to, or on top of, the cathode layer 1734, which will have a relatively high index of refraction. Each pair will be formed upon the previous pair such that the high index layer is formed adjacent to, or upon, the low index layer, thus for example upon cathode layer 1734, photonic crystal 1722 may continue by sputtering one approximately 162 nm layer of $SiO_2$ then sputtering one approximately 162 nm layer of $Nb_2O_5$, and repeating this two more times, such that this final result comprises a single photonic crystal 1722 an uppermost layer having a high index of refraction.

In the exemplary embodiments disclosed above, one of skill in the art will appreciate that light will be emitted from each "end", or surface 1726, of the photonic crystal, 1722, and approximately parallel to the transmission axis 1736. To configure the device to emit from only one end, a mirror or reflector needs to be placed on one end. When metallic mirrors are used allowance should be made for the phase shift that occurs upon reflection from a metallic surface, for example, by increasing the thickness of the adjacent layer. Alternatively it will be within the skill of one skilled in the art, to simply increasing the number of high-index/low-index dielectric pairs at one end of the device until no light or very little light is emitted from that respective end.

One of skill in the art will appreciate that small changes in the phase of light caused by the metallic cathode, various layer boundaries, and unknown or uncontrollable variations in the indices of refraction may require tuning of the thicknesses in various components. These variations will occur on a determinate basis, and therefore given the chosen materials one can tune the thicknesses of one or more layers, such as a layer of TBP, to correct for these minor variations. Additionally, when sputtering ITO and IZO, variations in the index of refraction will occur in these materials, which can also be accounted for by tuning the physical thickness in order to achieve the correct optical thickness.

The light that is emitted from the photonic crystal structures of the inventive devices propagates in the direction normal to plane of the device (parallel to the transmission axis 1704). The electric vectors associated with this light are therefore all oriented parallel to the plane of the device. This means that this light will only stimulate emission from those excited state molecules having transition moments with components substantially in the plane of the device. Energy that is used to excite molecules whose transition moments are substantially perpendicular to the plane of the device may therefore is lost to in-plane light emission or non-radiative relaxation mechanisms. For this reason, host-dopant mixtures in which an anisotropic host preferentially aligns the transition moments of the emissive dopants in the plane of the device are preferred. An example is CBP doped with Ir(ppy)$_2$(acac).

Figure 18:
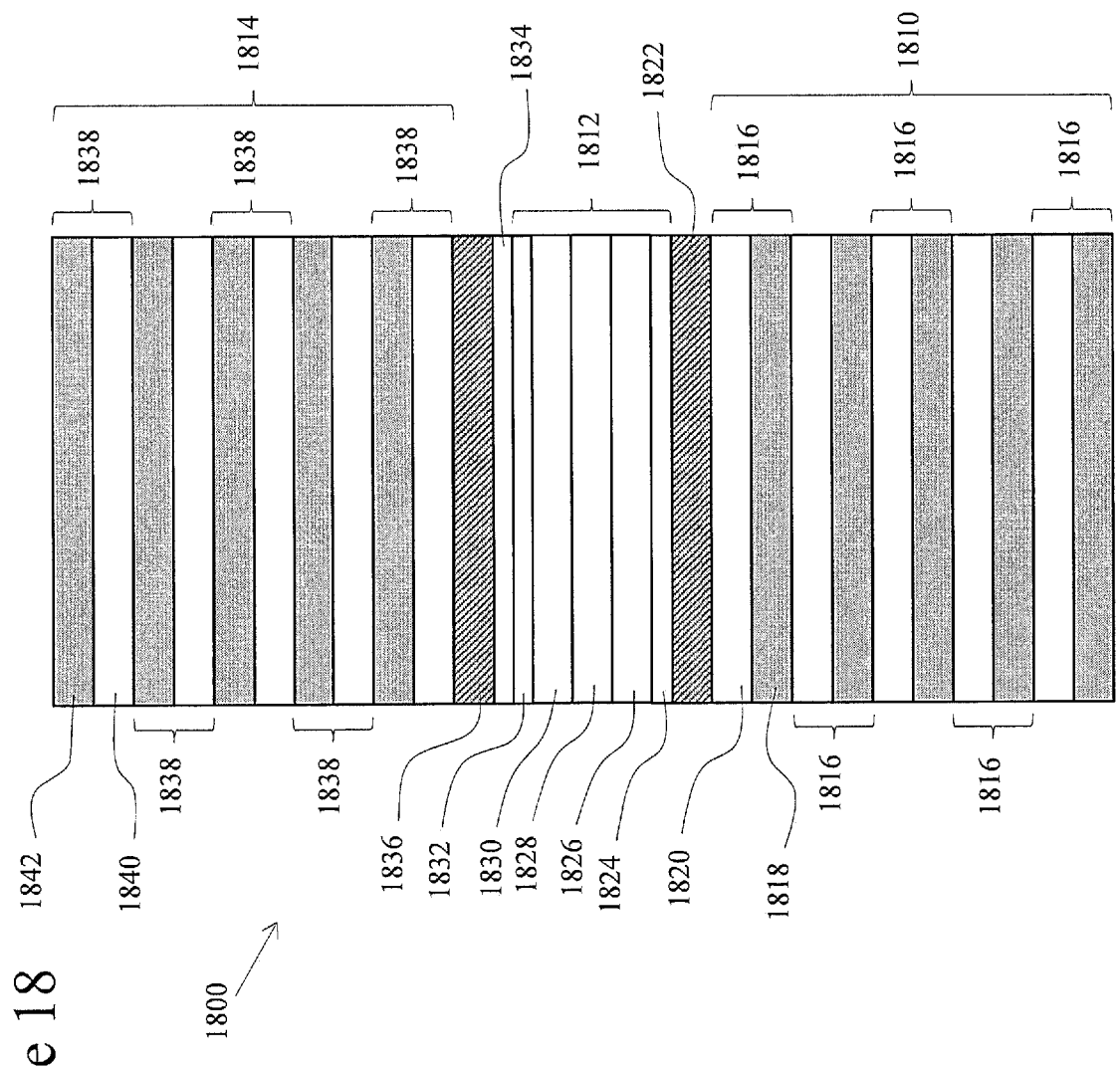
FIG. 18 illustrates various embodiments of the present invention.

One of skill in the art will also appreciate that various other aspects may have different layer compositions. Various additional embodiments of a disclosed device 800 are portrayed in FIG. 18. The shown embodiments may comprise a photonic crystal having a band-gap, and be formed of alternating high index of refraction dielectric materials and low index of refraction dielectric materials capable of producing a periodically varying refractive index, and an OLED containing an emitter material whose free space electroluminescence emission yields a significantly high radiance at the band-edge wavelengths, that is to say, a radiance that when measured normal to the device surface is preferably at least 25% and most preferably at least 50% of the radiance at the peak spectral electroluminescence for the material. In other words, the measured radiance of luminescence light emitted by the light emitting material utilized in the organic light emitting diode is greater than one-quarter of the peak radiance of the luminescence emission spectrum of the emitter material measured normal to its light emitting surface. The device comprises three sub-structures: a first portion of the photonic crystal structure 1810, a central low refractive index zone 1812, and a second portion of the photonic crystal structure 1814. The references to "a portion" are meant as convention to ease the description of components of 1800 which is formed to be a single unitary photonic crystal. Aside from these three sub-structures the devices described by FIG. 18 may also comprise a transparent anode 1822, a thin first cathode layer 1834 composed of a low work function metal, and a second transparent cathode layer 1836. The transparent anode 1822 may be fabricated from any suitable transparent conductive material such as indium-tin oxide or indium-zinc oxide. The first cathode layer may be fabricated from thin, transparent film of any suitable low work function metal, for instance aluminum, a magnesium/silver alloy, silver/rare earth alloy or a pure rare earth metal such as samarium or ytterbium. The second cathode layer 1836 may be fabricated from any suitable transparent conductive material such as indium-tin oxide. A second metal layer may also optionally be inserted between layers 1834 and 1836, for instance, if the materials in 1834 and 1836 are not compatible with each other.

The first portion of the photonic crystal structure 1810 may comprise multiple (in this non-limiting example five, but can be more or less) layer pairs 1816. Each of the layer pairs is comprised of a layer 1818 of a transparent high refractive index material and a layer 1820 of a transparent low refractive index material. Each of the layers that comprise the layer pairs 1816 have an optical thickness equal to one-quarter of the central wavelength of the stop-band of the photonic crystal sub-structure 1810. Optical thickness being equal to the physical thickness of the layer times the refractive index of the layer. The second portion of the photonic crystal structure 1814 may comprise multiple (in this non-limiting example five, but can be more or less) layer pairs 1838. Each of the layer pairs may comprise a layer 1840 of a transparent low refractive index material and a layer 1842 of a transparent high refractive index material. Each of the layers that comprise the layer pairs 1838 may have an optical thickness equal to about one-quarter of the central wavelength of the stop-band of the photonic crystal sub-structure 1814 which is in turn equal to that of photonic crystal sub-structure 1810.

The central low refractive index zone 1812 may comprise a hole injection layer 1824, a hole transporting layer 1826, an emitter layer 1828, an electron transporting layer 1830, and an electron injection layer 1832. All of the layers contained in the central low refractive index zone 1812 have refractive indices lower than those of electrodes 1822 and 1836 and the total optical thickness of all the layers contained in zone 1812 is equal to one-quarter of the central wavelength of the stopbands of the photonic crystal sub-structure 1810 and 1814. In various embodiments they emitter layer 1828 comprises an emitter material having a emission spectrum and an absorption spectrum, and the band-gap is tailored (by altering the optical thickness of each layer of the device, or more generally by altering the physical length of the spatial period of the periodic refractive index profile) such that the peak radiance wavelength of the band-edge light emission at the band-edge of the band-gap and measured normal to the device surface is a wavelength at which free space light emission of the emitter material is preferably greater than ¼ and most preferably greater than ½ the peak radiance of the emitter. The emitter material whose free space electroluminescence emission yields a significantly high radiance at the band-edge wavelengths, that is to say, a radiance that is preferably at least 25% and most preferably at least 50% of the radiance at the peak spectral electroluminescence for the material.

Electrode layers 1822 and 1836 may have refractive indices that are not only higher than the materials in the central low refractive index zone 1812, but they may also have refractive indices that are higher than adjacent layers 1820 and 1840 respectively. Electrode layers 1822 and 1836 may also have optical thickness equal to one-quarter of the central wavelength of the stop-band of the photonic crystal sub-structure 1814 and 1816. Cathode layer 1834 may be extremely thin and generally has a negligible effect on the optical thickness of cathode 1836, but should be counted as part of either central low index zone 1812 or cathode layer 1836 (which ever of the two its index is closer to) in terms of optical design. In this way the sequence of layers 1820, 1822, 1812 (composite layer), 1836, and 1840 may yield the low/high/low/high/low alternation of refractive indices required for inclusion in a photonic crystal. Thus it can be seen that sub-structures 1810, 1812, 1814 and layers 1822 and 1836 all may as a unitary combination form a single photonic crystal structure 1800.

When device 1800 is electrically activated, holes flow from anode 1822 through hole injection layer 1824 and hole transporting layer 1826 into emitter layer 1828. At the same time electrons flow from cathode layers 1834 and 1836 through electron injection layer 1832 and electron transporting layer 1830 into emitter layer 1828. The electrons and holes recombine on luminescent material molecules in layer 1828 yielding excitons. Since emitter layer 1828 may be inside a photonic crystal structure, excitons created in that layer cannot emit light at wavelengths in the stop-band of the photonic crystal. However, where the emission band of the luminescent material in layer 1828 overlaps the band-edge wavelengths of the stop-band, light emission does occur and because of the high density of states at those wavelengths unusually high levels of emission occur. The photonic crystal traps the light from band-edge emission within its structure increasing the photon density to the point where there are sufficient photons interacting with excitons that nearly all light emission is stimulated emission. There is, however, by design and usually because of the nature of the materials involved insufficient laser gain in the organic materials to support lasing at current levels achievable in these devices. Since the light from stimulated emission is almost completely vertical in its direction of propagation within the device, there is very little loss due to internal reflection and trapping of light and the device is as a result highly energy efficient.

The nature and number of the layers comprising central low refractive index zone 1812 may be altered so long as there is a emitter layer present that may be electrically activated to emit light and as long as the emission spectrum of that emitter material contain wavelengths that overlap the stop-band of the photonic crystal. For instance, the functions of hole injection layer 1824 and hole transporting layer may be combined into a separate single layer. The functions of electron injection layer 1832 and electron transporting layer 1830 may be combined into a separate single layer. Additional hole transporting or electron transporting as well as hole blocking, electron blocking, and triplet blocking layers may be introduced.

The photonic crystal structures in device 1800 may be built up a layer at a time as are the functional OLED layers of the device. Thus the photonic crystal structures may have a discontinuous periodic refractive index profile.

In some cases the proper electrical functioning of the device 1800 may require that the total thickness of central low refractive index zone 1812 be greater than one-quarter the desired central wavelength of the stop-band of the photonic crystal 1800. For instance, this issue may, but not necessarily, occur in devices that are designed to produce blue or violet light, or any other color. If this is the case, the thickness of central low refractive index zone 1812 may total three quarters of the central wavelength of the stop-bands of the photonic crystal sub-structures 1810 and 1814 in optical thickness. One will appreciate that the number of alternating layers can be more or less than those described in FIG. 18, and that the optimum number of layers may differ depending on the application.

Figure 19:
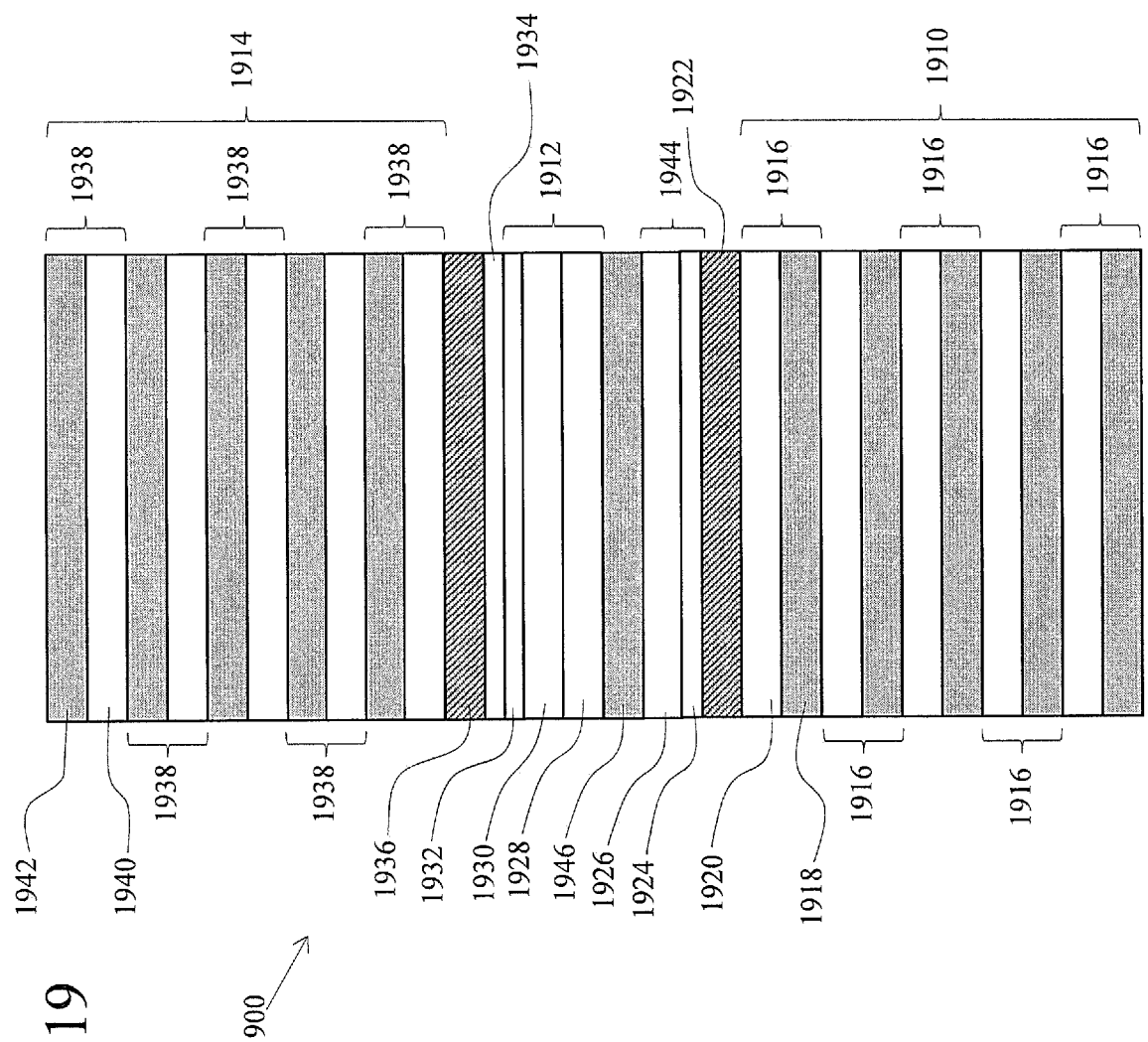
FIG. 19 illustrates various embodiments of the present invention.

Increasing the thickness of zone 1812 to three-quarters of the central stop-band wavelength may not be the best solution for blue or violet emitting devices. Instead an alternative solution is the altered design 1900 as shown in FIG. 19. Device 1900 is quite similar to device 1800 in that there is a first portion of the photonic crystal structure 1910, a central low refractive index zone 1912, and a second portion of the photonic crystal structure 1914 with these three sub-structures corresponding to sub-structures 1810, 1812, and 1814 in device 1800. The difference here is that central low refractive index zone 1912 comprises only emitter layer 1928, electron transporting layer 1930, and electron injection layer 1932. Hole injection layer 1924 combines with hole transporting layer 1926 to compose another low refractive index zone 1944. This low refractive index zone is separated from the central low refractive index zone 1912 by a second hole transporting layer 1946. The material in the hole transporting layer 1946 has a higher refractive index than the materials in zones 1944 and 1912. The combined optical thickness of the layers that compose zone 1912 is equal to one-quarter of the central wavelength of the stop-bands of the photonic crystal sub-structures 1910 and 1914. The combined optical thickness of the two layers that compose zone 1944 is equal to one-quarter of the central wavelength of the stop-bands of the photonic crystal sub-structures 1910 and 1914, and the optical thickness of layer 1946, of anode 1922, and of cathode layer 1936 are each equal to one-quarter of the central wavelength of the stopbands of the photonic crystal sub-structures 1910 and 1914. Thus it can be seen that first portion of the photonic crystal structure 1910, the low refractive index zone 1944, the central low refractive index zone 1912, and the second portion of the photonic crystal structure 1914 combine with layers 1922, 1946, and 1936 to create a single photonic crystal structure. This structure interacts with light emitted by emitter layer 1928 in the same manner as described for device 1800 above.

Figure 20:
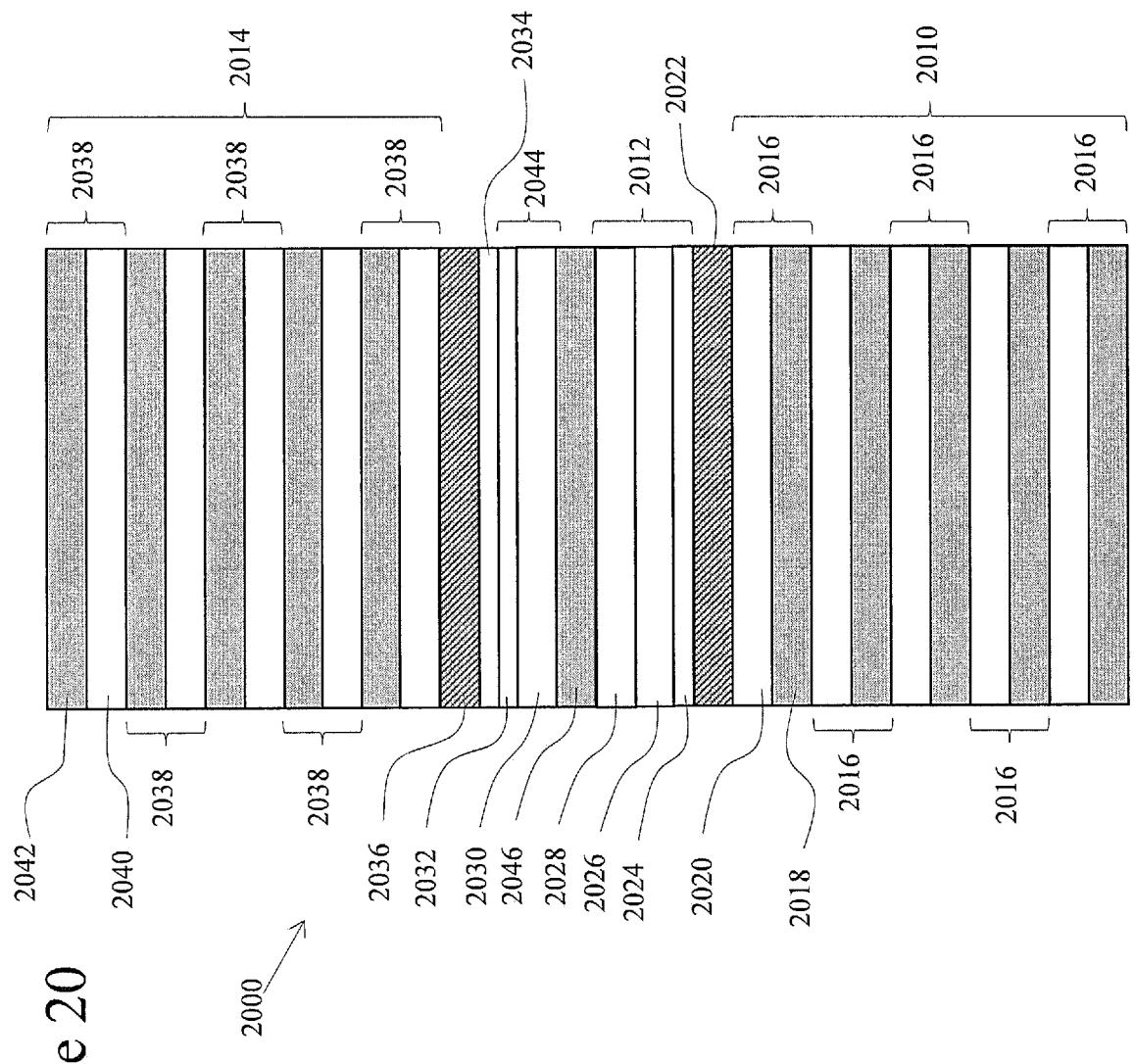
FIG. 20 illustrates various embodiments of the present invention.

Additional alternative embodiments are illustrated by device 2000 that also may solve the potential issues inherent with generating short wavelength light is shown in FIG. 20. This device has a first portion of the photonic crystal structure 2010, a central low refractive index zone 2012, and a second portion of the photonic crystal structure 2014 with these three structures corresponding to structures 1810, 1812, and 1814 in device 1800. The difference in this device is that central low refractive index zone 2012 comprises only emitter layer 2028, hole transporting layer 1930, and hole injection layer 2032. Electron injection layer 2024 combines with electron transporting layer 2026 to compose another low refractive index zone 2044. This low refractive index zone is separated from the central low refractive index zone 2012 by a second electron transporting layer 2046. The material in electron transporting layer 2046 has a higher refractive index than the materials in zones 2044 and 2012. The combined optical thickness of the layers that compose zone 2012 is equal to one-quarter of the central wavelength of the stop-bands of the photonic crystal sub-structures 2010 and 2014. The combined optical thickness of the two layers that compose zone 2044 is equal to one-quarter of the central wavelength of the stop-bands of the photonic crystal sub-structures 2010 and 2014, and the optical thickness of layer 2046, of anode 2022, and of cathode layer 2036 are each equal to one-quarter of the central wavelength of the stop-bands of the photonic crystal sub-structures 2010 and 2014. Thus it can be seen that the first portion of the photonic crystal structure 2010, low refractive index zone 2044, central low refractive index zone 2012, and the second portion of the photonic crystal structure 2014 combine with layers 2022, 2046, and 2036 to create a single photonic crystal structure. This structure interacts with light emitted by emitter layer 2028 in the same manner as described for device 1800 above.

Devices such as 1800, 1900, and 2000 are unlike known devices because they are incapable of producing laser light, have no micro-cavity in which light generation occurs, utilize stop-band edge stimulated emission, and have photonic crystals with discontinuous refractive index profiles. At the present time this may be the only combination of device properties that enables the production of commercially feasible OLED devices with very high energy efficiency.

Figure 21:
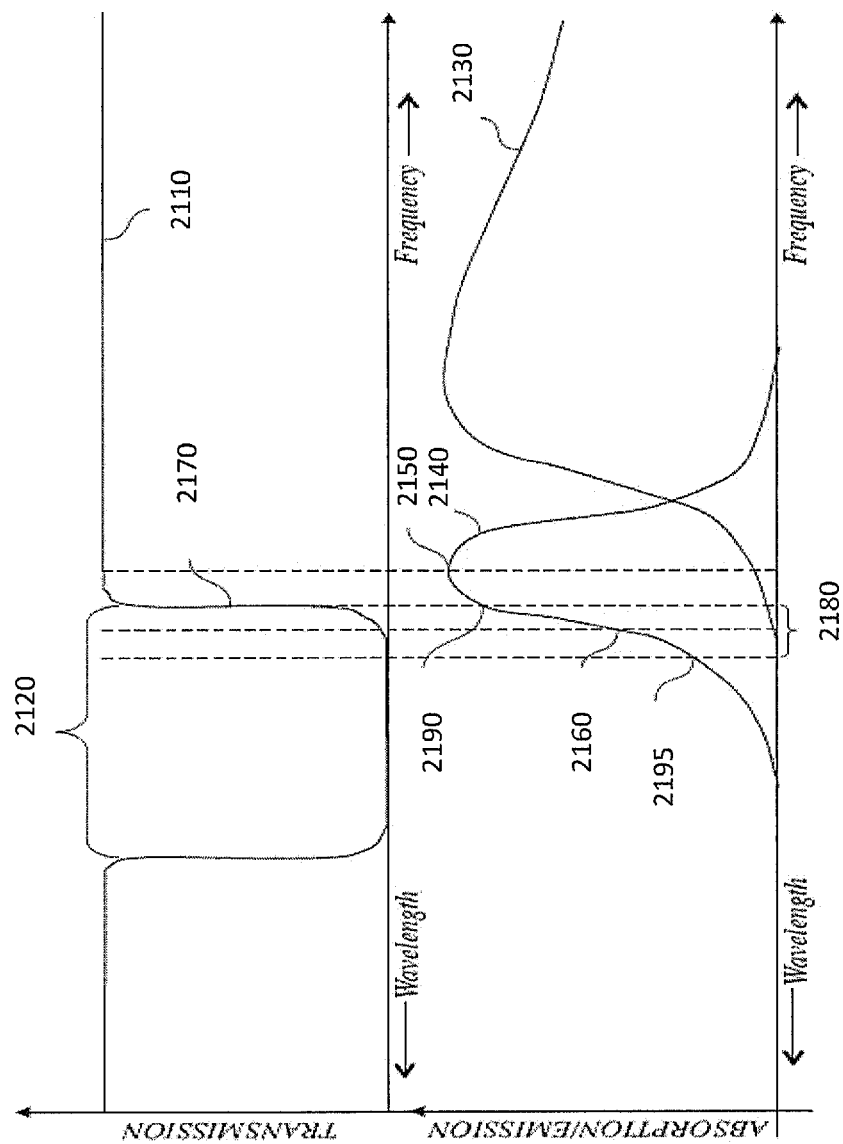
FIG. 21 illustrates design considerations of a band-edge emitting photonic structure device.

FIG. 21 illustrates how to choose a combination of emitter material and band-gap material. Illustrated is an exemplary transmission spectrum 2110 of a photonic crystal having a band-gap 2120. Also illustrated are the absorption spectrum 2130 and the emission spectrum 2140 of an exemplary emitter material. As is shown the emission spectrum has a peak power, 2150 occurring at $\lambda_{PP}$, a half peak power 2160 occurring at $\lambda_{1/2PP}$, and a one-quarter peak power 2195 occurring at $\lambda_{1/4PP}$. Preferably, to achieve a high efficiency device, the photonic crystal is configured such that an edge of the band-gap 2170 falls between the peak emission wavelength 2150 and the ¼ peak emission wavelength 2195, in a region of the spectrum that overlaps areas of the absorption spectrum 2130 as little as possible, in other words, in a region 2180 where there is low absorption by the emitter material. Most preferably the photonic crystal is configured such that an edge of the band-gap 2170 falls between the peak emission wavelength 2150 and the ½ peak emission wavelength 2160, in a region of the spectrum that overlaps areas of the absorption spectrum 2130 as little as possible, in other words, in a region 2180 where there is low absorption by the emitter material. The band-gap edge 2170 may fall on a wavelength at which light absorption for a single pass of light through the emitter layer is less than 1%. Preferably, the band edge 2170 may fall on a wavelength at which light absorption for a single pass of light through the emitter layer is less than ½%, while also corresponding to a wavelength of the emission spectrum that is greater than ¼ peak radiance, for example 2160. Also, it will be appreciated that the emission spectrum of an emitter material may have more than one peak, and that herein discussions of peak radiance are relative to the region in the spectrum nearby to the band-gap. It will be appreciated that the output light of the disclosed device is determined based on the wavelengths corresponding the band-edge, such that the output spectrum of the device can be tailored by adjusting the layer thicknesses and thus the band-edge wavelengths. Because a first photonic crystal having a stop-band corresponding to one wavelength may be transparent, or substantially transparent to a second photonic crystal having a stop-band that is shifted up or down in the transmission spectrum from the first photonic crystal, a single device capable of emitting band-edge light corresponding to two or more stop-bands may be formed by stacking one or more photonic crystals atop each other.

Often, emitter material molecules in OLED devices have shapes that favor light emission in some directions relative to molecular orientation over others. Because of this, by uniformly aligning the molecules of the emitter material in an emitter layer in a specific orientation, light will be emitted more intensely in some directions relative to the plane of the emitter layer than in others. This is because the molecular orbitals in these molecules may be asymmetric in shape and in terms of their electronic polarizability. Interaction with incident light or emission of light will be strongest when the electric vector of the light lies along the direction of highest electrical polarizability within an orbital. However, since light emission or absorption involves two molecular orbitals, that of the excited and that of the electronic ground state, and since quite often the directions of highest electrical polarizability are different for these two orbitals, the light electric vector direction yielding the highest interaction or emission is intermediate between the directions of highest electron polarizability for the two orbitals. The light electric vector direction that yields the highest interaction is termed the transition moment (or transition dipole moment) since it is the direction of the transient electric dipole induced in the molecule by interaction with the light (or conversely by the direction the transient electric dipole that emits the light). Thus it can be seen that if the emitter molecules are uniformly aligned such that their transition moments are perpendicular to the propagation direction of the feedback light, the efficiency of the interaction between emitter materials and the feedback light is maximized thereby producing maximum stimulated emission. This sort of alignment can be achieved by utilizing rigid anisotropic emitter molecules of the right geometry dissolved in host materials that have rigid rod or disk-shaped molecules that "lay down" on the underlying layer surface thus yielding and anisotropic environment that, in turn, aligns the emitter molecules. Host materials that may exhibit this behavior are 4,4'-bis(carbazol-9-yl)biphenyl (CBP) and N,N'-bis(naphthalene-1-yl)N, N'-bis(phenyl)benzidine (NPB).

Some iridium III organometallic phosphorescent emitter materials may have their molecules spontaneously aligned by some host materials so as to have their transition moments for the desired phosphorescent emission predominantly aligned in the plane of the OLED emissive layer. In particular some heteroleptic iridium III complexes with two ligands comprising aromatic substituted nitrogen containing aromatic compounds and third acetoacetonate ligand have displayed this sort of alignment. Examples of this are bis(2phenylpyridine) (acetylacetonate)iridium(III) dopant in a 4,4'-bis(carbazol-9-yl)biphenyl host and bis(2methyl-dibenzo[f,h]quinoxaline) (acetylacetonate)iridium(III) in N,N'-bis(naphthalene-1-yl)N,N'-bis(phenyl)benzidine.
Anisotropic emitter material formulations such as these can be used advantageously to further increase the energy efficiency of the devices of this invention.

Figure 22:
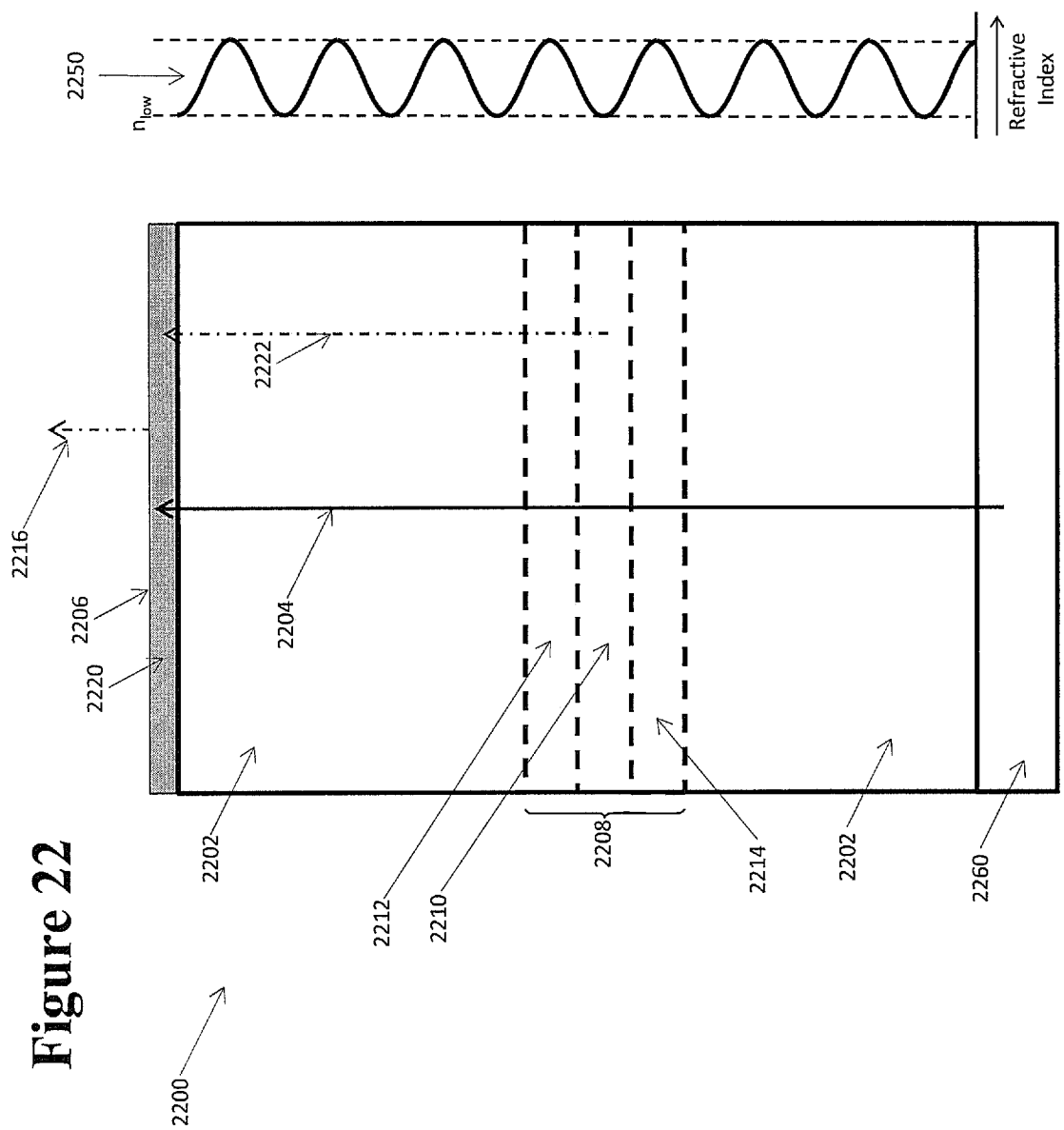
FIG. 22 illustrates various embodiments of the present invention.

FIG. 22 illustrates a cross-sectional view of various embodiments of a light emitting device 2200 in accordance with this disclosure. Light emitting device 2200 comprises a band-edge mode light emitting photonic crystal structure 2202 formed on a substrate 2260 and configured to emit band edge mode light 2222, when electrodes 2212 and 2214 are energized, into photoluminescent structure 2220 such that photoluminescent structure 2220 emits visible light 2216 from emission surface 2206.

Band-edge mode light emitting photonic crystal structure 2202 includes active zone 2208 comprising layers 2210, 2222, 2214 (indicated by the dotted lines), a non-limiting example of which is a DBR, (not illustrated); a transmission axis 2204; an emission surface 2206; and an active zone 2208. Active zone 2208 is disposed or formed within photonic crystal structure 2202 and further comprises an organic layer 2210, an anode 2212, and a cathode 2214. The organic layer further comprises a sublayer comprising an organic electroluminescent material (not shown) and a sublayer comprising a charge transporting material (not shown). The organic layer 2210 may further comprise one or more additional sublayers (not shown) comprising charge carrier transport layers, charge carrier injection layers, charge carrier blocking layers, thus it will be appreciated the organic layer 2210 may contain one or more additional OLED functional layers. It will be appreciated that layers 2210, 2212 and 2214 together comprise an OLED. As will be appreciated anode 2212 and cathode 2214 may each be a single electrode or alternatively may further comprise multiple layers of electrodes (not pictured). Active zone 2208 is formed such that the periodically varying index of refraction 2250 along transmission axis 2204 of the photonic structure is not disrupted, or is substantially not disrupted.

Preferably, the organic layer 2210 has a maximum optical thickness of approximately ¼ of a single wavelength corresponding the central wavelength prohibited within the photonic structure by the stop-band created by the periodic index of refraction 2250 (here the periodic index of refraction is illustrated as a sinusoid, alternatively it may be closer to or substantially a square wave, or some other substantially periodically varying index of refraction). If an optical thickness of ¼ wavelength is impractical for a particular embodiment, the optical thickness of the organic layer 2210 may be equal to approximately ¾ of the central wavelength of the stop-band. The optical thickness of each of layers 2212 and 2214 is approximately ¼ of the central wavelength of the stop-band. When activated by a potential applied across anode 2212 and cathode 2214 the organic emitter molecules are excited and photons are emitted into the band-edge modes of the photonic crystal. As a result, visible band-edge mode light 2222 is emitted into the photoluminescent structure 2220 causing visible light 2216 having a desired color to be emitted from the emission surface 2206 at wavelengths dictated by the photoluminescent material comprising the photoluminescent structure 2220. Preferably, the molecules of the organic emitter material within the organic layer 2210 are spatially oriented to maximize stimulated emission parallel to the transmission axis 2204. As will be appreciated, when properly formed, the device 2200 being of a photonic structure having a stop-band, the density of states spectrum will exhibit a large number of nodes in the band edge regions around the stop-band of the photonic crystal.

Figure 23:
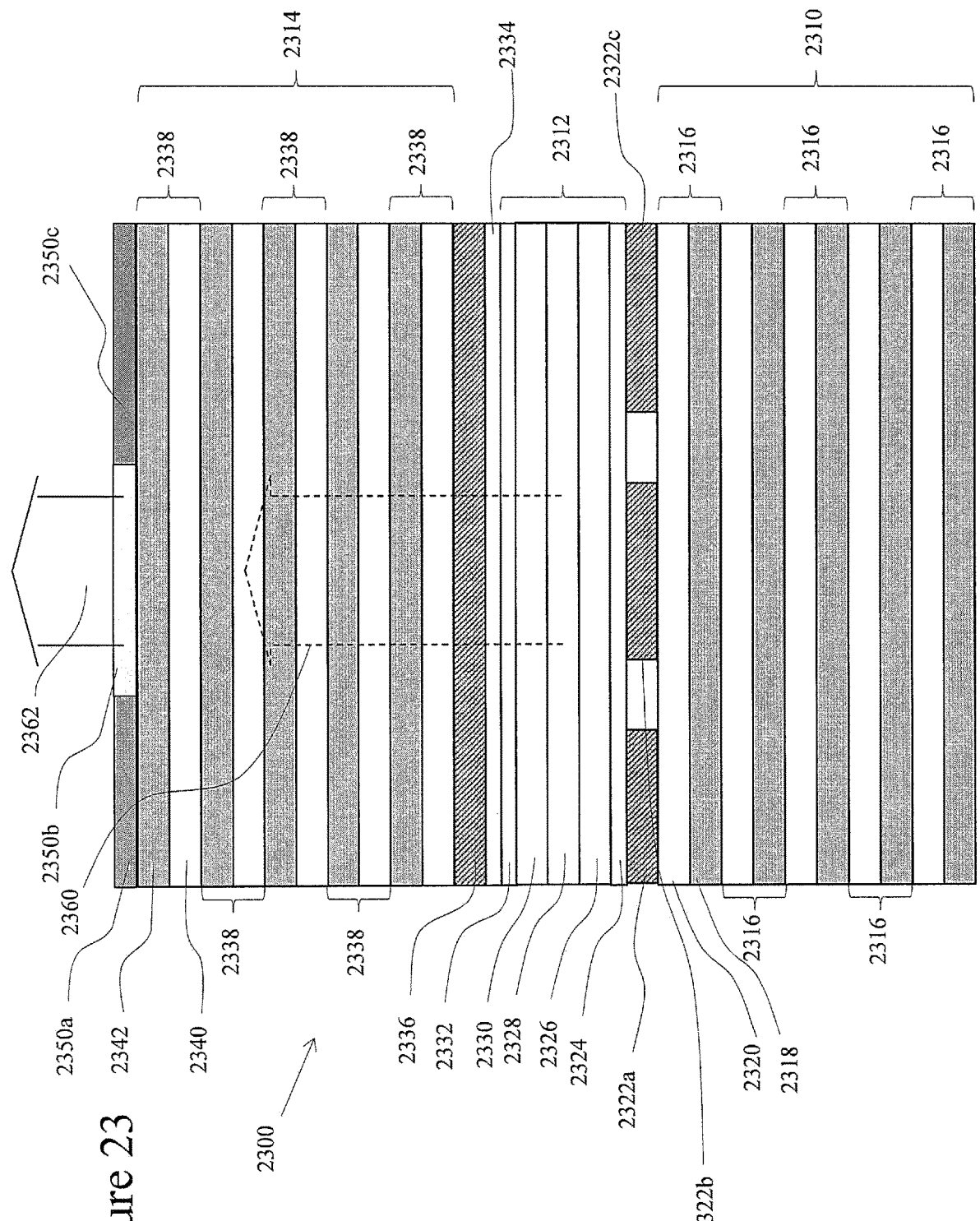
FIG. 23 illustrates various embodiments of the present invention.

Various additional embodiments in accordance with the present invention are disclosed in FIG. 23. In particular, a light emitting device 2300 comprises a band edge emitter. The shown embodiments may comprise a photonic crystal having a band-gap, and be formed of alternating high index of refraction dielectric materials and low index of refraction dielectric materials capable of producing a periodically varying refractive index, and an OLED containing an emitter material whose free space electroluminescence emission yields a significantly high radiance at the band-edge wavelengths, that is to say, a radiance that when measured normal to the device surface is preferably at least 25% and most preferably at least 50% of the radiance at the peak spectral electroluminescence for the material. In other words, the measured radiance of luminescence light emitted by the light emitting material utilized in the organic light emitting diode is greater than one-quarter of the peak radiance of the luminescence emission spectrum of the emitter material measured normal to its light emitting surface. The device comprises three sub-structures: a first portion of the photonic crystal structure 2310, a central low refractive index zone 2312, and a second portion of the photonic crystal structure 2314. The references to "a portion" are meant as convention to ease the description the components of 2300 which is formed to be a single unitary photonic crystal. Aside from these three sub-structures the devices described by FIG. 23 may also comprise transparent anodes 2322a, 2322b and 2322c, a first cathode layer 2334 and a second cathode layers 2336. These cathode layers are depicted from the side, and represent a cathode structure, a plurality of these cathode structures comprising first cathode layers 2334 and second cathode layers 2336 may be patterned extending back from the plane of FIG. 7. The transparent anodes 2322a, 2322b, and 2322c may be fabricated from any suitable transparent conductive material such as indium-tin oxide or indium-zinc oxide. The first cathode layer 2334 may be fabricated from a thin, transparent film of any suitable low work function metal, for instance aluminum, a magnesium/silver alloy, silver/rare earth alloy or a pure rare earth metal such as samarium or ytterbium. The second cathode layer 2336 may be fabricated from any suitable transparent conductive material such as indium-tin oxide. A second metal layer may also optionally be inserted between layers 2334 and 2336, for instance, if the materials in 2334 and 2336 are not compatible with each other.

The first portion of the photonic crystal structure 2310 may comprise multiple (in this non-limiting example five, but can be more or less) layer pairs 2316. Each of the layer pairs is comprised of a layer 2318 of a transparent high refractive index material and a layer 2320 of a transparent low refractive index material. Each of the layers that comprise the layer pairs 2316 have an optical thickness equal to one-quarter of the central wavelength of the stop-band of the photonic crystal sub-structure 2310. Optical thickness being equal to the physical thickness of the layer times the refractive index of the layer. The second portion of the photonic crystal structure 2314 may comprise multiple (in this non-limiting example five, but can be more or less) layer pairs 2338. Each of the layer pairs may comprise a layer 2340 of a transparent low refractive index material and a layer 2342 of a transparent high refractive index material. Each of the layers that comprise the layer pairs 2338 may have an optical thickness equal to about one-quarter of the central wavelength of the stop-band of the photonic crystal sub-structure 2314 which is in turn equal to that of photonic crystal sub-structure 2310.

The central low refractive index zone 2312 may comprise a hole injection layer 2324, a hole transporting layer 2326, an emitter layer 2328, an electron transporting layer 2330, and an electron injection layer 2332. All of the layers contained in the central low refractive index zone 2312 have refractive indices lower than those of electrodes, such as anodes 2322a, 2322b, and 2322c, as well as of the filler material between the anodes, and 2336 and the total optical thickness of all the layers contained in zone 2312 is equal to one-quarter of the central wavelength of the stopbands of the photonic crystal sub-structure 2310 and 2314. (The layers of the embodiments described by FIG. 23 are not drawn to scale). In various embodiments the emitter layer 2328 comprises an emitter material having a emission spectrum and an absorption spectrum, and the band-gap is tailored (by altering the optical thickness of each layer of the device, or more generally by altering the physical length of the spatial period of the periodic refractive index profile) such that the peak radiance wavelength of the band-edge light emission at the band-edge of the band-gap and measured normal to the device surface is a wavelength at which free space light emission of the emitter material is preferably greater than ¼ and most preferably greater than ½ the peak radiance of the emitter. The emitter material whose free space electroluminescence emission yields a significantly high radiance at the band-edge wavelengths, that is to say, a radiance that is preferably at least 25% and most preferably at least 50% of the radiance at the peak spectral electroluminescence for the material.

Electrodes in layers 2322 and 2336 may have refractive indices that are not only higher than the materials in the central low refractive index zone 2312, but they may also have refractive indices that are higher than adjacent layers 2320 and 2340 respectively. Electrode layers 2322 and 2336 may also have optical thickness equal to one-quarter of the central wavelength of the stop-band of the photonic crystal sub-structure 2314 and 2316. Cathode layer 2334 may be extremely thin and generally has a negligible effect on the optical thickness of cathode 2336, but should be counted as part of either central low index zone 2312 or cathode layer 2336 (which ever of the two its index is closer to) in terms of optical design. In this way the sequence of layers 2320, 2322, 2312 (composite layer), 2336, and 2340 may yield the low/high/low/high/low alternation of refractive indices required for inclusion in a photonic crystal. Thus it can be seen that sub-structures 2310, 2312, 2314 and layers 2322 and 2336 all may as a unitary combination form a single photonic crystal structure 2300.

When device 2300 is electrically activated, holes flow from anodes 2322a, 2322b, and 2322c through hole injection layer 2324 and hole transporting layer 2326 into emitter layer 2328. At the same time electrons flow from cathodes in layers 2334 and 2336 through electron injection layer 2332 and electron transporting layer 2330 into emitter layer 2328. The electrons and holes recombine on luminescent material molecules in layer 2328 yielding excitons in the region of emitter material between excited anodes and cathodes. Since emitter layer 2328 is inside a photonic crystal structure, excitons created in that layer cannot emit light at wavelengths in the stop-band of the photonic crystal. However, where the emission band of the luminescent material in layer 2328 overlaps the band-edge wavelengths of the stop-band, light emission does occur and because of the high density of states at those wavelengths unusually high levels of emission occur. The photonic crystal traps the light from band-edge emission within its structure increasing the photon density to the point where there are sufficient photons interacting with excitons that nearly all light emission is stimulated emission. There is, however, by design and usually because of the nature of the materials involved insufficient laser gain in the organic materials to support lasing at current levels achievable in these devices. Since the light from stimulated emission is almost completely vertical in its direction of propagation within the device, there is very little loss due to internal reflection and trapping of light, providing for efficient delivery of light, for example band-edge mode light 2360, into the photoluminescent structures 2350a, 2350b and 2350c. This in turn causes the desired color light to be emitted from one or more photoluminescent structures, for example light 2362 emitted from 2350b.

The nature and number of the layers comprising central low refractive index zone 2312 may be altered so long as there is a emitter layer present that may be electrically activated to emit light and as long as the emission spectrum of that emitter material contain wavelengths that overlap the stop-band of the photonic crystal. For instance, the functions of hole injection layer 2324 and hole transporting layer may be combined into a separate single layer. The functions of electron injection layer 2332 and electron transporting layer 2330 may be combined into a separate single layer. Additional hole transporting or electron transporting as well as hole blocking, electron blocking, and triplet blocking layers may be introduced.

The photonic crystal structures in device 2300 may be built up a layer at a time as are the functional OLED layers of the device. Thus the photonic crystal structures may have a discontinuous periodic refractive index profile.

In some cases the proper electrical functioning of the device 2300 may require that the total thickness of central low refractive index zone 2312 be greater than one-quarter the desired central wavelength of the stop-band of the photonic crystal 2300. For instance, this issue may, but not necessarily, occur in devices that are designed to produce red light or any other color. If this is the case, the thickness of central low refractive index zone 2312 may total three quarters of the central wavelength of the stop-bands of the photonic crystal sub-structures 2310 and 2314 in optical thickness. One will appreciate that the number of alternating layers can be more or less than those described in FIG. 23, and that the optimum number of layers may differ depending on the application.

The embodiments described above are illustrative examples and it should not be construed that the present invention is limited to these particular embodiments. For example, although OLED devices were used as examples of emissive devices, other luminescent material or structures may be used, not limited to OLEDs. Further, although refractive index profiles, direction of light, etc. were described as being "normal" to a plane, it should be understood that they need not be exactly normal, rather in a close range of being normal or substantially normal. Accordingly, the embodiments described in this application also may include cases in which they are about normal or substantially normal to a plane. Further, various components and aspects described with reference to different embodiments are interchangeable among different embodiments, and are not limited to one particular embodiment. Thus, various changes and modifications may be effected by one skilled in the art without departing from the spirit or scope of the invention as defined in the appended claims.

While the present invention has been particularly shown and described with reference to example embodiments thereof, it will be understood by those of ordinary skill in the art that various changes in form and details may be made therein without departing from the spirit and scope of the present invention as defined by the following claims and equivalents thereof. It is therefore desired that the present embodiments be considered in all respects as illustrative and not restrictive, reference being made to the appended claims and equivalents thereof rather than the foregoing description to indicate the scope of the invention.

We claim:

1. An active matrix light emitting display comprising:
    a single light emitting photonic crystal with a periodic variation of the index of refraction comprising:
        a distributed Bragg reflector (DBR) having a stop-band;
        an anode layer comprising a plurality of individual selectively energizable anodes;
        a cathode layer comprising a plurality of individual selectively energizable cathodes;
        a light emitting layer configured to emit light having an emission spectrum a portion of which overlaps the stop-band, wherein the light emitting layer is disposed within a single layer, wherein the single layer of the of the DBR in which the emitter layer is disposed has an optical thickness of about (2n+1)

$\lambda_{emit}/4$, wherein n=0, 1, 2, or 3 and $\lambda_{emit}$ is the central wavelength of the stop band of the stop band of the DBR; and
a photoluminescent layer disposed upon the single light emitting photonic crystal, the photoluminescent layer comprising a plurality of photoluminescent pixels, wherein a selected anode and a selected cathode are energizable causing a portion of the light emitting layer to emit light in band-edge modes of the single light emitting photonic crystal thereby photoexciting selected ones of the plurality of photoluminescent pixels.

2. The active matrix light emitting display of claim 1, wherein the light emitting layer comprises an organic electroluminescent material.

3. The active matrix light emitting display of claim 1, wherein the anode layer, the cathode layer, and the light emitting layer do not interrupt the continuously periodic variation of the single light emitting photonic crystal's index of refraction.

4. The active matrix light emitting display of claim 3, wherein the light emitting layer comprises an organic electroluminescent material.

5. The active matrix light emitting display of claim 4, wherein the organic electroluminescent material is localized in a zone having less than 10% of an optical thickness of the single light emitting photonic crystal.

6. The active matrix light emitting display of claim 5, wherein the single light emitting photonic crystal has a band-gap, and wherein the organic electroluminescent material has a free space emission spectrum that least in part overlaps the band-gap of the single light emitting photonic crystal.

7. The active matrix light emitting display of claim 6, wherein the single light emitting photonic crystal emits light at a wavelength corresponding to an edge of the band-gap.

8. The active matrix light emitting display of claim 7, wherein the edge of the band-gap occurs at a wavelength at which the measured radiance of luminescent light emitted by the organic electroluminescent material in free space is greater than one-quarter of a peak radiance in free space of the luminescence emission spectrum of the organic electroluminescent material.

9. A light emitting device comprising:
a single light emitting photonic crystal formed of a stack of layers, the single light emitting photonic crystal having a continuously periodically varying index of refraction in a light transmission direction;
an organic electroluminescent emitter material disposed within a layer of the photonic crystal and formed such that the period of the index of refraction variation is continuous through the layer containing the organic electroluminescent material; and
a photoluminescent material disposed upon a surface of the light emitting photonic crystal, such that light emitted by the light emitting photonic crystal at wavelengths corresponding to band-edge light emissions causes photoexcitation within the photoluminescent material; and
wherein the single layer comprised by the photonic crystal in which the emitter layer is disposed has a thickness that is equal to one-quarter or three-quarters of the central wavelength of the stop-band.

10. The light emitting device of claim 9, wherein the organic electroluminescent emitter material comprises an organic light emitting material is localized in a zone having less than 10% of an optical thickness of the photonic crystal.

11. The light emitting device of claim 10, wherein the light emitting photonic crystal has a band-gap, wherein the organic electroluminescent emitter material has a free space emission spectrum that least in part overlaps the band-gap of the photonic crystal.

12. The light emitting device of claim 11, wherein the photonic crystal emits light at a wavelength corresponding to an edge of the band-gap.

13. The light emitting device of claim 12, wherein the edge of the band-gap occurs at a wavelength at which a measured radiance of luminescent light emitted in free space by the electroluminescent emitter material is greater than one-quarter of a peak radiance of the free space luminance emission spectrum of the emitter material.

14. An active matrix light emitting display comprising:
a first layer containing a plurality of organic light emitting diodes that each include:
a distributed Bram reflector (DBR) having a stop-band;
a light emitting layer configured to emit light having an emission spectrum a portion of which overlaps the stop-band, wherein a light emitting layer is disposed within a single layer of the of the DBR having an optical thickness of about $(2n+1)\lambda_{emit}/4$, wherein n=0, 1, 2, or 3 and $\lambda_{emit}$ is the central wavelength of the stop band of the stop band of the DBR; and
a photoluminescent layer disposed upon the first layer, the photoluminescent layer comprising a plurality of photoluminescent pixels, wherein the plurality of organic light emitting diodes that emit light at the band-edges of a plurality of photonic crystals are energizable, respectively, to photoexcite, respectively, selected ones of the plurality of photoluminescent pixels.

15. The active matrix light emitting display of claim 14, wherein each of the organic light emitting diodes has a transmission axis and comprises:
a metallic mirror, wherein the distributed Bragg reflector (DBR) is disposed upon the metallic mirror and the light emitting layer comprises an emitter material configured to have an emission spectrum at least a portion of which overlaps a stop-band of the DBR.

16. The active matrix light emitting display of claim 15, wherein the light emitting layer is adjacent to the metallic mirror.

17. The active matrix light emitting display of claim 1, wherein one or more layers of the DBR have an optical thickness of about $(2n+1)\lambda_{emit}/4$, wherein n=0, 1, 2, or 3 and $\lambda_{emit}$ is the central wavelength of the stop band of the stop band of the DBR.

* * * * *